US006563150B1

(12) United States Patent
Schary

(10) Patent No.: US 6,563,150 B1
(45) Date of Patent: May 13, 2003

(54) HIGH FREQUENCY FIELD EFFECT TRANSISTOR

(76) Inventor: Alison Schary, 77 Bartlett Ave., #2, Arlington, MA (US) 02476

( * ) Notice: Subject to any disclaimer, the term of this patent is extended or adjusted under 35 U.S.C. 154(b) by 138 days.

(21) Appl. No.: 09/625,564

(22) Filed: Jul. 25, 2000

(51) Int. Cl.$^7$ .............................................. H01L 29/80
(52) U.S. Cl. ..................... 257/275; 257/77; 257/256; 257/259; 257/275; 257/280; 257/289
(58) Field of Search ................................. 257/256, 259, 257/275, 280, 289

(56) References Cited

U.S. PATENT DOCUMENTS

| | | |
|---|---|---|
| 3,737,743 A | 6/1973 | Goronkin et al. ............ 317/235 |
| 3,951,708 A | 4/1976 | Dean .............................. 156/3 |
| 4,065,782 A | 12/1977 | Gray et al. .................... 357/23 |
| 4,107,720 A | 8/1978 | Pucel et al. .................... 357/22 |
| 4,297,718 A | 10/1981 | Nishizawa et al. ........... 357/22 |
| 4,536,942 A | 8/1985 | Chao et al. .................... 29/571 |
| 4,549,197 A | 10/1985 | Brehm et al. .................. 357/41 |
| 4,587,541 A | 5/1986 | Dalman et al. ............... 357/22 |
| 4,621,239 A | 11/1986 | Tserng .......................... 331/99 |
| 4,675,712 A | 6/1987 | Oxley et al. ................... 357/22 |
| 4,733,195 A | 3/1988 | Tserng et al. ................ 330/286 |
| 4,853,649 A | 8/1989 | Seino et al. ................. 330/277 |
| 4,935,789 A | 6/1990 | Calviello ...................... 357/22 |
| 5,138,406 A | 8/1992 | Calviello ...................... 357/22 |
| 5,627,389 A | 5/1997 | Schary ........................ 257/275 |
| 5,861,644 A | 1/1999 | Schary ........................ 257/275 |
| 6,127,695 A | * 10/2000 | Harris et al. ................ 257/343 |

OTHER PUBLICATIONS

V. K. Tripathi, "Asymmetric Coupled Transmission Lines etc." Sep., 1975, pp. 734–739.
G. W. McIver, "A Traveling–Wave Transistor," Nov., 1965, pp. 1747–1748.
A. S. Podgorski et al., "Theory of Traveling–Wave Transistors," Dec., 1982, pp. 1845–1853.
A. J. Holden, et al., "Gallium Arsenide Traveling–Wave Field–Effect Transistors," Jan., 1985, pp. 61–66.
K. Rauschenbach et al., "Design and Fabrication of the Self–Aligned Opposed Gate–Source Transistor," Feb., 1992, pp. 219–225.
W. Heinrich et al., "Wave Propagation on MESFET Electrodes etc.," Jan. 1987, pp. 1–8.
W. Heinrich, "Distributed Equivalent–Circuit Model etc.", May 1987, pp. 487–491.
W. Heinrich et al., "Field–Theoretic analysis of wave etc", 1985, pp. 613–627.
S. El–Ghazaly et al., "Traveling–Wave Inverted–Gate, etc.", Jun. 1989, pp. 1027–1032.
S. E. Laux, "Techniques for Small–Signal Analysis, etc." Oct., 1985, pp. 2028–2037.
S. D'Agostino, et al., "Analytical Modeling and Design, etc." Feb. 1992, pp. 202–208.
R. E. Collin, "Foundations for Microwave Engineering", 1966, pp. 77–82, 157–158.
R. E. Collin, "Field Theory of Guided Waves", 1991, pp. 247–252.
E. S. Kuh et al., "Theory of Linear Active Networks", 1967, pp. 216–257.
S. Sze, "Physics of Semiconductor Devices", 1981, pp. 29, 334, 336–344.

(List continued on next page.)

Primary Examiner—David Nelms
Assistant Examiner—Mai-Huong Tran
(74) Attorney, Agent, or Firm—Cesari and McKenna, LLP; Edwin H. Paul, Esq.

(57) ABSTRACT

A traveling wave FET in which increasing distances between electrodes and the design of semiconductor regions associated with the various electrodes act to increase maximum gain parameters of the device. The relationship of the electrode series resistance is also considered in the design as it affects these gain parameters.

11 Claims, 43 Drawing Sheets

OTHER PUBLICATIONS

S. Ramo et al., "Fields and Waves in Communication Electronics", 1965, pp. 314–316.

R. S. Muller et al., "Device Electronics for Integrated Circuits", 1986, pp. 203, 205–206.

S. Yngvesson, "Microwave Semiconductor Devices", 1991, pp. 330–332.

T. Enoki et al., "Characteristics Including Electron Velocity etc.", Apr. 1990, pp. 935–941.

K. Yamasaki, et al., "Self–Align Implantation for, etc." Feb. 1982, pp. 119–121.

K. Kano, "Physical and Solid State Electronics", 1972, pp. 295–299.

B. G. Streetman, "Solid State Electronic Devices", 1980, pp. 285–293.

A. van der Ziel, "Solid State Physical Electronics", 1976, pp. 436–440, 446–454.

A. van der Ziel et al., "Small–Signal, High Frequency Theory, etc.", Apr. 1964, pp. 128–135.

P. Wolf, "Microwave Properties of Schottky–barrier, etc." Mar. 1970, pp. 125–141.

C. A. Liechti, "Microwave Field–Effect Transistors—1976", Jun. 1976, pp. 279–300.

A. Holden et al., "Computer Modelling of Travelling Wave Transistors," Jul. 1984, pp. 319–326.

A. Holden et al., "Distributed Effects at High Frequency in Active, etc." Apr. 1983, pp. 5/1–5/5.

A. Holden et al., "Travelling Wave Transistors: Modelling and Fabrication", Apr. 29, 1986, pp. 11/1–11/5.

K. Rauschenbach, "The Self–Aligned Opposed Gate–Source Transistor, etc.", 1988, pp. Abstract,vii–xi,xiv,xviii, 1–24,92,95–97,208–214.

A. Yarbrough, "Trench Waveguide: A Novel Three–Dimensional Transmission Line, etc.", 1988, pp. Abstract, vii, ix,1–12, 143–150.

A. Schary, "Part I: Deep Level Transient Spectroscopy Analysis of Spatially Dependent Doping Profiles Part II:Design and Analysis of Active Coupled Transmission Line Transistors.", 1993, pp. Abstract, vi–x, xii–xiii,xv–xvii, 57–67,74,79–80,111,114,115–136,146–158,159,191–195, 230–231,232–237, 280–284.

G. D'Inzeo et al., "Active Devices for Microwave Distributed Amplification", Feb. 1990, pp. 51–54.

S. Sebati et al., "Continuous Active T–Gate Travelling–Wave Transistor", Mar. 1989, pp. 403–404.

C. Desoer et al., "Basic Circuit Theory", 1969, pp. 322–324.

C. Lee et al., "Microwave Devices, Circuits and Their Interaction", 1994, pp. 11–18, 227–228, 285–293.

S. Haykin, "Active Network Theory", 1970, pp. 524–548.

H. Hasegawa et al., "Properties of Microstrip Line on Si–SiO2 System", Nov. 1971, pp. 869–881.

D. Jager et al., "Slow–Wave Propagation Along Variable Schottky–Contact Microstrip Line", Sep. 1976, pp. 566–573.

* cited by examiner

Table I

| TWFET Case No. | Gate Length ($\mu m$) | Channel Depth, $a$ ($\mu m$) | $S_{SG0}$ ($\mu m$) | $S_{SG1}$ ($\mu m$) | $S_{SG}$ ($\mu m$) | $S_{GD0}$ ($\mu m$) | $S_{GD1}$ ($\mu m$) | $S_{GD}$ ($\mu m$) |
|---|---|---|---|---|---|---|---|---|
| Case 1 | 10.0 | 0.60 | 1.0 | 2.3 | 3.3 | 1.0 | 1.2 | 2.2 |
| Case 2 | 10.0 | 0.65 | 1.0 | 4.0 | 5.0 | 1.0 | 2.3 | 3.3 |
| Case 3 | 3.0 | 0.65 | 1.0 | 4.0 | 5.0 | 1.0 | 2.3 | 3.3 |
| Case 4 | 3.0 | 0.65 | 1.0 | 4.0 | 5.0 | 1.0 | 2.3 | 3.3 |
| Case 5 | 3.0 | 0.65 | 1.0 | 4.0 | 5.0 | 1.0 | 2.3 | 3.3 |

FIG. 2A

Table II(a)

| TWFET Case No. | $N_d$ (cm$^{-3}$) | $\mu_n$ (cm$^2$/(V-sec)) | $\sigma$ (Seimens/cm) | $V_{Gate}$ (V) | $V_{Drain}$ (V) |
|---|---|---|---|---|---|
| Case 1 | 2.5x10$^{16}$ | 1000. | 4.0 | -2.549 | -1.79 |
| Case 2 | 2.5x10$^{16}$ | 1000. | 4.0 | -2.821 | -1.89 |
| Case 3 | 2.5x10$^{16}$ | 1000. | 4.0 | -2.821 | -1.89 |
| Case 4 | 2.5x10$^{16}$ | 500. | 2.0 | -3.54 | -2.0 |
| Case 5 | 2.5x10$^{16}$ | 750. | 3.0 | -5.6 | -3.4 |

Table II(b)

| TWFET Case No. | $X_{SG}$ ($\mu m$) | $X_{GD}$ ($\mu m$) | $Y_{depl.source}$ ($\mu m$) | $Y_{depl.drain}$ ($\mu m$) | $(S_{SG}-X_{SG})$ ($\mu m$) | $(S_{GD}-X_{GD})$ ($\mu m$) |
|---|---|---|---|---|---|---|
| Case 1 | 0.28 | 0.23 | 0.392 | 0.322 | 3.02 | 1.97 |
| Case 2 | 0.273 | 0.246 | 0.40 | 0.35 | 4.727 | 3.054 |
| Case 3 | 0.26 | 0.225 | 0.378 | 0.365 | 4.74 | 3.075 |
| Case 4 | 0.28 | 0.26 | 0.425 | 0.410 | 4.72 | 3.04 |
| Case 5 | 0.347 | 0.3 | 0.5075 | 0.475 | 4.653 | 3.0 |

FIG. 2B

| Table III(a) |||||
|---|---|---|---|---|
| TWFET Case No.s | Fig. No.s of Y Curves ||||
| | | $Y_{gs}$ | $Y_{dg}$ | $Y_{gd}$ | $Y_{ds}$ |
| | Frequency Range (GHz) | (1-120) | (1-120) | (1-120) | (1-120) |
| Case 1 vs. 2 | | 3 | 4 | 5 | 6 |
| Case 2 vs. 3 | | 17 | 18 | 19 | 20 |
| Case 4 vs. 5 | | 25 | 26 | 27 | 28 |

| Table III(b) |||||
|---|---|---|---|---|
| TWFET Case No.s | Fig. No.s of K Curves ||||
| | | $K_{gs}$ | $K_{dg}$ | $K_{gd}$ | $K_{ds}$ |
| | Frequency Range (GHz) | (5-120) | (1-120) | (5-120) | (1-120) |
| Case 1 vs. 2 | | 7 | 8 | 9 | 10 |
| Case 2 vs. 3 | | 21 | 22 | 23 | 24 |
| Case 4 vs. 5 | | 29 | 30 | 31 | 32 |

FIG. 2C

| Table IV | |  |  |
|---|---|---|---|
| TWFET Case No.s | Fig. No.s of 2-port Admittance Matrix Curves (Frequency = 100GHz) ($z_0$ range of $5.0 \times 10^{-4}$ cm to $5.0 \times 10^{-2}$ cm) | | |
|  | Series Resistance (k-ohm/cm) | Figure No. | |
|  |  | $Y_{11}, Y_{22}$ | $Y_{21}, Y_{12}$ |
| Case 1 | 2.0 | 11 | 12 |
| Case 1 | 4.0 | 13 | 14 |
| Case 2 | 4.0 | 15 | 16 |
| Case 4 | 4.0 | 33 | 34 |
| Case 5 | 4.0 | 35 | 36 |

FIG. 10A

Table V(a)

Y Matrix Element Values at 100 GHz

| TWFET Case No.s | $|Y_{gs}|$ (mhos) | $\angle Y_{gs}$ (°) | $|Y_{dg}|$ (mhos) | $\angle Y_{dg}$ (°) | $|Y_{gd}|$ (mhos) | $\angle Y_{gd}$ (°) | $|Y_{ds}|$ (mhos) | $\angle Y_{ds}$ (°) |
|---|---|---|---|---|---|---|---|---|
| Case 1 | 0.937 | 16.8 | 0.587 | -162.7 | 0.587 | -162.7 | 0.587 | 17.3 |
| Case 2 | 0.575 | 14.3 | 0.356 | -165.4 | 0.356 | -165.4 | 0.356 | 14.6 |
| Case 3 | 0.578 | 14.1 | 0.357 | -165.3 | 0.357 | -165.4 | 0.356 | 14.7 |
| Case 4 | 0.307 | 22.8 | 0.190 | -156.8 | 0.190 | -156.8 | 0.190 | 23.2 |
| Case 5 | 0.439 | 18.0 | 0.272 | -161.4 | 0.272 | -161.4 | 0.271 | 18.6 |

Table V(b)

K Matrix Element Values at 100 GHz

| TWFET Case No.s | $|K_{gs}|$ (norm'd units) | $\angle K_{gs}$ (°) | $|K_{dg}|$ (norm'd units) | $\angle K_{dg}$ (°) | $|K_{gd}|$ (norm'd units) | $\angle K_{gd}$ (°) | $|K_{ds}|$ (norm'd units) | $\angle K_{ds}$ (°) |
|---|---|---|---|---|---|---|---|---|
| Case 1 | 17.44 | -72.86 | 1.89 | -173.1 | 10.70 | 107.7 | 1.89 | 6.95 |
| Case 2 | 10.94 | -76.4 | 1.15 | -175.7 | 6.57 | 104.8 | 1.15 | 4.32 |
| Case 3 | 10.39 | -75.92 | 1.15 | -175.7 | 6.42 | 104.7 | 1.15 | 4.40 |
| Case 4 | 5.52 | -67.2 | 1.17 | -176.8 | 3.42 | 113.2 | 1.17 | 3.22 |
| Case 5 | 7.89 | -71.96 | 1.15 | -175.0 | 4.88 | 108.6 | 1.15 | 4.99 |

FIG. 32A

| Table VI | | | | |
|---|---|---|---|---|
| $f_S$ values for Lateral Spacing Regions | | | | |
| TWFET | Drain Lateral Spacing Region | | Source Lateral Spacing Region | |
| Case No.s | $f_S$ (GHz) | 100GHz/$f_S$ | $f_S$ (GHz) | 100GHz/$f_S$ |
| Case 1 | 64.7 | 1.56 | 50.96 | 1.96 |
| Case 2 | 44.27 | 2.26 | 31.74 | 3.15 |
| Case 3 | 40.22 | 2.49 | 30.15 | 3.32 |
| Case 4 | 23.5 | 4.25 | 16.3 | 6.14 |
| Case 5 | 41.22 | 2.43 | 30.74 | 3.25 |

FIG. 37A

HIGH FREQUENCY FIELD EFFECT TRANSISTOR

BACKGROUND OF THE INVENTION

1. Field of the Invention

This disclosure presents improvements of the traveling wave field effect transistor (TWFET) described in U.S. Pat. No. 5,627,389 and the U.S. continuation-in-part patent No. 5,861,644. These patents are hereby incorporated herein by reference. As the disclosure explains, the present invention allows the use of lower conductivity metals for the electrodes of the TWFET, and provides means of adjusting the high-frequency current-voltage characteristics of the TWFET for use in a TWFET amplifier or an oscillator circuit element.

2. Background Information

These new TWFET features, and the new TWFET design will be described after a brief review of the TWFET which was also presented previously in U.S. Pat. No. 5,627,389 and the continuation-in-part U.S. Pat. No. 5,861,644. This review will provide a basis for a description of the new TWFET design features and the new TWFET design.

The TWFET structure, as described in the U.S. patents referenced above, is a semiconductor structure based on a conventional metal-semiconductor field effect transistor (MESFET) with elongated gate, source, and drain electrodes. These electrodes are placed in parallel with each other—aligned with the length axis of the electrodes. Also, as in the case of the conventional MESFET, the electrodes are located on the surface of a semiconductor and are connected by an active channel region of the semiconductor.

While the TWFET has structural similarities to the conventional MESFET, an important difference between these two types of transistors is the direction of signal propagation. The TWFET signal propagation direction is along the length-axis of the elongated gate, source and drain electrodes. This is perpendicular to the signal propagation direction of a conventional MESFET. The TWFET signal propagation direction helps to relate the TWFET structure to the conventional MESFET structure. Specifically, in a TWFET, a plane transverse to the direction of signal propagation defines a cross-section of this TWFET structure, and in this plane, the electrode placement and active channel region of the TWFET structure corresponds to that of a conventional MESFET. As described in U.S. Pat. Nos. 5,627,389 and 5,861,644, the MESFET activity and interelectrode coupling of the TWFET, combine with the coupling length and electrode series resistance values to determine the high frequency current-voltage characteristics of the TWFET transistor. This same TWFET analysis provides the basis for discussion of the present invention, and is briefly reviewed as follows:

The analysis of the TWFET operation is based on its correspondence to a coupled transmission line structure. In the TWFET, the elongated gate, source, and drain electrodes act as two pairs of coupled transmission lines, in which the length of these electrodes provides a coupling length for the structure. The coupling of these electrode-transmission lines takes place with the high frequency AC activity of the cross-section FET of the TWFET structure. This activity is included in the analysis via the coupling matrices of the transmission line differential equations for the TWFET structure:

$$\frac{d}{dz}i = -Yz$$

$$\frac{d}{dz}v = -Zi$$

Here i and v are two-element current and voltage vectors of the two coupled transmission lines in the TWFET—the gate-source pair of electrodes and the drain-source pair of electrodes. The admittance coupling matrix, Y, describes the AC current flow in the plane transverse to the direction of signal propagation. It is identical to the admittance matrix which describes the AC current-voltage relationship of the conventional FET which forms the cross-section of the TWFET. The impedance coupling matrix, Z, is defined as the sum of the diagonal series resistance matrix, R and the product of jω with L, the inductive coupling matrix. As described in U.S. Pat. Nos. 5,627,389 and 5,861,644, the diagonal series resistance contains the series resistance of the gate-source and drain-source electrode pairs that form the two transmission lines of the coupled structure. Also, as discussed in these earlier patents, a TEM mode approximation of the propagating signal is used in this analysis. This approximation relates the inductive coupling matrix, L, to the AC charge matrix, K. This AC charge matrix is obtained from calculations of the AC charge which appears on the gate and drain electrodes with applied AC bias conditions.

In addition to the calculation of the coupling matrices, another component of the analysis is that it is applied to the case of a dual-gate TWFET, such as the TWFET example of FIG. 3 of U.S. Pat. No. 5,627,389. In this structure, the incoming signal is divided into the input side of two identical TWFETs which share a common drain electrode. This structure is analyzed by doubling the effective contact area for all of the electrodes. This has the result of doubling the matrix element values of the admittance coupling matrix Y and of the charge coupling matrix K. In addition, the doubled contact area reduces the series resistance value by a factor of two, as described in the patents reference above.

This analysis of the TWFET structure continues, as described in the U.S. Pat. Nos. 5,627,389 and 5,861,644, by use of an extension of Tripathi's method to obtain an impedance or admittance matrix for the coupled transmission line structure. (V. K. Tripathi, "Asymmetric Coupled Transmission Lines in an Inhomogeneous Medium," *IEEE Trans. Microwave Theory Tech.* vol. MTT-23(9), pp. 734–739 (September, 1975)) In the case of the TWFETs presented here, a 2-port impedance matrix is obtained for the coupled TWFET structure, due to the presence of two open circuit terminations which are located at opposite ends of the different coupled transmission lines of the dual gate TWFET. As noted in the patents referenced earlier, these two open circuit terminations allow a 2-port impedance matrix to be obtained from the TWFET coupled transmission line equations as a function of the coupling length, $z_0$. This 2-port impedance matrix can be converted to a 2-port admittance matrix. Also, the 2-port quantities U (Mason's U-function), MAG (Maximum Available Gain), MSG (Maximum Stable Gain), and k, the 2-port stability parameter can be calculated. Because the 2-port admittance matrix is calculated for a fixed frequency as a function of coupling length, these 2-port gain and stability parameters are also calculated at that frequency as a function of coupling length.

SUMMARY OF THE INVENTION

A traveling wave field-effect transistor operated at frequencies in the microwave range or above the microwave range, and having traveling wave signals propagating in a direction therethrough generally from and to electrodes attached thereto, comprising: semiconductor structure defining a traveling wave signal propagation direction and a transverse direction configured at right angles to said traveling wave signal propagation direction, said structure in cross section taken in said transverse direction perpendicular to said traveling wave signal propagation direction, said cross section corresponding to a cross section field-effect transistor,

- a coupling length of said structure in said traveling wave signal propagation direction having electrodes configured for attaching transmission lines for an input signal and for an output signal, said input and output attachments at opposite ends of said coupling length,
- at least one gate electrode extending along said coupling length in the traveling wave signal propagation direction,
- at least one source electrode extending along said coupling length in the traveling wave signal propagation direction,
- at least one drain electrode extending along said coupling length in the traveling wave signal propagation direction, wherein a traveling wave field-effect transistor is formed,
- input transmission line attached to the electrodes at one end of said coupling length for an input signal, output transmission line attached to the electrodes at said opposite end of said coupling length for an output signal, a depletion region generally beneath said at least one gate electrode, said depletion region, when viewed in a cross section of said semiconductor structure taken in said transverse direction, having an edge,
- means for positioning said edge between said at least one gate electrode and said at least one drain electrode region, and
- means for separating the depletion region edge from the at least one drain electrode region,
- said gate source and drain source electrode pairs having an electrode series resistance, and
- in a plane transverse to said direction of signal propagation, there is the addition of cross section field effect transistor channel material, extending between the gate electrode and source electrode to increase the distance between the gate and source electrode which creates a gate-source lateral spacing region, or,

- there is the addition of cross section field effect transistor channel material, extending between the gate electrode and drain electrode to increase the distance between the gate and drain electrode which creates a gate-drain lateral spacing region, or,

- there are additions of cross section field effect transistor channel material, which create both said gate-source and gate-drain lateral spacing regions, in which, said gate-source lateral spacing region extends between the gate and source electrode including an end portion of the depletion region edge which lies between the gate electrode and the source electrode and a neutral region which extends from this end portion of the depletion edge to the source electrode;

such that the length of said neutral region is defined as extending from the depletion region edge to the surface of the source electrode in the direction of the shortest distance between the gate electrode and the source electrode, and the lateral depletion region depth is defined as extending from the surface of the gate electrode to the depletion region edge in the direction of the shortest distance between the gate electrode and the source electrode, and, in which said gate-drain lateral spacing region extends between the gate and drain electrode including the end portion of the depletion region edge which lies between the gate electrode and the drain electrode, and a neutral region which extends from this end portion of the depletion edge to the drain electrode;

such that the length of said neutral region is defined as extending from the depletion region edge to the surface of the source electrode in the direction of the shortest distance between the gate electrode and the source electrode, and the lateral depletion region depth is defined as extending from the surface of the gate electrode to the depletion region edge in the direction of the shortest distance between the gate electrode and the source electrode, and, in which said gate-drain lateral spacing region extends between the gate and drain electrode including the end portion of the depletion region edge which lies between the gate electrode and the drain electrode, and a neutral region which extends from this end portion of the depletion region edge to the drain electrode;

such that at some frequency, at some coupling length of the traveling wave field-effect transistor, at some value of the electrode series resistance, the value of maximum stable gain is increased, by the addition of said cross section field effect transistor channel material.

A method of improving the performance of a traveling wave field-effect transistor comprising the steps of: forming a semiconductor structure defining a traveling wave signal propagation direction and a transverse direction configured at right angles to said traveling wave signal propagation direction, said structure in cross section taken in said transverse direction perpendicular to said traveling wave signal propagation direction corresponding to a cross section field-effect transistor,

- defining a coupling length of said structure in said traveling wave signal propagation direction having electrodes configured for attaching transmission lines for an input signal and for an output signal, said input and output attachments at opposite ends of said coupling length,
- forming at least one gate electrode extending along said coupling length in the traveling wave signal propagation direction,
- forming at least one source electrode extending along said coupling length in the traveling wave signal propagation direction,
- forming at least one drain electrode extending along said coupling length in the traveling wave signal propagation direction, wherein a traveling wave field-effect transistor is formed,
- attaching transmission line to the electrodes at one end of said coupling length for an input signal, attaching transmission line to the electrodes at said opposite end of said coupling length for an output signal,
- depleting a region generally beneath said at least one gate electrode, said depletion region, when viewed in a cross section of said semiconductor structure taken in said transverse direction, having an edge, positioning said edge between said at least one gate electrode and said at least one drain electrode region, and separating the depletion region edge from the at least one drain electrode region with said gate source and drain source electrode pairs having an electrode series resistance, and in a plane transverse to said direction of signal propagation, adding cross section field effect transistor channel material, which extends between the gate electrode and source electrode to increase the distance between the gate and source electrode which creates a gate-source lateral spacing region, or, adding cross section field effect transistor channel material, which extends between the gate electrode and drain electrode to increase the distance between the gate and drain electrode which creates a gate-drain lateral spacing region, or, adding cross section field effect transistor channel material, to create both said gate-source and gate-drain lateral spacing regions, in which, said gate-source lateral spacing region extends between the gate and source electrode including the end portion of the depletion region edge which lies between the gate electrode and the source electrode and a neutral region which extends from this end portion of the depletion edge to the source electrode; defining a length of said neutral region as extending from the depletion region edge to the surface of the source electrode in the direction of the shortest distance between the gate electrode and the source electrode, and defining a lateral depletion region depth as extending from the surface of the gate electrode to the depletion region edge in the direction of the shortest distance between the gate electrode and the source electrode, and, in which said gate-drain lateral spacing region extends between the gate and drain electrode including the end portion of the depletion region edge which lies between the gate electrode and the drain electrode, and a neutral region which extends from this end portion of the depletion edge to the drain electrode;

and defining the length of said neutral region as extending from the depletion region edge to the surface of the drain electrode in the direction of the shortest distance between the gate electrode and the drain electrode, and defining the lateral depletion region depth as extending from the surface of the gate electrode to the depletion region edge in the direction of the shortest distance between the gate electrode and the drain electrode, such that at some frequency, at some coupling length of the traveling wave field-effect transistor, at some value of the electrode series resistance, the value of maximum stable gain is increased, by the addition of said cross section field effect transistor channel material.

BRIEF DESCRIPTION OF THE DRAWINGS

The invention description below refers to the accompanying drawings, of which:

FIG. 2A is a table;
FIG. 2B consists of two tables;
FIG. 2C consists of two tables;
FIG. 10A is a table.

FIG. 32A consists of two tables;

FIG. 37 A is a table.

DETAILED DESCRIPTION OF AN ILLUSTRATIVE EMBODIMENT

The preceding review of the basic TWFET structure provides a framework for the description of the new feature of the TWFET structure which will be referred to as a lateral-spacing-region. As will be explained in the next section of this technical disclosure, this feature of the TWFET can be designed to reduce the conductivity requirements for the metals to be used for the source, gate and drain electrodes of the TWFET. In addition, the lateral spacing region can also be used to adjust the TWFET 2-port admittance matrix parameters for use in a TWFET amplifier. This adjustment can also be used in the design of a TWFET structure as an oscillator circuit element by providing a 1-port structure with a negative input impedance. This lateral-spacing-region feature will be presented next with several examples which will focus on different aspects of its design.

Following the discussion of the design and function of the lateral-spacing-region, this disclosure will then present a new TWFET design variation. This new TWFET design combines lateral spacing regions with increased surface areas for the inter-electrode-faces of the gate, source and drain electrodes. This TWFET structure also allows the use of lower conductivity metals for gate, source and drain electrodes, by means of increasing the surface area of the high frequency current distribution on the gate, drain and source electrodes of the TWFET in combination with the benefits of the use of the lateral-spacing-regions in its design.

The Lateral Spacing Region

Figure 1:
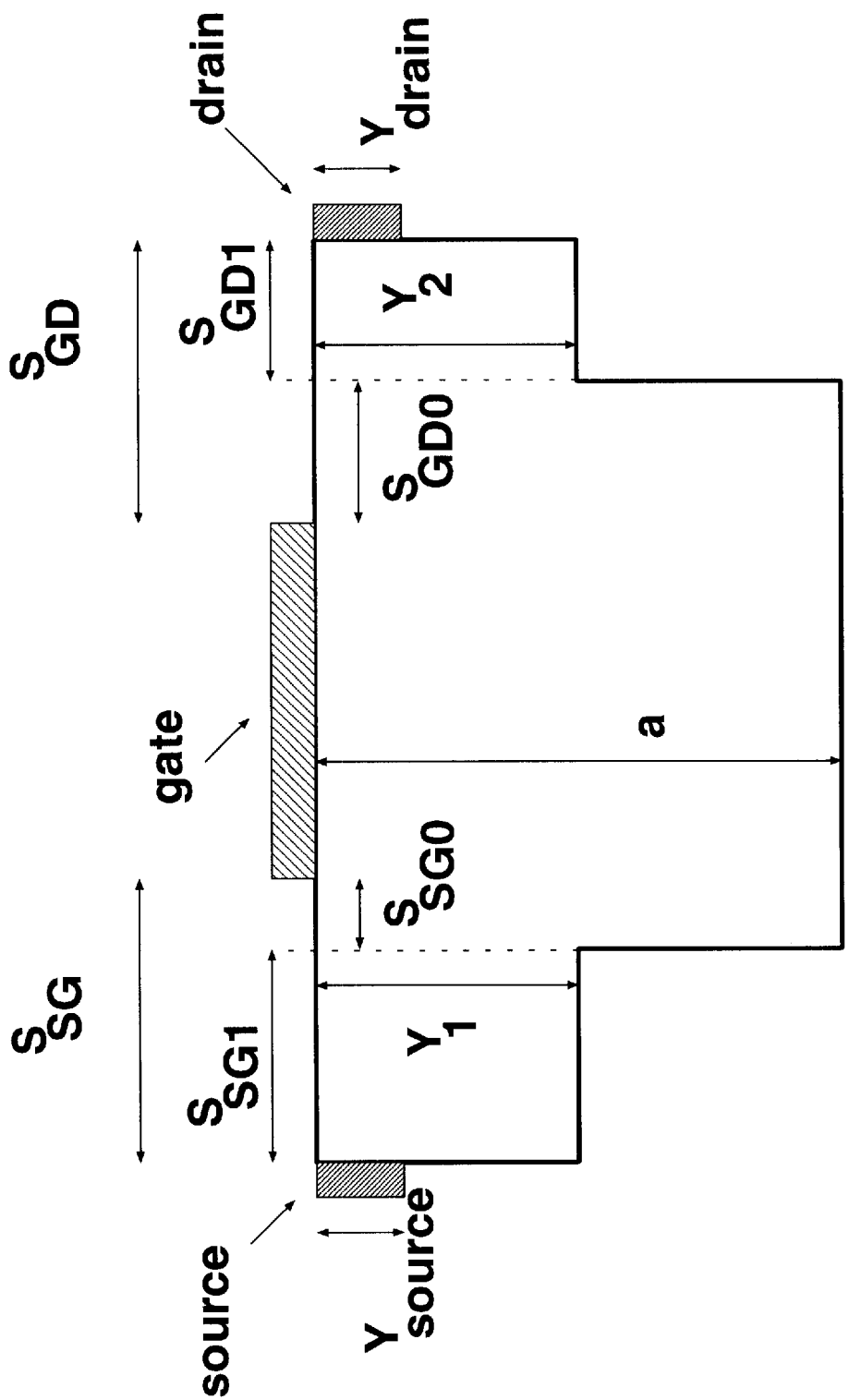
FIG. 1 is a cross-section of the TWFET.
Figure 2:
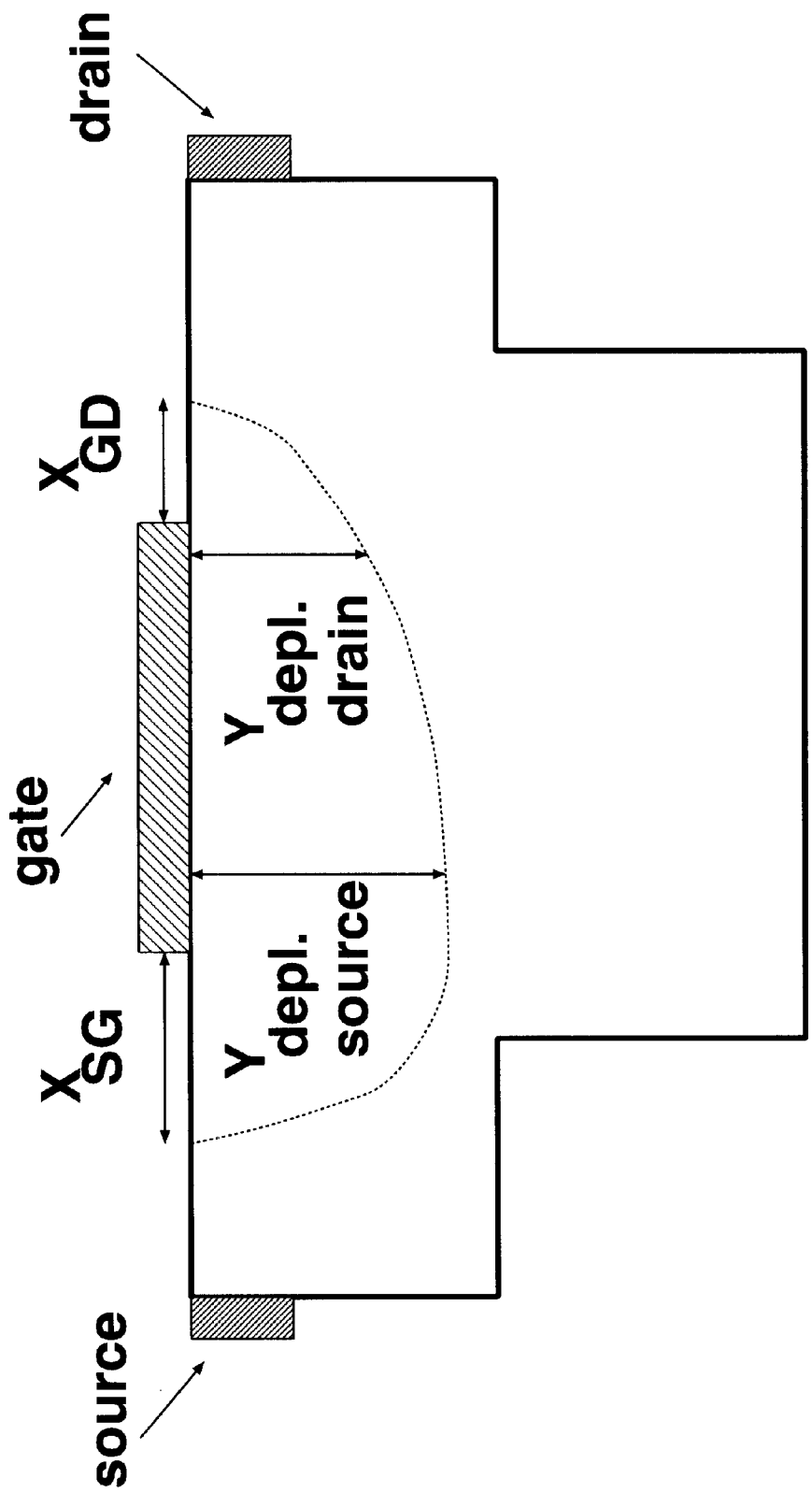
FIG. 2 is a cross-section of the TWFET.
Figure 3:
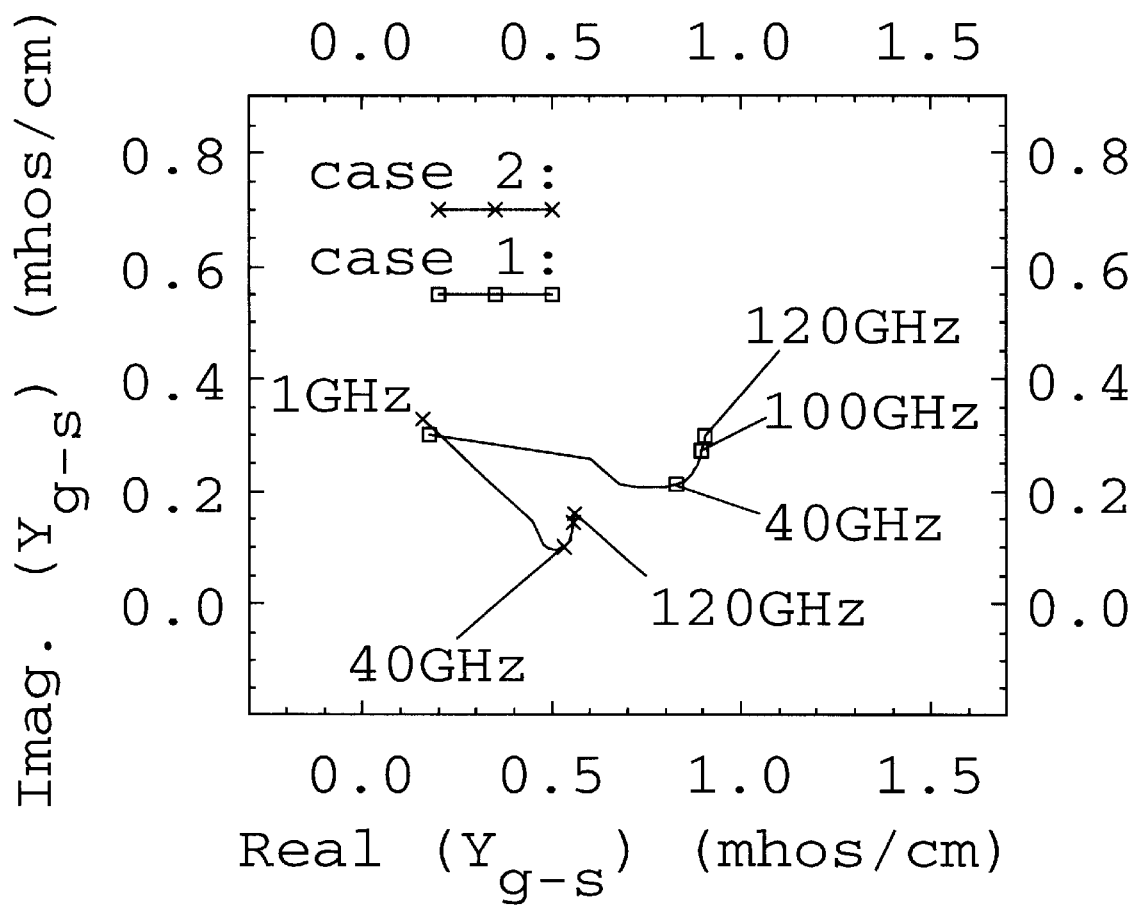
FIG. 3 is a graph that shows complex admittance matrix curves.
Figure 4:
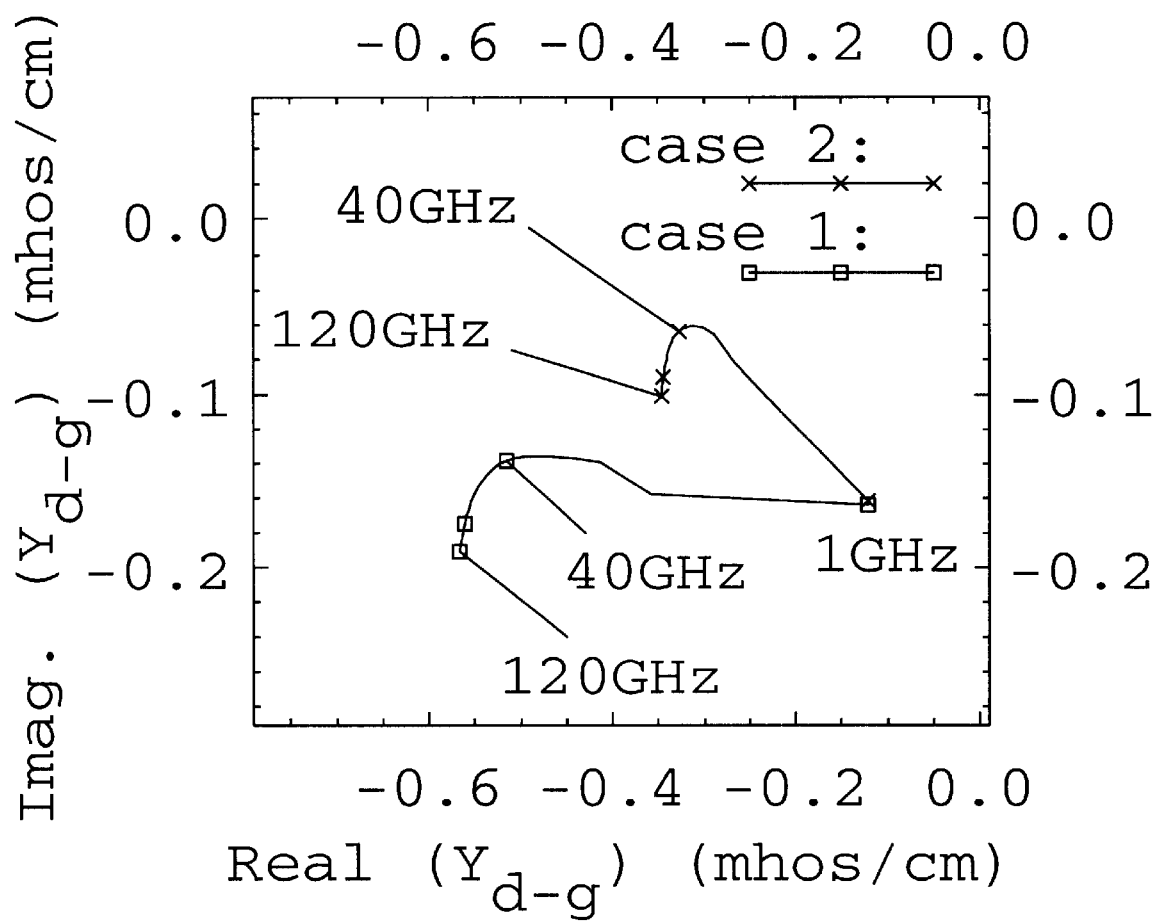
FIG. 4 is a graph that shows complex admittance matrix curves.
Figure 5:
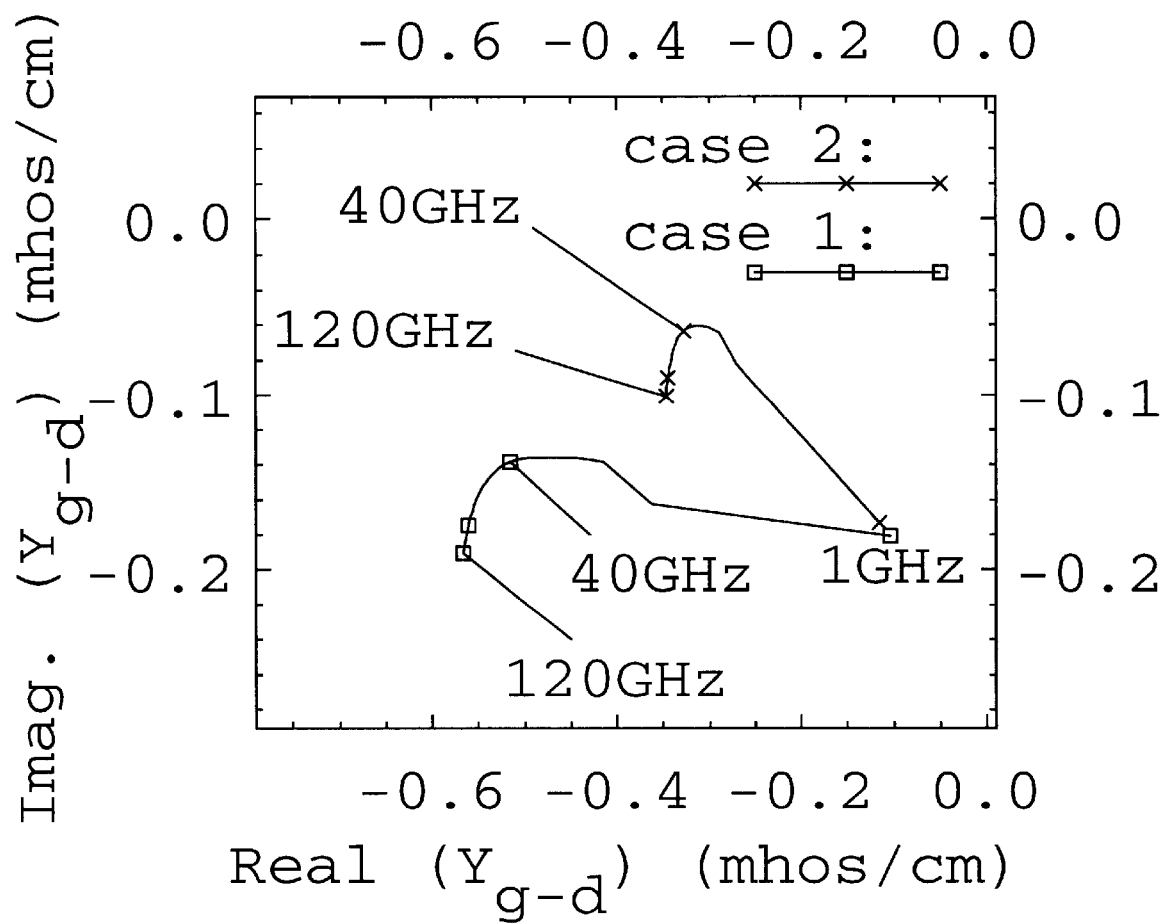
FIG. 5 is a graph that shows complex admittance matrix curves.
Figure 6:
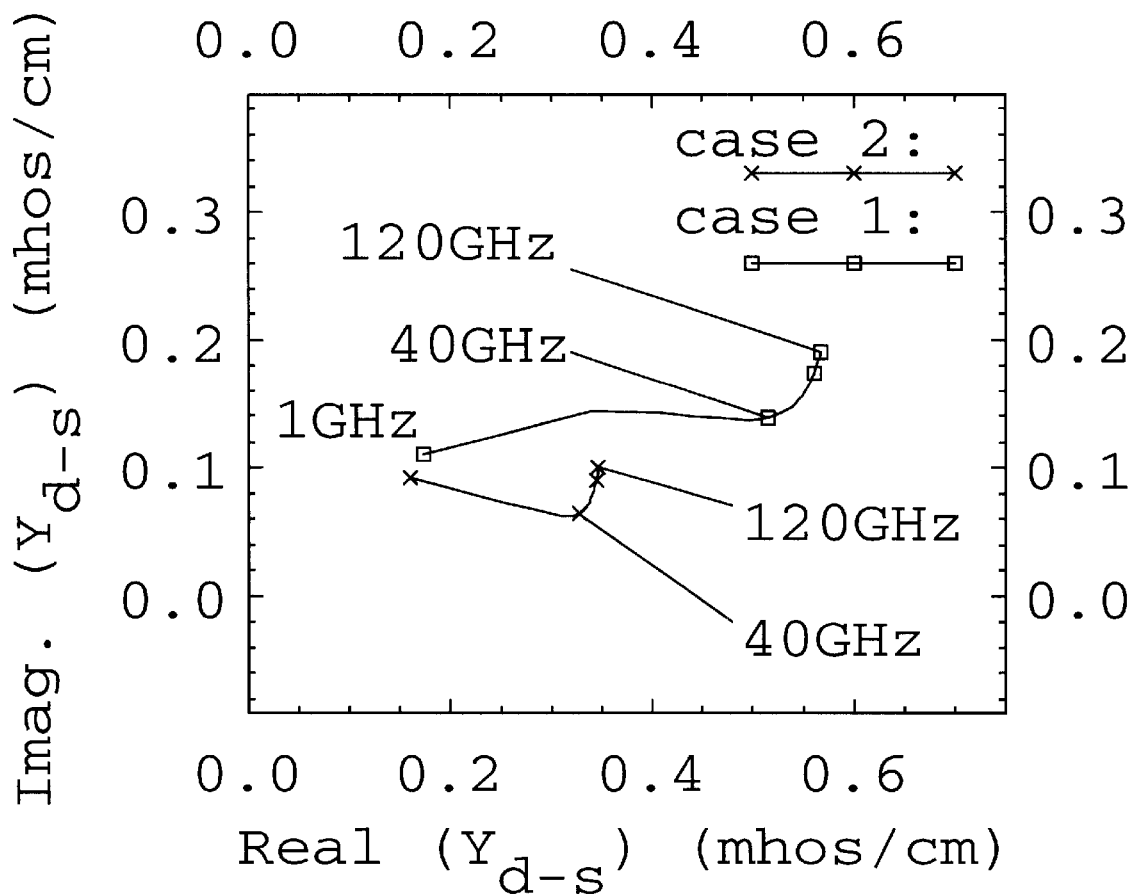
FIG. 6 is a graph that shows complex admittance matrix curves.
Figure 7:
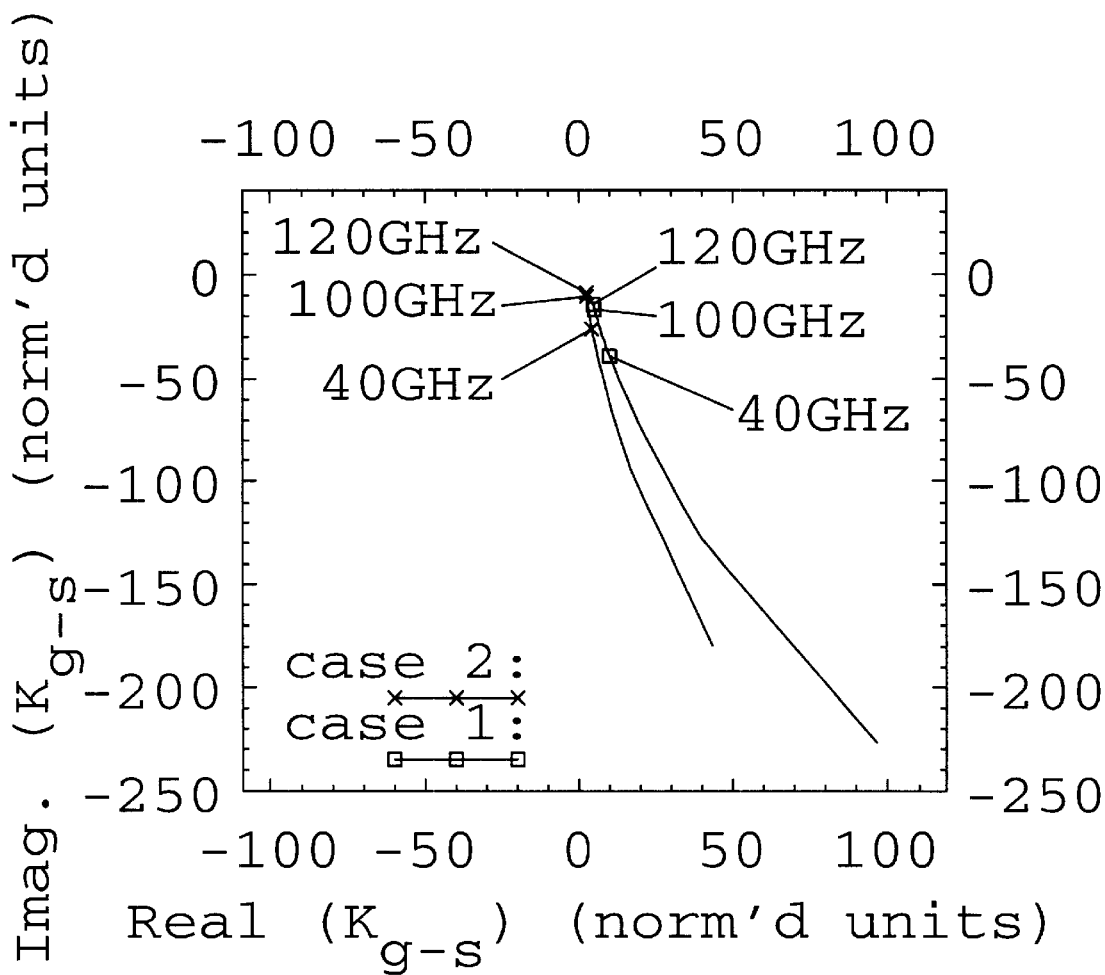
FIG. 7 is a graph that shows normalized charge matrix curves.
Figure 8:
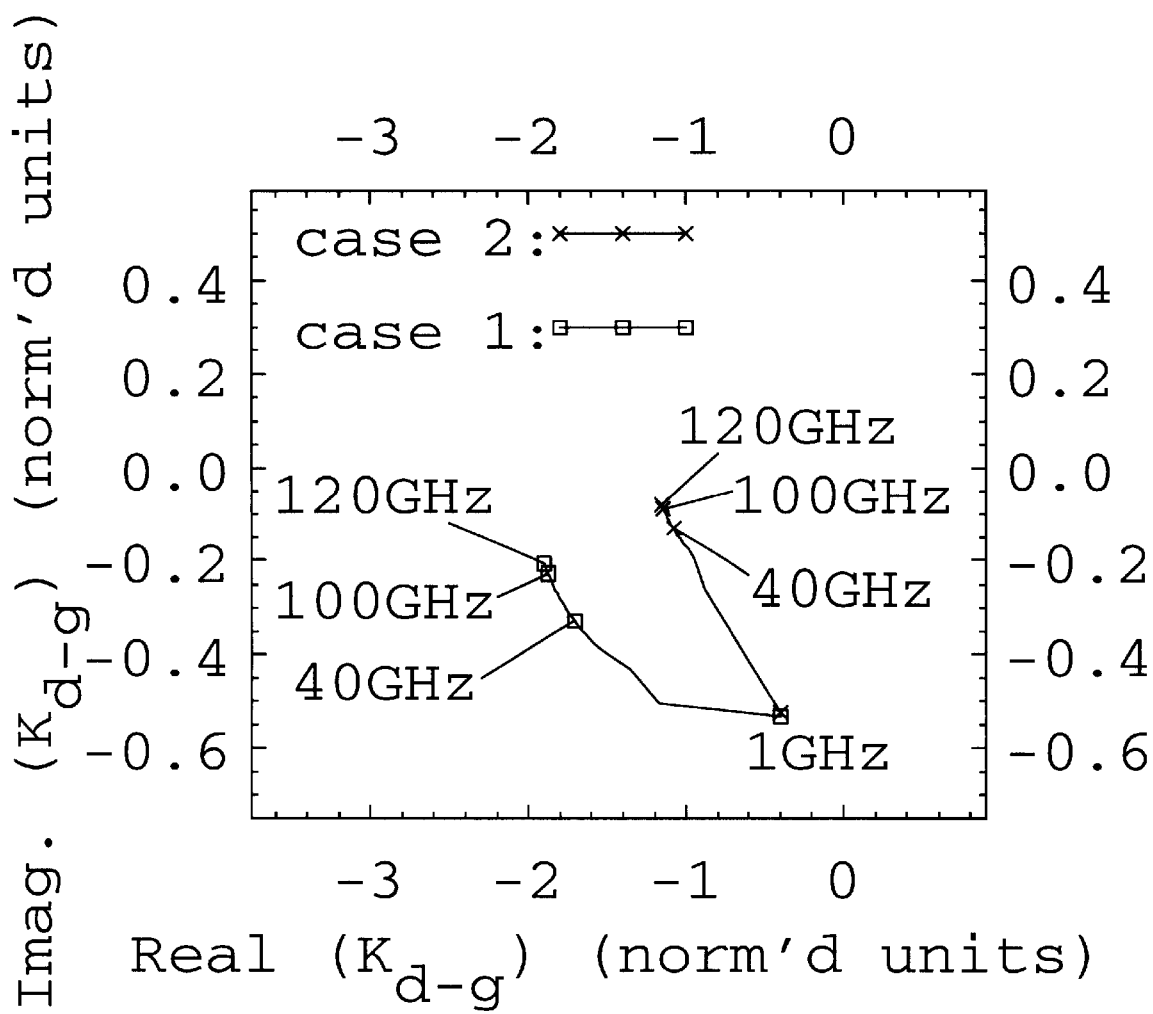
FIG. 8 is a graph that shows normalized charge matrix curves.
Figure 9:
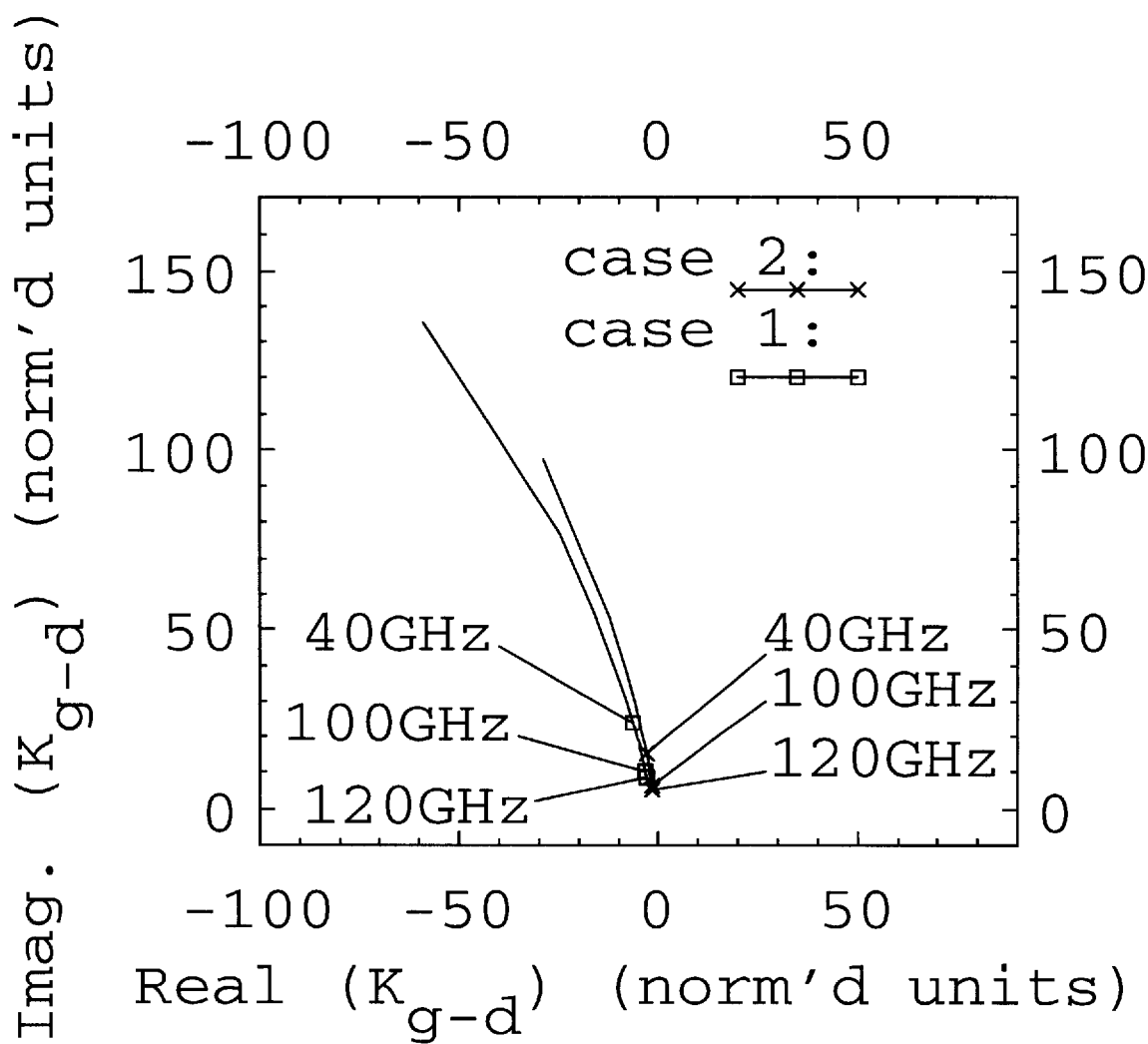
FIG. 9 is a graph that shows normalized charge matrix curves.
Figure 10:
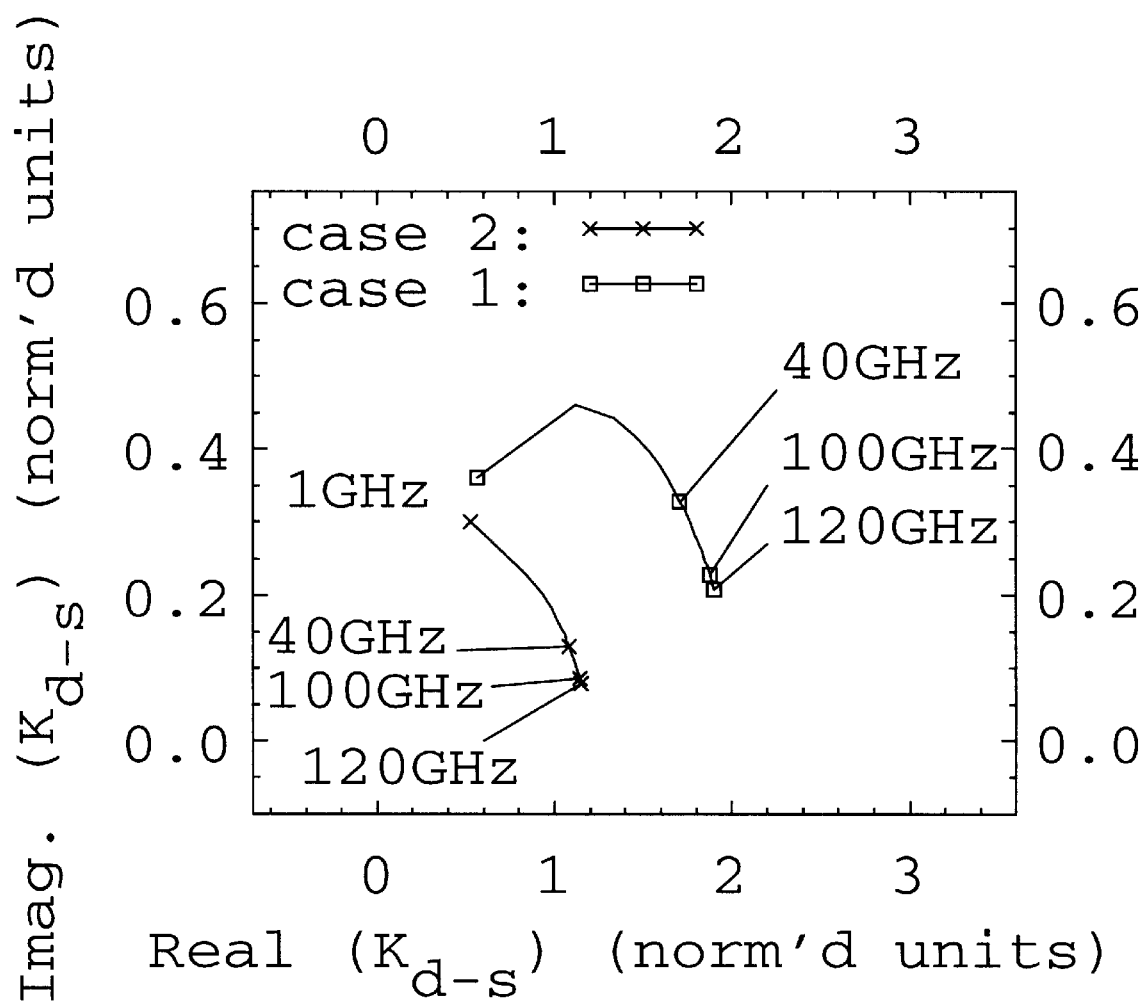
FIG. 10 is a graph that shows normalized charge matrix curves.

This technical disclosure presents an additional TWFET design feature which will be referred to as a lateral-spacing-region. The lateral-spacing-region feature is described in terms of the cross-section FET of the TWFET, as shown in FIGS. 1 and 2. As FIG. 1 indicates, the lateral-spacing-region is created by adding a section of active channel material between the gate and drain electrodes, and between the gate and source electrodes. In FIG. 1, the section added between the gate and drain electrodes has a length $S_{GD1}$, while the section added between the gate and source electrodes has a length $S_{SG1}$. These additions to the basic TWFET structure which was presented in FIG. 4 of U.S. Pat. No. 5,627,389, increase the gate-to-drain inter-electrode separation distance parameter, $S_{GD}$, by the value of $S_{GD1}$. Similarly, the section added between the gate and source electrodes increases the gate-to-source inter-electrode separation distance parameter, $S_{SG}$, by the value of $S_{SG1}$. In FIG. 1, the parameters $S_{SG0}$ and $S_{GD0}$, represent the distances between the drain or source edge of the gate electrode and the added sections described above, which form part of the lateral-spacing-region. Thus, as shown in FIG. 1, the distance $S_{SG}$ is the sum of $S_{SG1}$, and $S_{SG0}$. Similarly, the distance $S_{GD}$ is the sum of $S_{GD1}$ and $S_{GD0}$.

The lateral-spacing-region includes these added sections in addition to the portions of both the neutral region and depletion region which extend from these added sections to the gate electrode. That is, each lateral spacing region includes the end portion of the depletion region which extends around each side of the gate electrode. For example, the gate-drain lateral spacing region, includes the depletion region which extends from the drain end-portion of the gate towards the drain electrode and the neutral region which extends from this portion of the depletion region edge to the surface of the drain electrode. Similarly, the source-gate lateral spacing region, includes the depletion region which extends from the source end-portion of the gate towards the source electrode and the neutral region which extends from this portion of the depletion region edge to the surface of the source electrode.

As the preceding description suggests, the design of the lateral-spacing-region includes the selection of two geometrical parameters: the lateral-depletion-depth and the neutral-region-length. These parameters can be related to the parameters shown in FIGS. 1 and 2. For the case of the drain-gate lateral spacing region, the lateral-depletion-depth is given by $X_{GD}$, and the neutral-region-length is given by $S_{GD}$—$X_{GD}$. Similarly, for the case of the source-gate lateral spacing region, the lateral-depletion-depth is given by $X_{SG}$, and the neutral-region-length is given by $S_{SG}$—$X_{SG}$.

In addition to these two parameters for each lateral-spacing-region, the parameters $Y_{drain}$ and $Y_2$ determine the depth of the drain ohmic contact and the depth of the channel material for the drain-gate lateral spacing region. Similarly, the parameters $Y_{source}$ and $Y_1$ determine the depth of the source ohmic contact and the depth of the channel material for the source-gate lateral spacing region. Also in FIG. 1, the parameter, a, defines a channel depth as also defined in FIG. 4 of U.S. Pat. No. 5,627,389.

Tables I, II(a), and II(b) summarize the TWFET designs presented in this technical disclosure in terms of the geometrical parameters of FIG. 1 and 2, in addition to the values for doping density, $N_d$, mobility, $\mu_n$, and conductivity, $\delta$, and values for the applied DC bias for the Gate and Drain contacts, which are given by $V_{Gate}$ and $V_{Drain}$, respectively. The values for the remaining geometry parameters of FIG. 1 not included with the geometry data provided by Table I, are the values for $Y_1$ and $Y_2$ which are both 0.12 microns, and the values for $Y_{source}$, and $Y_{drain}$ which are both 0.03 microns for all of the TWFET cases of Table I. In addition, all of the TWFET examples presented in this technical disclosure all use an n-type semiconductor, and so the doping density $N_d$ of Table II(a) refers to a net donor concentration. A Schottky barrier height of 0.792 eV was used for the calculations. As explained in U.S. Pat. No. 5,627,389, in these calculations, this value is used as a value of the built-in potential for the schottky contact to the n-type semiconductor, not a true barrier height value. Note that, as indicated in Table II(a), the TWFET examples presented in this technical disclosure all have uniform conductivity for the semiconductor material. However, if desired, it is possible that conductivity may vary within the FET cross-section of the TWFET. For example, the lateral-spacing regions may have a different conductivity than the rest of the FET cross-section, or the sections is of added material which form part of the lateral-spacing-region may have a different conductivity than the rest of the FET cross-section.

Table II(b) provides values for the depletion depth locations for the TWFET examples of this technical disclosure. As noted in U.S. Pat. No. 5,627,389, when the DC bias values of Table II(a) are established for the TWFET structure, a depletion region is created underneath the gate electrode. In this depletion region, the electron concentration is nearly zero, while outside this depletion region, the electron concentration increases to a maximum value which is approximately equal to the background net-donor concentration. For the purposes of this technical disclosure, the depletion region edge is defined as the DC electron concentration contour for a concentration of half the background net-donor concentration. For the examples presented in this technical disclosure, the depletion region edge contour has a value of $1.25 \times 10^{16}$ cm$^{-3}$.

The schematic diagram of FIG. 2 provides definitions for the depletion depth parameters of Table II(b). $X_{SG}$ and $X_{GD}$ are the depletion depths of the lateral-spacing-regions as described above. $Y_{depl.source}$ is the vertical distance from the top-surface of the semiconductor at the gate electrode to the depletion region edge, as measured at a distance of 0.5 microns towards the gate-electrode-center from the source-end of the gate. Similarly, $Y_{depl.drain}$ is the vertical distance from the top-surface of the semiconductor at the gate electrode to the depletion region edge, as measured at a distance of 0.5 microns towards the gate-electrode-center from the drain-end of the gate.

As indicated by the values in Tables I, II(a), and II(b), the TWFETs presented in this technical disclosure, include gate lengths of 10.0 microns to 3.0 microns, and conductivities which range from 4.0 Siemens/cm to 2.0 Siemens/cm. This technical disclosure will present these TWFET examples to illustrate role of these parameters in addition to the role of the depletion depth location parameters, and the geometry elements of the design of the lateral spacing region in the TWFET design.

Examples of a TWFET Amplifier and Oscillator Circuit Element

As suggested by the preceding description of the TWFET analysis, the design of is the cross-section FET of a TWFET structure is specified by the values presented in Tables I, II(a), and 11(b). These values are used to calculate the coupling matrices of the transmission line differential equations which, in turn, are used to obtain the 2-port admittance matrix for the TWFET coupled transmission line structure. This section of the technical disclosure will present the use of the cross-section FET designs of Table I, II(a), and II(b) to obtain the corresponding 2-port admittance matrix values, and the use of this 2-port admittance matrix in the design of a TWFET amplifier and oscillator circuit element.

The coupling matrices of the transmission differential equation described above, are calculated with a 2-D finite element simulation of the FET cross-section of the TWFET. This method was presented in U.S. Pat. No. 5,627,389 and the continuation-in-part U.S. Pat. No. 5,861,644, and uses a small-signal-AC semiconductor analysis in combination with DC calculations of the semiconductor equations of the FET cross-section. The simulations incorporate the material and geometry parameters and DC bias values provided in Tables I, II(a), and II(b), with an AC excitation voltage superimposed on these DC bias values. In the case of the TWFETs of this technical disclosure, the AC excitation voltage is a net-AC-excitation of 0.5 V, which is obtained with a 1.0 V AC voltage applied to the gate or drain contact relative to an AC-ground-voltage of 0.5 V.

This small-signal AC analysis was used to calculate Y and K matrix elements for the cross-section FET of the dual-gate TWFET examples of this technical disclosure. Table III(a) and III(b) list figures which present the curves of these complex-valued Y and K matrix elements as they vary with frequency. The K matrix element curves plot the values as normalized to the dielectric constant of free space, and so are dimensionless quantities. The curves are labeled with the same subscript-notation for the coupling matrices that was used in the "forward" configuration TWFET examples of U.S. Pat. No. 5,627,389 and the continuation-in-part U.S. Pat. No. 5,861,644. Specifically, the gate-source (g-s) matrix element refers to the element of the first-row and first column of the 2×2 coupling matrix Y or K. Similarly, the drain-source (d-s) matrix element refers to the element of the second-row and second column, the drain-gate (d-g) matrix element refers to the element of the second-row and first column, the gate-drain (g-d) matrix element refers to the element of the first-row and second column.

As indicated in Table III(a) and III(b), the Y and K matrix elements for TWFET cases 1 and 2 are shown in FIGS. 3 through 10. These figures present these matrix element values from 1 GHz through 120 GHz, with the exception that the curves for the $K_{gs}$ and $K_{gd}$ matrix elements show these values for the frequencies of 5 GHz through 120 GHz. The frequency points of 1 GHz, 40 GHz, 100 GHz, and 120 GHz are identified on each curve, using "box" markers for TWFET case 1, and "x" markers for TWFET case 2. (The exception to this is that the 1 GHz marker is not shown on the curves for curves for $K_{gs}$ and $K_{gd}$ in FIGS. 7 and 9.)

As described earlier in this technical disclosure, these coupling matrices are used in a calculation of a 2-port admittance matrix for the TWFET coupled transmission line structure with the coupling length, $z_0$, used as a parameter. This calculation sets a fixed value of signal frequency, and assumes a specific value for the series resistance of the transmission line electrodes. Table IV lists the figure numbers and TWFET case numbers for the curves of the 2-port admittance matrices of the TWFETs of this technical disclosure. As noted in this table, all of these admittance matrix curves have been calculated with a fixed frequency of 100 GHz, and a range of values for $z_0$ of $5 \times 10^{-4}$ cm to $5 \times 10^{-2}$ cm.

Figure 11:
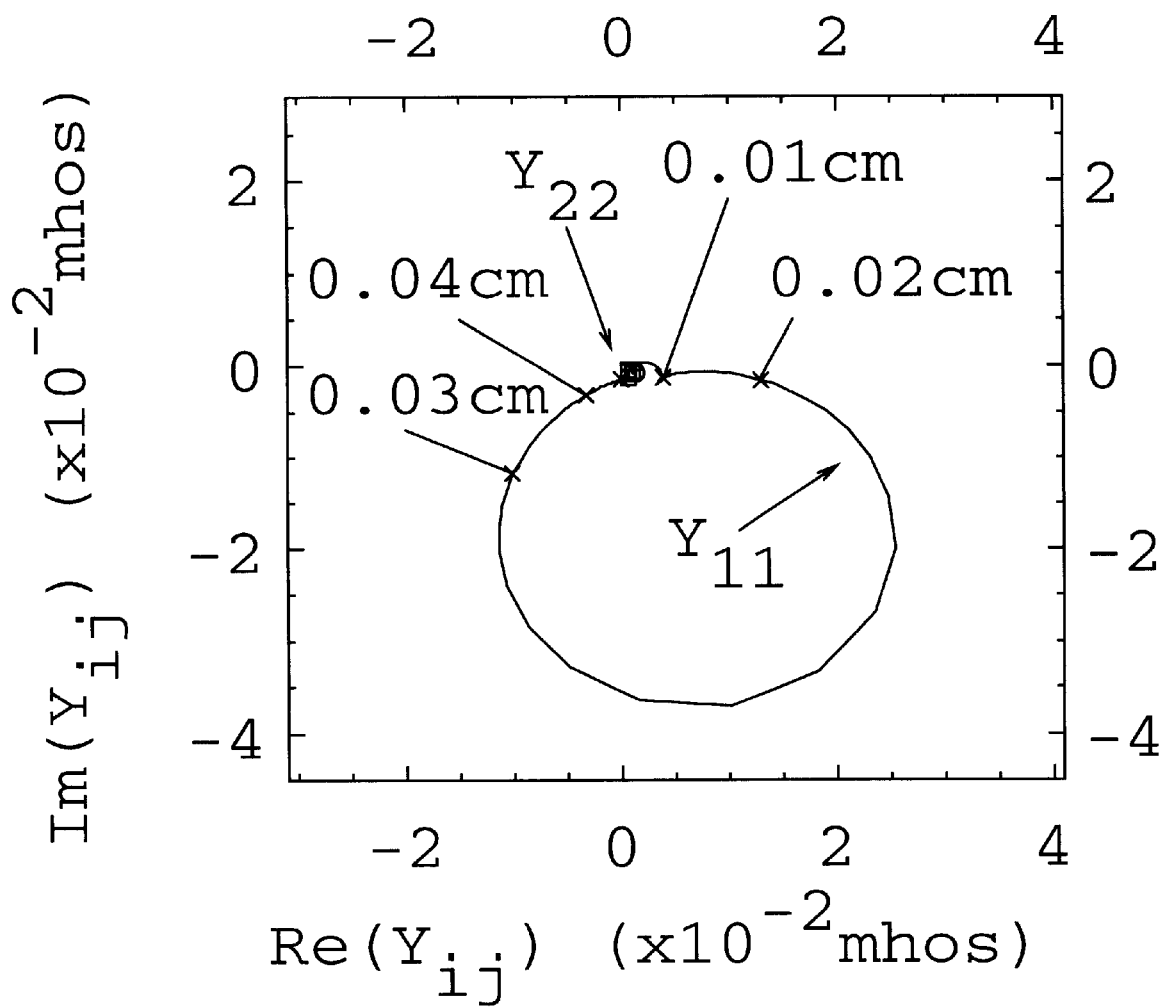
FIG. 11 is a graph that shows two complex admittance curves.
Figure 12:
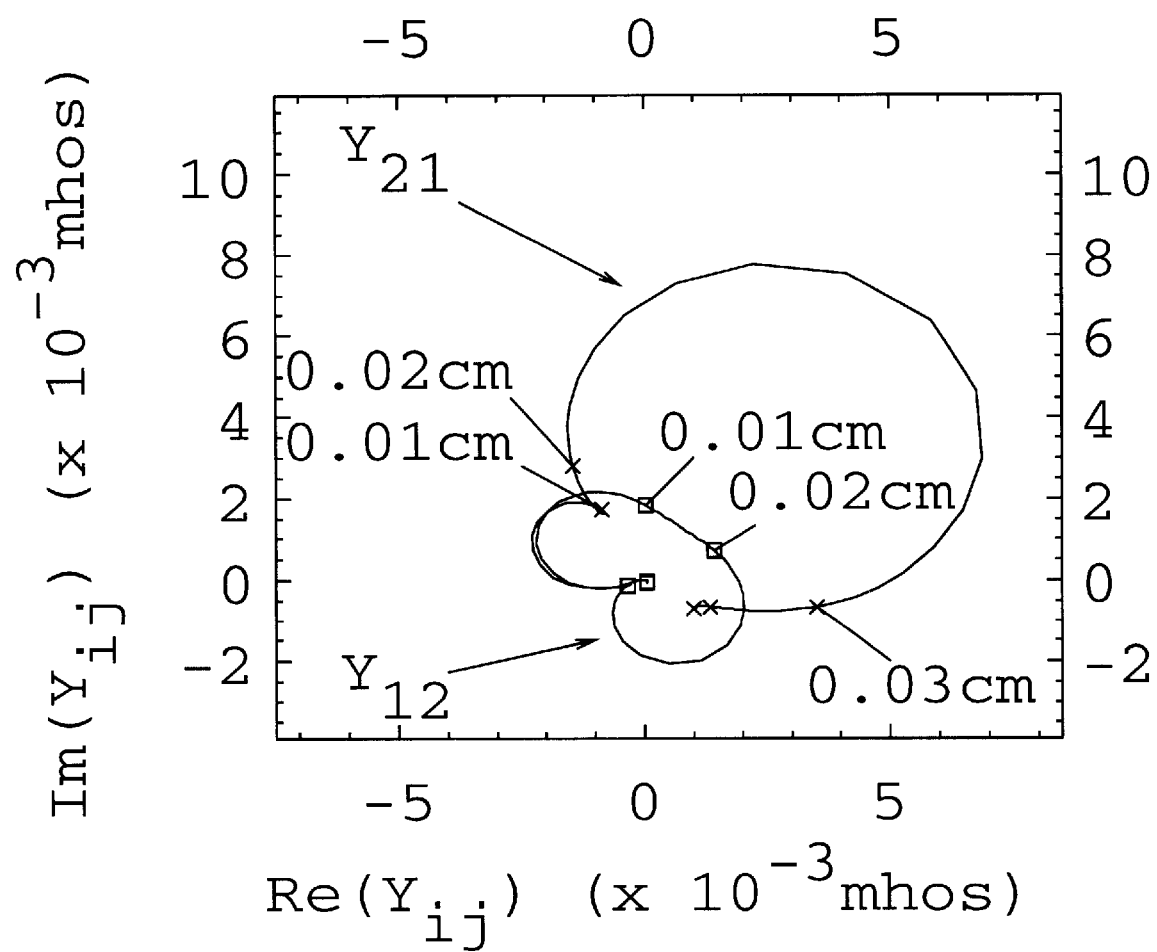
FIG. 12 is a graph that shows two complex admittance curves.

As indicated in Table IV, FIGS. 11 and 12, present a set of curves for the 2-port admittance matrix elements of TWFET case 1 with a series resistance of 2.0 k-ohm/cm for both the gate-source and drain-source electrode pairs. Length points at $z_0$ values of 0.01, 0.02, 0.03, 0.04, 0.05 cm are shown with "x" markers or "box" markers to distinguish between the two curves of each figure. The curves for $Y_{11}$ and $Y_{22}$ in FIG. 11, show a region of negative values for the real-part of $Y_{11}$ for a range of $z_0$ near the point of 0.03 cm. FIG. 12 presents the corresponding curves for the Y21 and $Y_{12}$ admittance matrix elements for the same range of $z_0$ values.

The aspect of these admittance matrix curves which can be useful for designing a TWFET amplifier, is that portion of the $Y_{11}$ curve for which the real part of $Y_{11}$ is negative. The 2-port admittance matrix for this portion of the curve can be augmented by adding a shunt conductance to the input-side of the TWFET, for example, by attaching the shunt conductance between the gate and source electrodes at the plane of $z_0$=0 in the transmission line structure. With the proper choice of the value of this shunt conductance, the augmented 2-port will have a $Y_{11}$ value with a small positive real component. (See pp. 243–247 of Ernest S. Kuh and R. A. Rohrer, *Theory of Linear Active Networks* Holden-Day, Inc., San Francisco (1967).) Often this value can be adjusted to obtain an absolutely stable 2-port for the augmented TWFET structure for which both MAG and U gain quantities are defined. In addition, for this absolutely stable 2-port, it is possible to determine the optimum terminations for the TWFET amplifier which provide simultaneous complex conjugate match at the TWFET input and output. (See pp. 239–41 of the text referred to above by Ernest S. Kuh and R. A. Rohrer.)

For an example of this TWFET amplifier design method, consider TWFET case 1, with 2-port admittance matrix curves of FIG. 11 and 12. At $z_0=0.034$ cm, the 2-port admittance matrix element $Y_{11}$ has a real part of $-6.36 \times 10^{-3}$ mhos, and an MSG value of 56.42. A shunt conductance of $6.4 \times 10^{-3}$ mhos can be added to the input of the gate-source electrode pair at the $z_0=0$ plane, to create an augmented 2-port with a 2-port admittance matrix element $Y_{11}$, with a positive real component of $4.0 \times 10^{-5}$ mhos. This augmented 2-port is absolutely stable, with defined maximal gain quantities of a U value of 11.0, a MAG value of 19.0. In addition, optimum terminations for the TWFET amplifier design can be calculated for this augmented 2-port, with values of $5.26 \times 10^{-5} + j\ 5.92 \times 10^{-3}$ mhos for the TWFET input, which attaches to the gate-source electrodes in the plane $z_0=0$, and $1.47 \times 10^{-3} + j\ 1.51 \times 10^{-3}$ mhos for the TWFET output, which attaches to the drain-source electrodes in the plane $z_0=0.034$ cm.

In addition to this use in TWFET amplifier design, the portion of the $Y_{11}$ curve of FIG. 11, for which the real part of $Y_{11}$ is negative, can also be used to design an oscillating circuit element. For this oscillating circuit element, the key requirement is that a 1-port structure is obtained which has a negative real-value for the input admittance. (See pp. 285–293 of the textbook by Charles A. Lee and G. Conrad Dalman, *Microwave Devices, Circuits and Their Interaction,* John Wiley & Sons, Inc., New York (1994).) The input admittance, $Y_{IN}$, of a 2-port structure with an open circuit termination the output is given by:

$$Y_{IN} = Y_{11} - \left(\frac{Y_{21} \cdot Y_{12}}{Y_{22}}\right)$$

(See pp. 232 of the text referred to above by Ernest S. Kuh and R. A. Rohrer.) For TWFET case 1, of FIG. 11, and 12, the values of the 2-port admittance matrix at $z_0=0.034$ cm yield a value for $Y_{IN}$ of $-6.3 \times 10^{-3} + j - 5.9 \times 10^{-3}$. Note that changing the value of $z_0$ will change the value of the input admittance obtained for this 1-port, and thus provides some design flexibility without requiring a change in the FET-cross-section of the TWFET.

Figure 13:
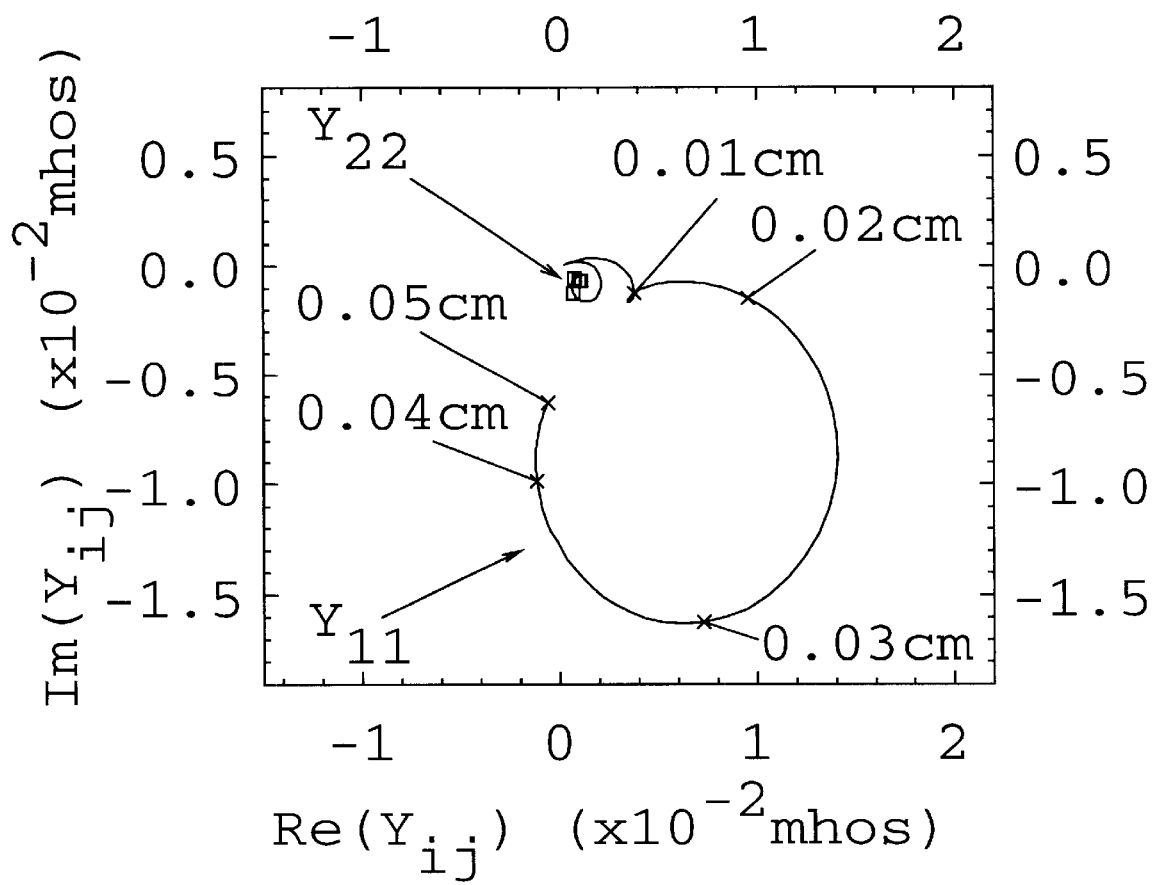
FIG. 13 is a graph that shows two complex admittance curves.
Figure 14:
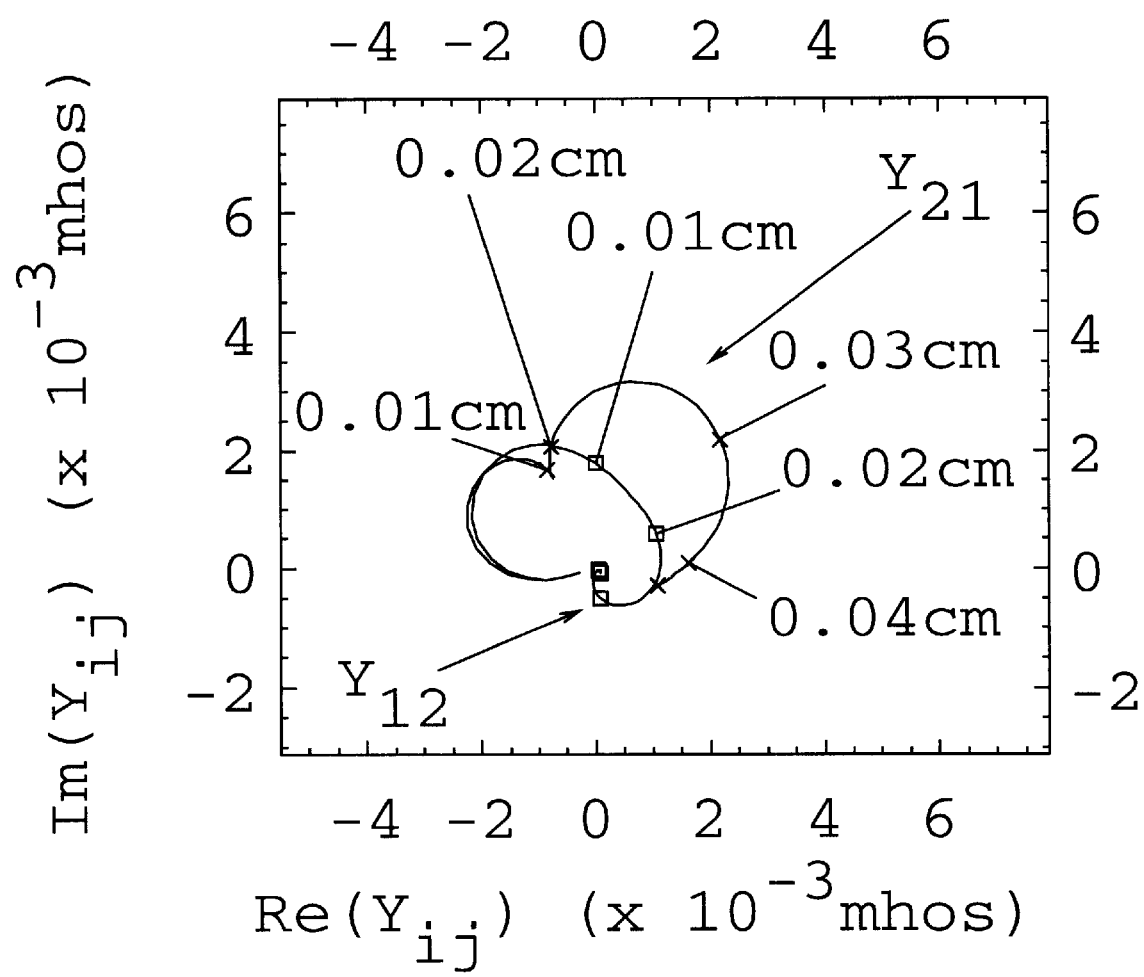
FIG. 14 is a graph that shows two complex admittance curves.

A comparison of FIGS. 11 and 12 to FIGS. 13 and 14, provides an example of the effect of the series resistance value on the 2-port admittance matrix curves for the TWFET coupled structure. In FIGS. 13 and 14 the series resistance value is 4.0 k-ohm/cm for both the gate-source and drain-source electrode pairs, which is twice the series resistance value of the calculated admittance matrix curves of FIGS. 11 and 12. As this comparison indicates, these curves of 2-port admittance matrix elements are modified by the increase of the series resistance of the TWFET transmission line electrodes. The effect can be generally described as a decrease in the size of the admittance matrix curves mainly in the $Y_{11}$ and $Y_{21}$ curves, and a decrease in the rate-of-change of the admittance matrix element with the coupling length. This latter effect appears in these curves as if the curves were "un-coiling" with the increased series resistance. This trend would increase with an additional increase in series resistance so that at sufficiently high values of series resistance, there may be no portion of the $Y_{11}$ curve with negative real values.

To see the change in admittance matrix values of the TWFET 2-port with the increase in TWFET electrode series resistance, and its consequences for TWFET amplifier design, consider a comparison of the admittance matrix element values used in this design at $z_0=0.034$ cm. In the preceding paragraphs, the TWFET amplifier which was obtained by adding a shunt conductance to the input-port for the TWFET with admittance matrix values of FIGS. 11 and 12 for the coupling length $z_0=0.034$ cm , was found to have a gain (MAG) of 19.0, and a U value of 11.0. With the increase in series resistance which results in the curves of FIGS. 13 and 14, the same coupling length yields a TWFET with a positive real component for $Y_{11}$. This TWFET is absolutely stable, and has a MAG value of only 1.18, a U value of 1.16, and a value of MSG of 14.3. Thus, at this coupling length, the positive real $Y_{11}$ is accompanied by a reduction in the values for MAG, U, and MSG, that can be obtained for the TWFET amplifier.

This same trend of a decrease in TWFET amplifier gain with an increase in series resistance is also found in a comparison of the maximum value of MSG which is found in the two sets of admittance matrix curves. For the case of the TWFET of FIGS. 11 and 12, the maximum value of MSG over the range of $z_0$ is 177.3 at $z_0=0.035$ cm. This maximum MSG value is much less for the case of the TWFET of FIGS. 13 and 14 in which its maximum value over the range of $z_0$ is 35.2 at $z_0=0.0375$ cm.

Thus, the comparison of admittance matrix curves with increase in electrode series resistance indicates that increased series resistance values will tend to decrease the gain obtained for the TWFET. At a some value of the electrode series resistance, there may be no portion of the admittance matrix curves for which it is possible to design a TWFET amplifier or oscillator circuit element. We can use this point to define a maximum value of the electrode series resistance, for a given coupling length, as the highest value of the electrode series resistance for which it is possible to design a TWFET amplifier which provides signal gain, or for which it is possible to construct an oscillator circuit element from an open circuit termination at the TWFET output.

The Effect of Neutral Region Length of the Lateral Spacing Region

The preceding discussion of TWFTET amplifier design has considered the effect of increased series resistance for the TWFET case 1 of Tables I and II(a, b). This technical disclosure will next focus on a design element of the lateral spacing region which is the neutral-region-length of this feature. The effect of varying this design element can be found by a comparison of TWFET case 1 and case 2 of these Tables, since this neutral-region-length is the main difference between these two TWFET examples. This comparison will illustrate that this lateral spacing region design parameter can significantly affect the TWFTET 2-port admittance matrix curves.

The first calculation result which shows the effect of the lateral spacing region neutral region length is the comparison of the Y and K matrix element curves for TWFET case 1 and case 2. These curves are presented in FIGS. 3 through 10, with 100 GHz Y and K matrix element values also given in Table V(a) and V(b). As seen in these figures and the data in Table V(a, b), the prevailing difference between these two TWFET cases is that the magnitude of the AC Y and K matrix elements is smaller for the curves of TWFET case 2 as compared to corresponding curve for TWFET case 1. For example, at 100 GHz, the reduction in magnitudes is approximately a factor of 0.6 for all Y and K matrix elements.

In order to understand how the increased neutral region length of the lateral spacing region resulted in this almost uniform reduction of the magnitudes of the Y and K matrix element, it is useful to think of these regions as an R-C series circuit. In this view, the depletion depth of the lateral spacing region corresponds to the capacitor, while the neutral region length corresponds to the resistor which is connected in series with this capacitor. This analogy can explain the reduction in Y matrix element values with this increase in neutral region length, because this change would increase the resistor value, which would also increase the total impedance of the R-C series combination. This increased impedance decreases AC current through the lateral spacing region, and thus also decreases any admittance matrix element associated with this lateral spacing region. In addition, the increase in resistance has the result of both reducing the AC voltage across the depletion region, and, in addition, increasing the AC voltage across the neutral region. The first result reduces charge induced on the gate electrode for the calculation of of $K_{gs}$ or $K_{gd}$. However, it can be seen that this is also accompanied by a reduction in the charge induced on the drain electrode for the $K_{ds}$ or $K_{dg}$ calculation. The reduction in drain-charge is due to the fact that the increased voltage drop across the neutral region occurs with an increase in the length of this neutral region—so that the electric field can decrease if the length increase exceeds the increase in the potential across this neutral region. This latter point is apparently the case, which explains the approximately uniform factor for the magnitude decrease in the Y and K values for case 1 vs. case 2.

To see how this change in the Y and K matrix elements affects the TWFET 2-port admittance matrix curves, compare FIGS. 15 and 16 to FIGS. 13 and 14. As indicated in Table IV, FIGS. 15 and 16 were calculated for the same set of series resistance parameters and fixed frequency value that were used for FIGS. 13 and 14. Comparison of these 2-port admittance matrix curves shows a general trend of an increase in the size of the $Y_{11}$ and $Y_{21}$ curves over the range of coupling lengths for TWFET case 2 as compared to the curves of TWFET case 1.

Figure 15:
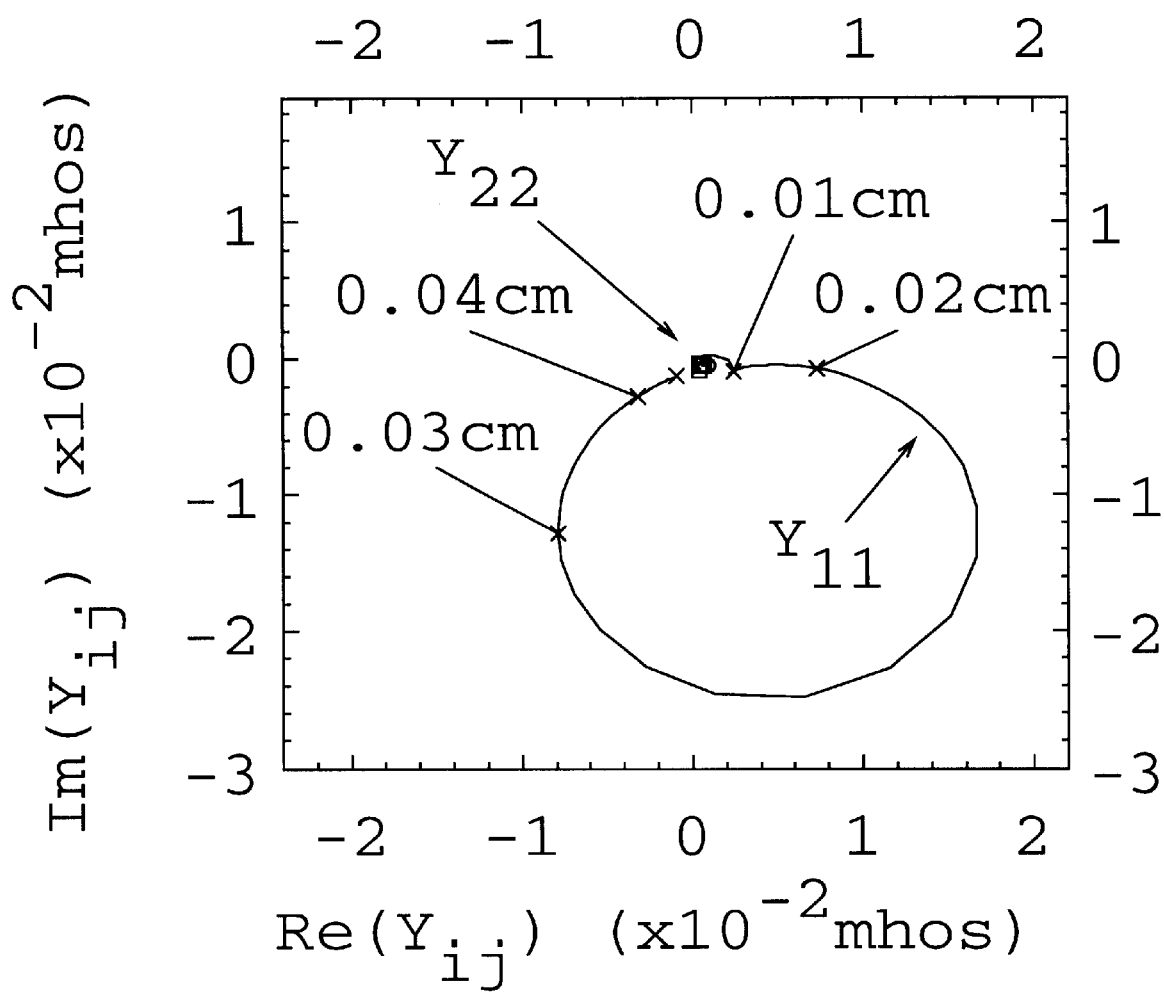
FIG. 15 is a graph that shows two complex admittance curves.
Figure 16:
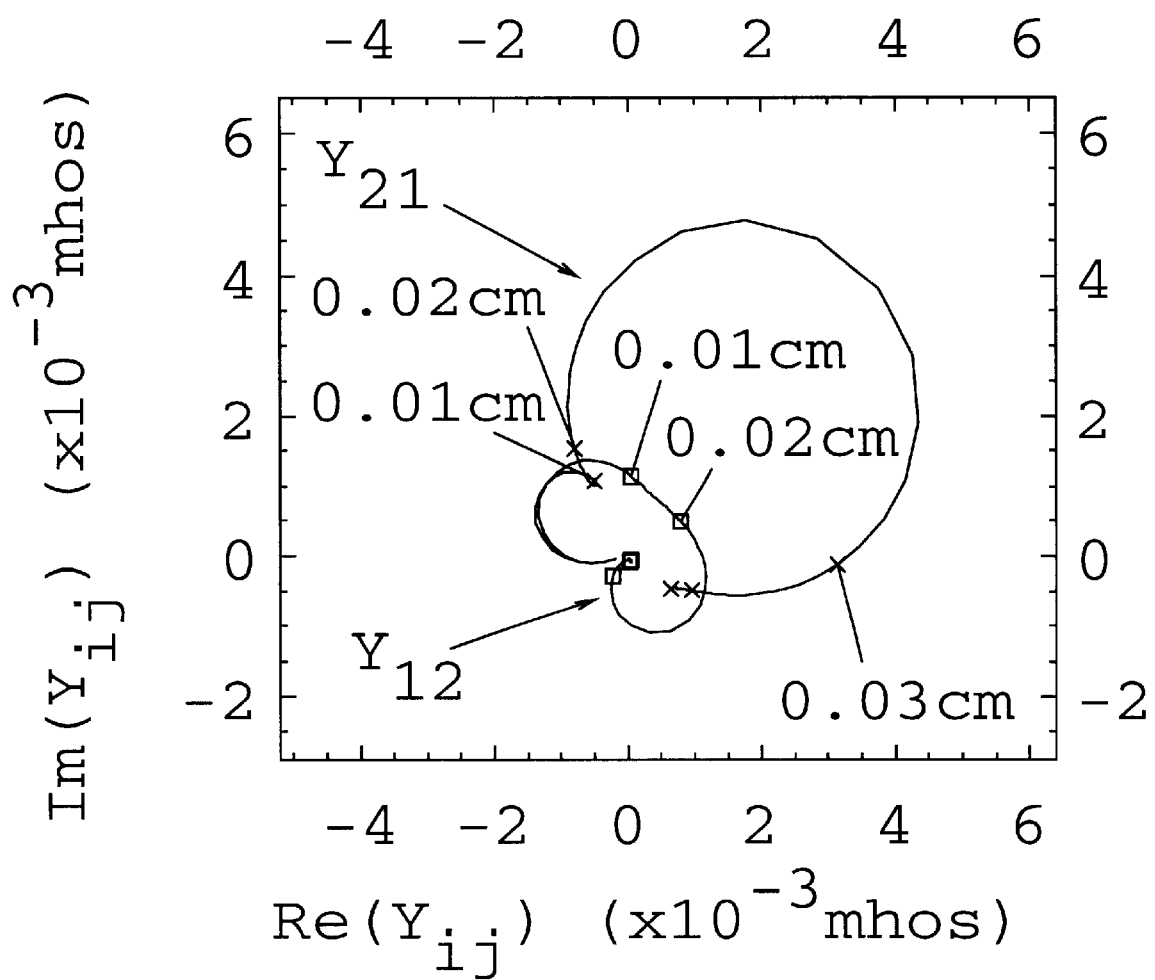
FIG. 16 is a graph that shows two complex admittance curves.
Figure 17:
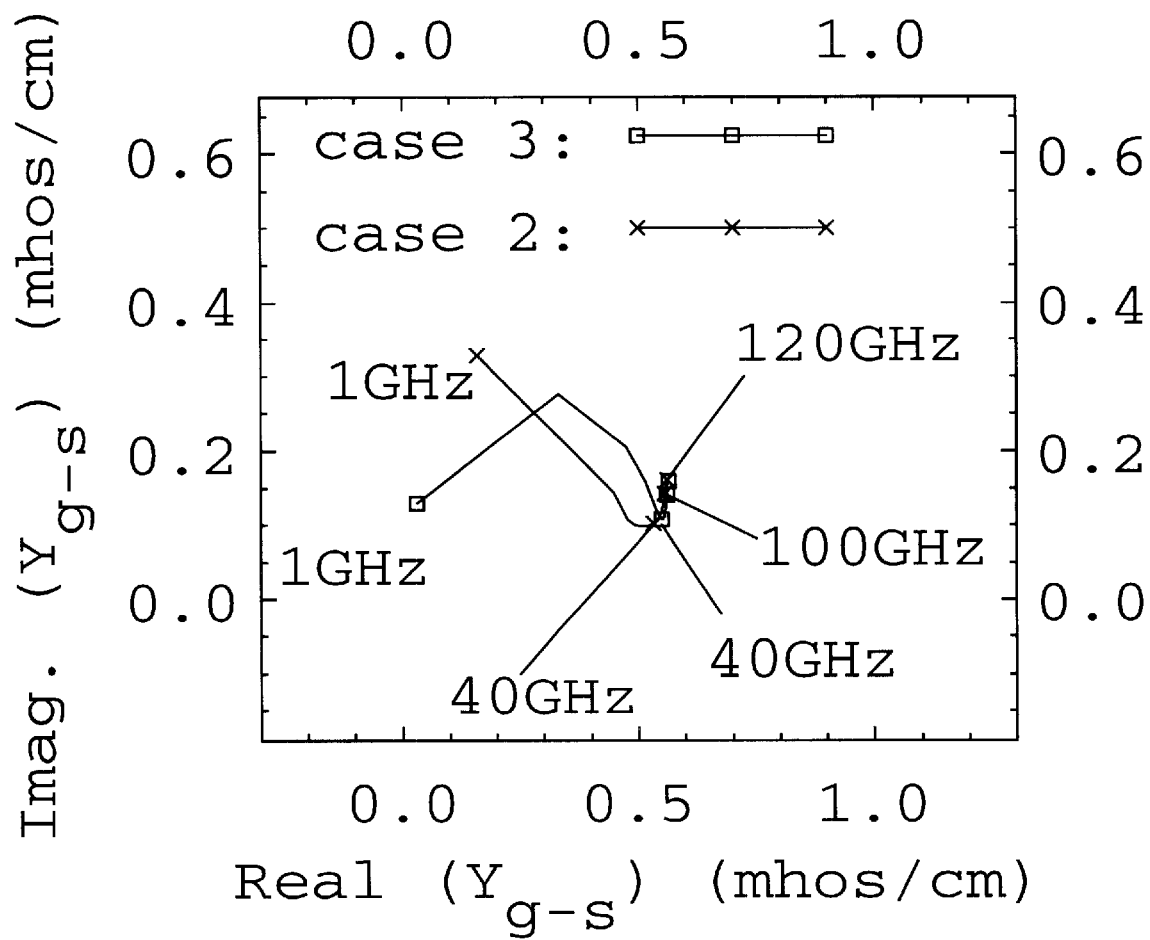
FIG. 17 is a graph that shows complex admittance matrix curves.
Figure 18:
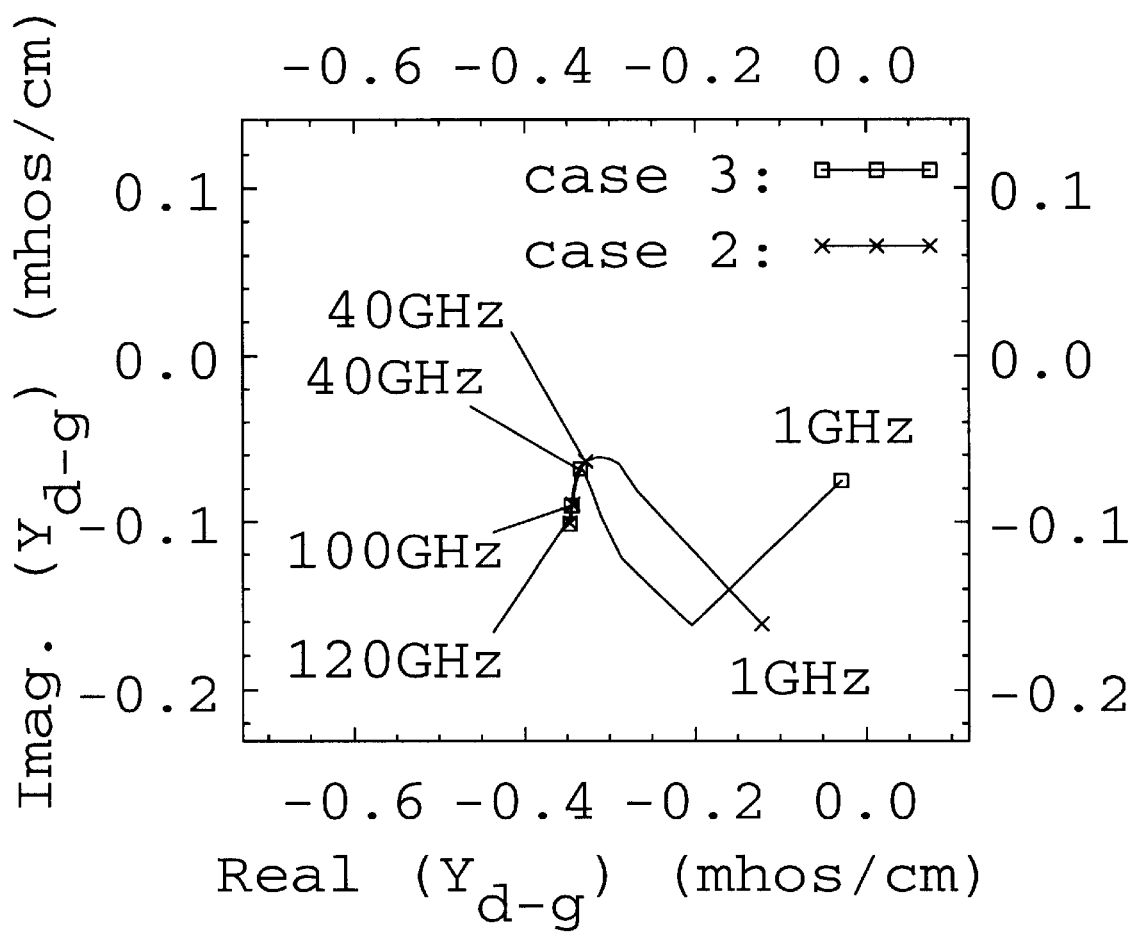
FIG. 18 is a graph that shows complex admittance matrix curves.
Figure 19:
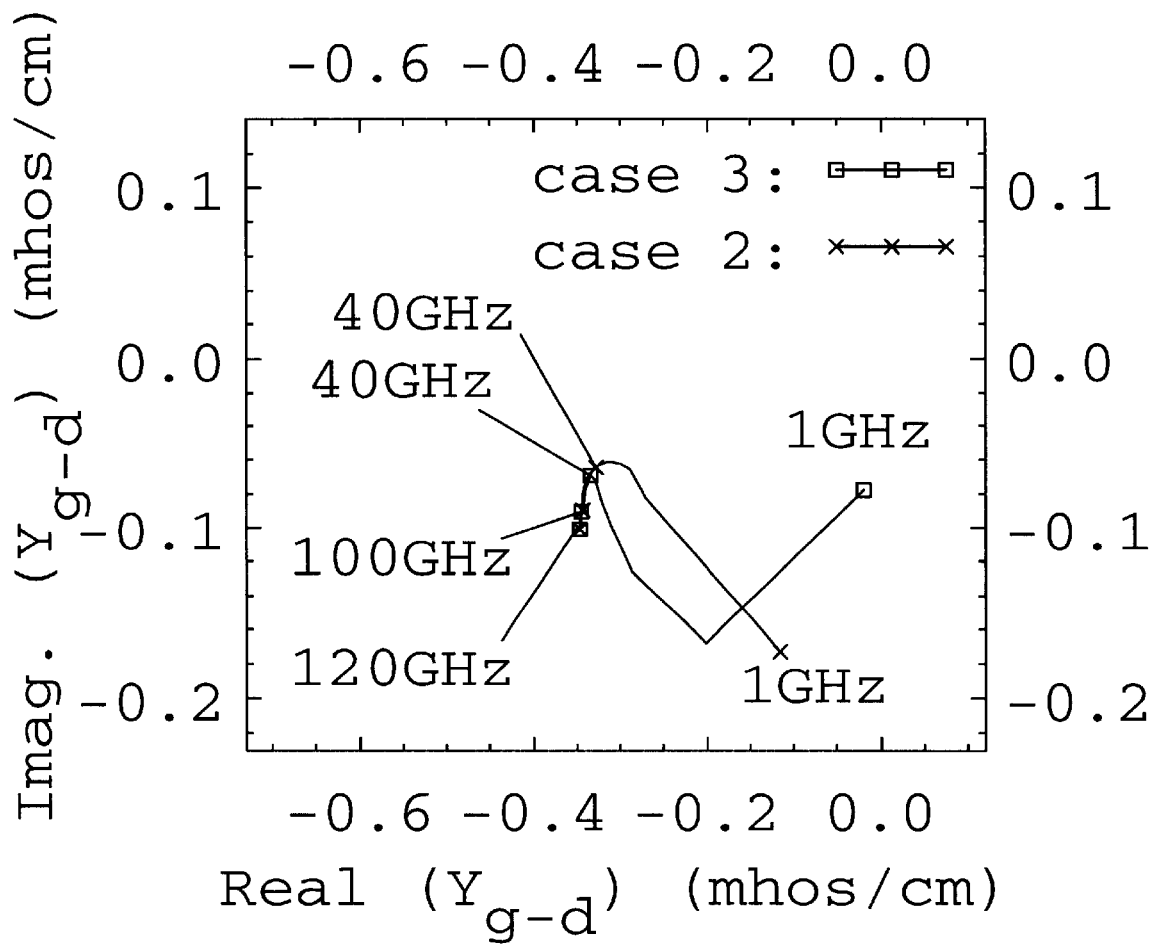
FIG. 19 is a graph that shows complex admittance matrix curves.
Figure 20:
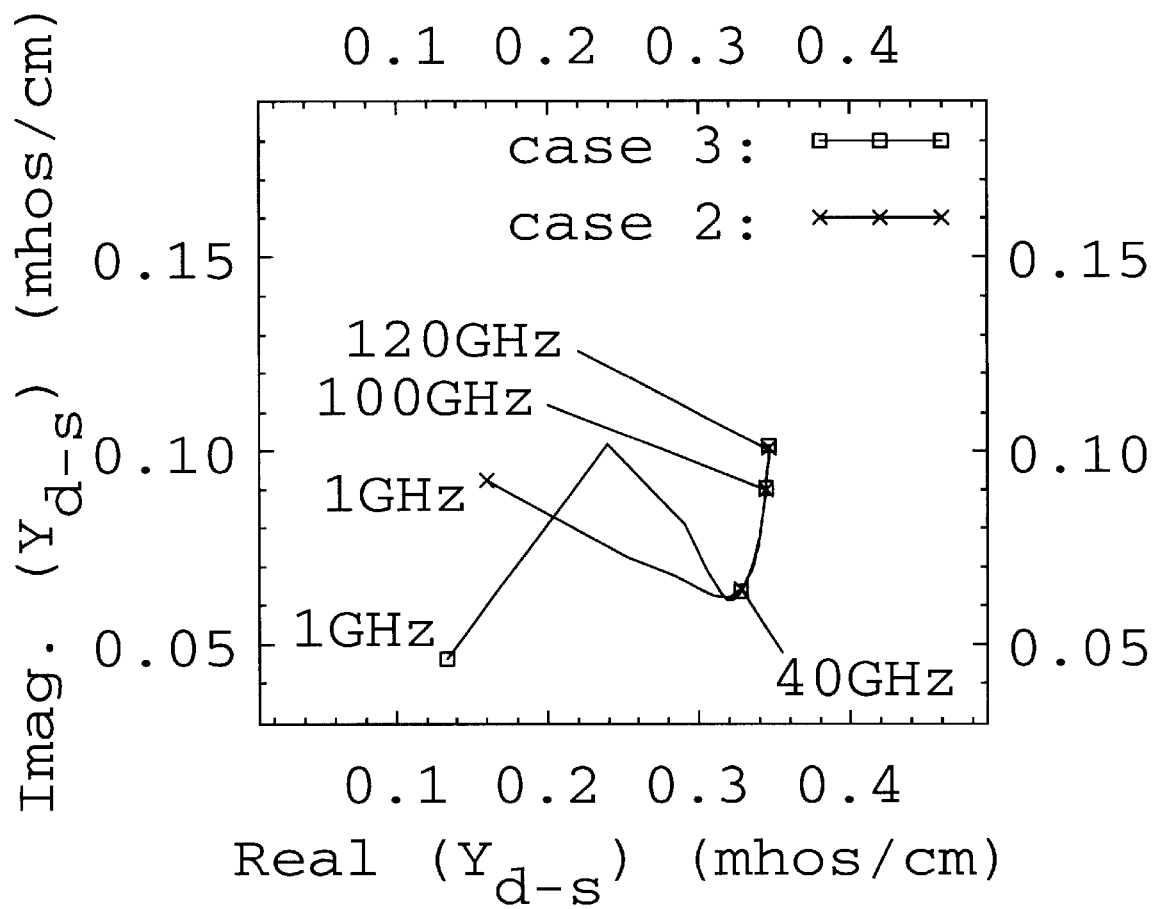
FIG. 20 is a graph that shows complex admittance matrix curves.
Figure 21:
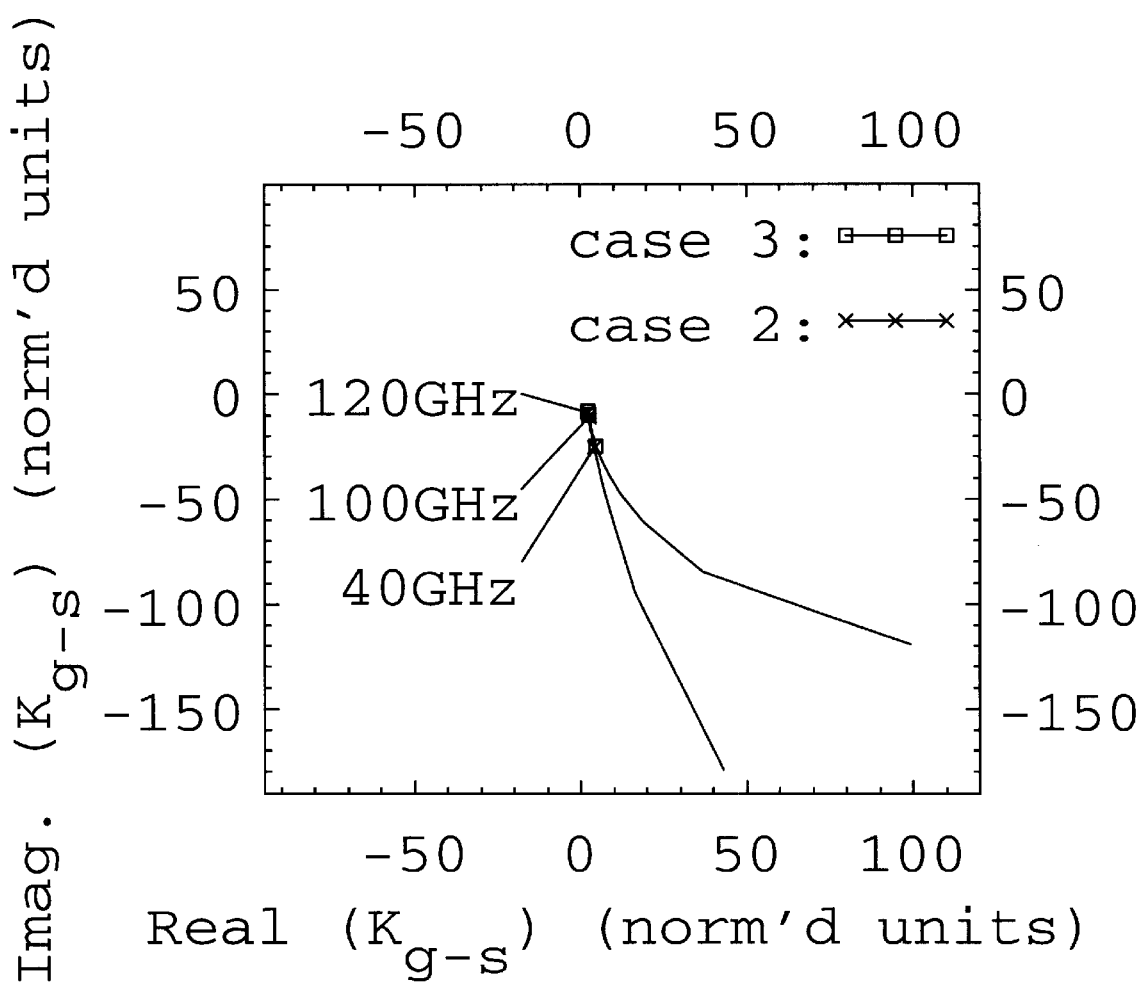
FIG. 21 is a graph that shows normalized charge matrix curves.
Figure 22:
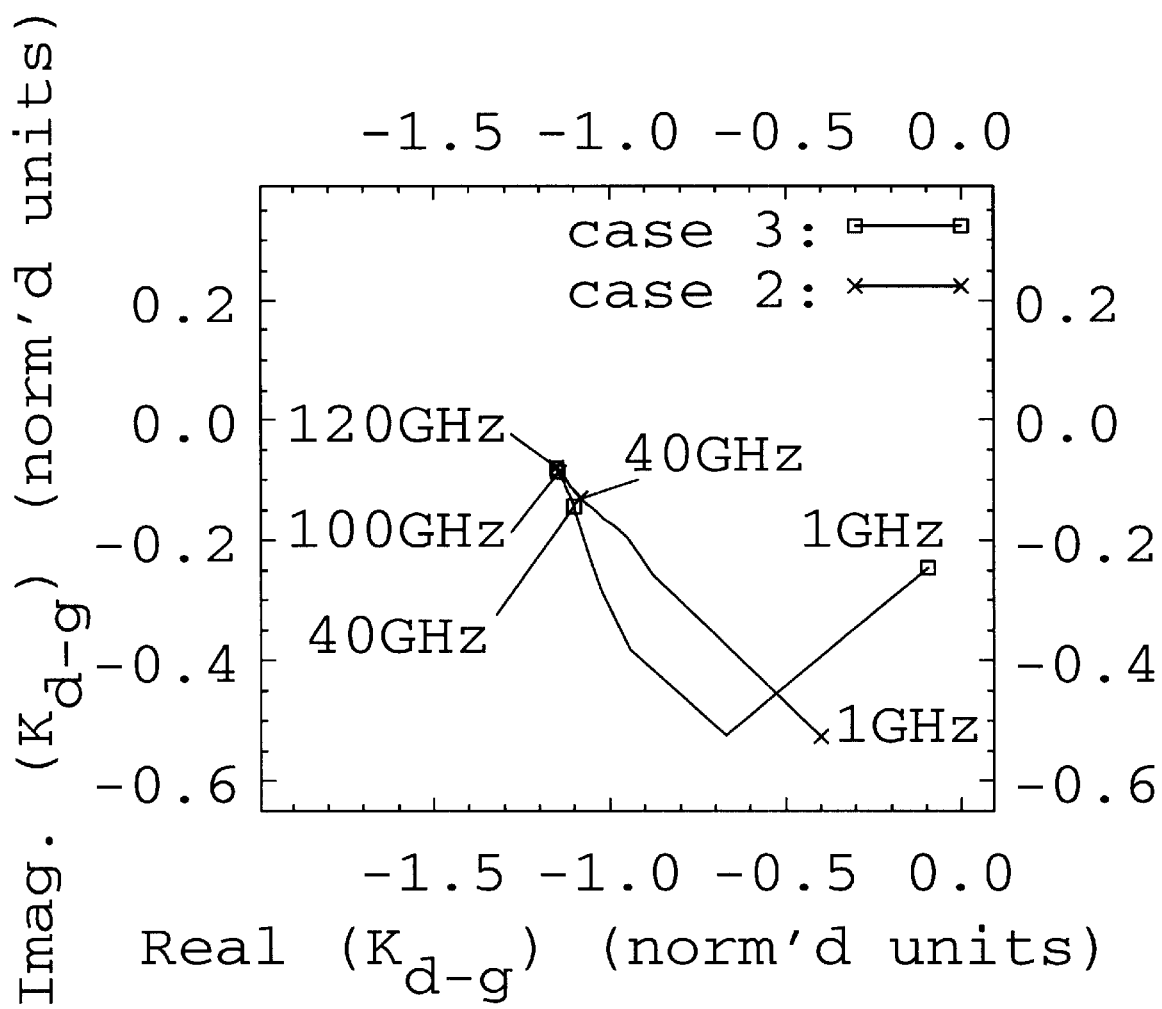
FIG. 22 is a graph that shows normalized charge matrix curves.
Figure 23:
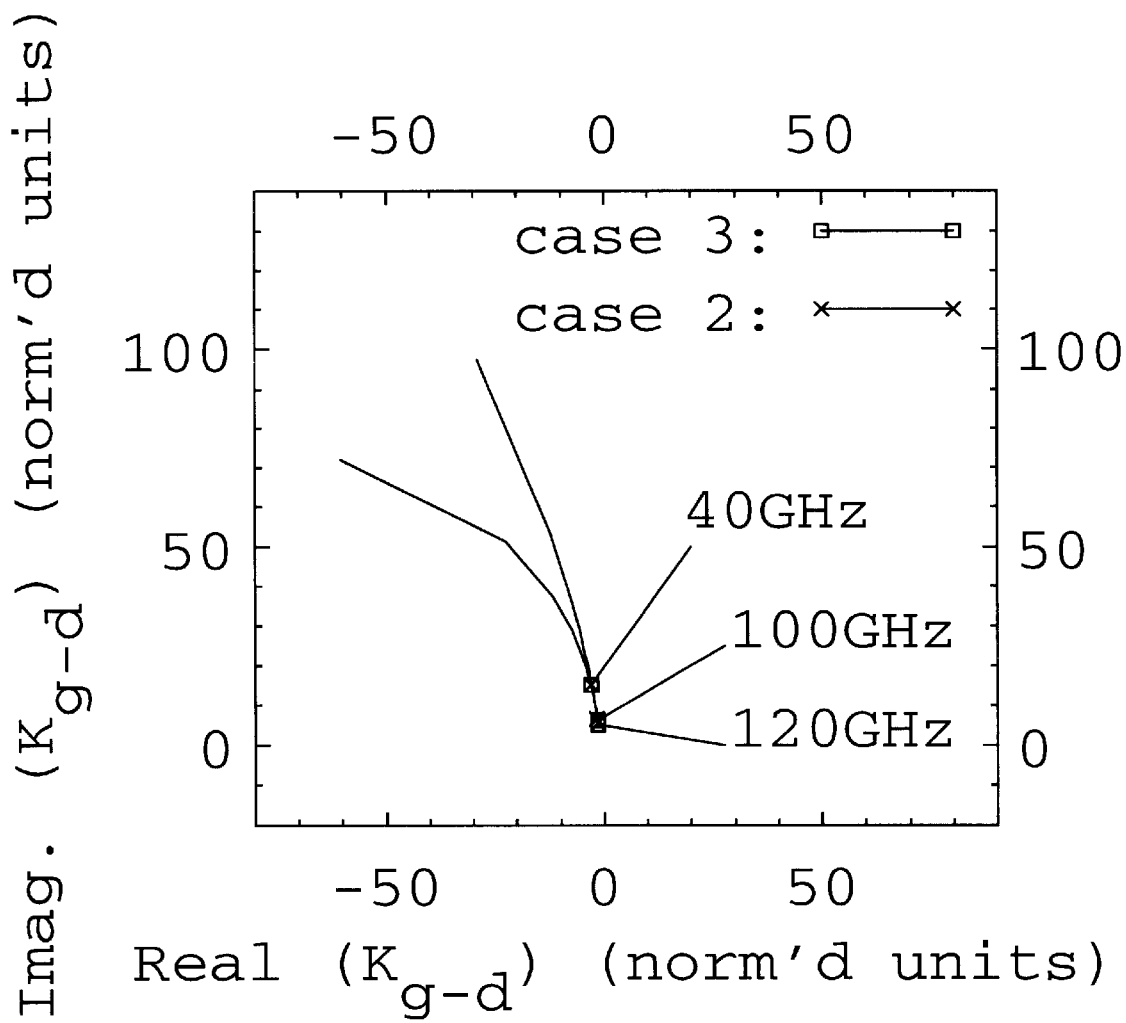
FIG. 23 is a graph that shows normalized charge matrix curves.
Figure 24:
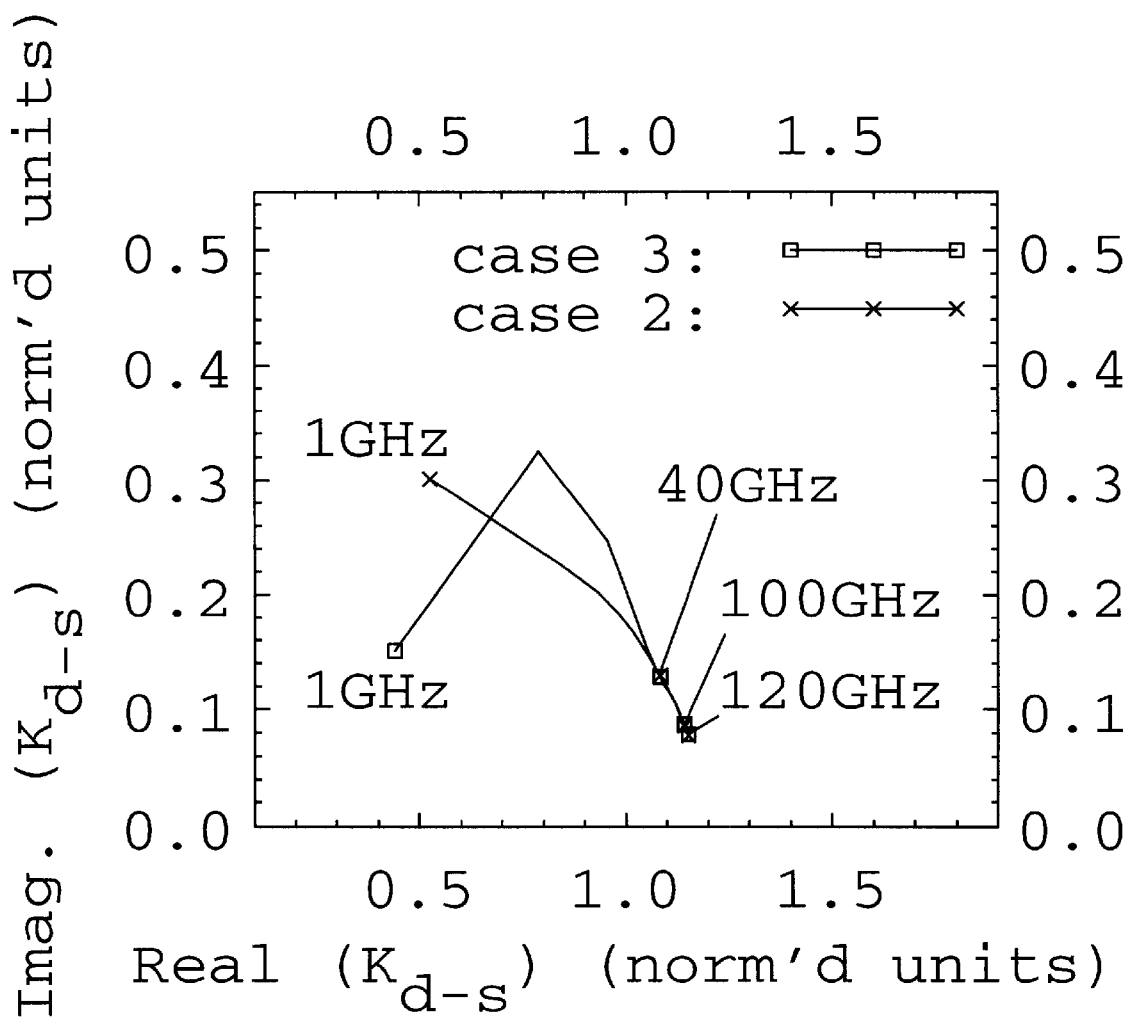
FIG. 24 is a graph that shows normalized charge matrix curves.
Figure 25:
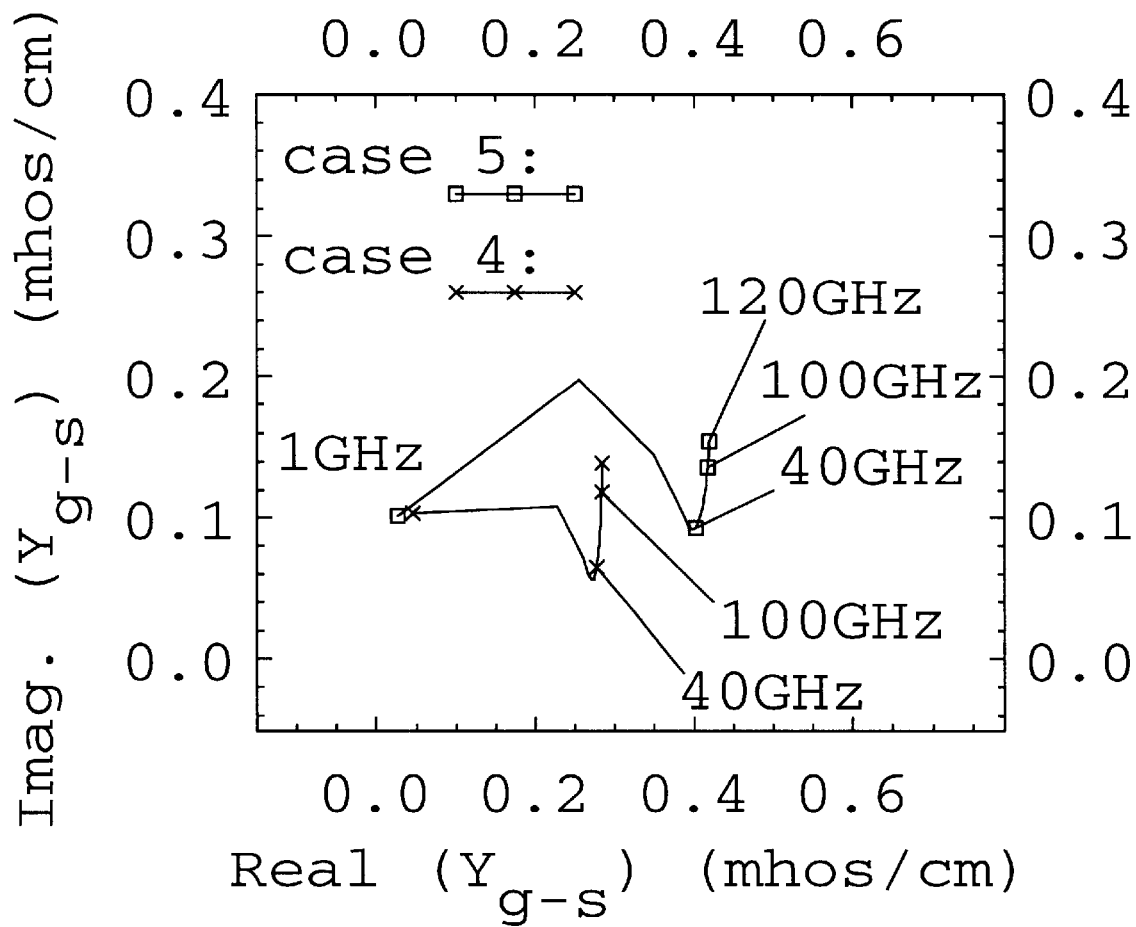
FIG. 25 is a graph that shows complex admittance matrix curves.
Figure 26:
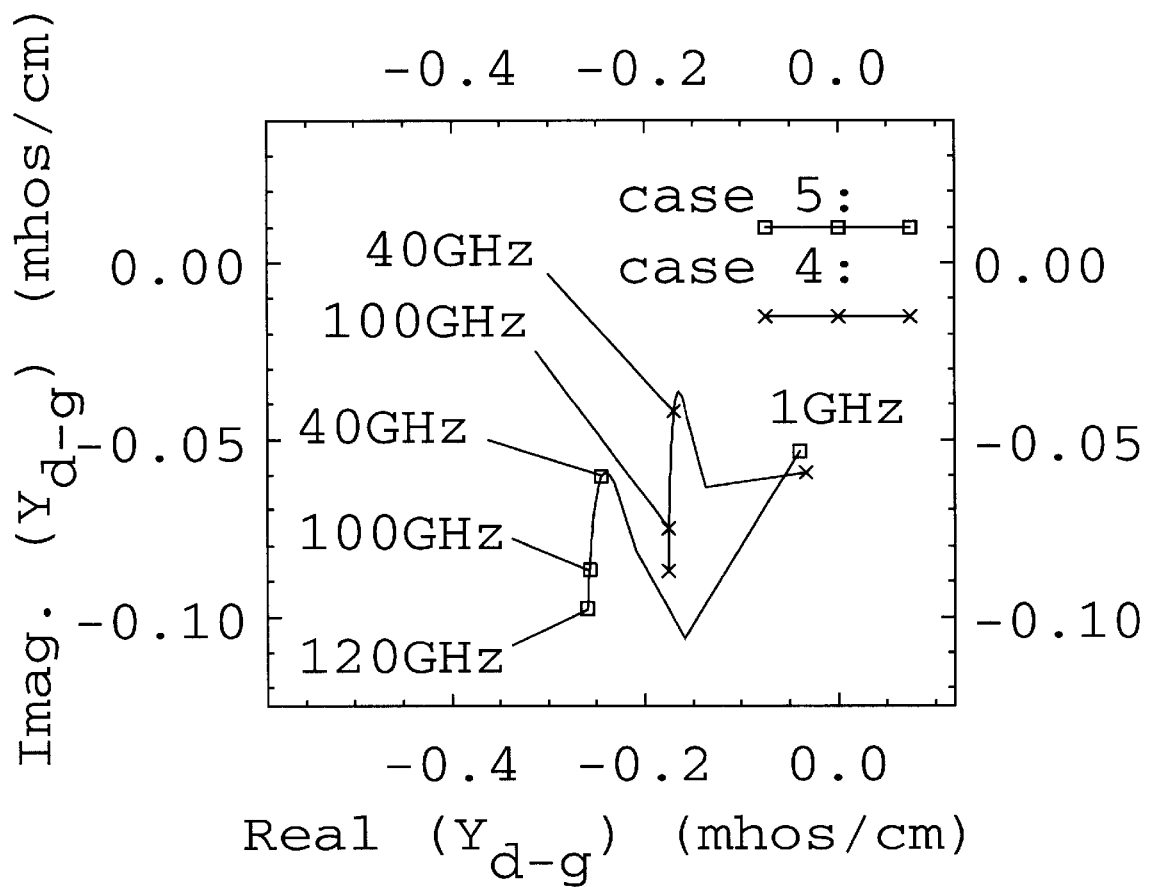
FIG. 26 is a graph that shows complex admittance matrix curves.
Figure 27:
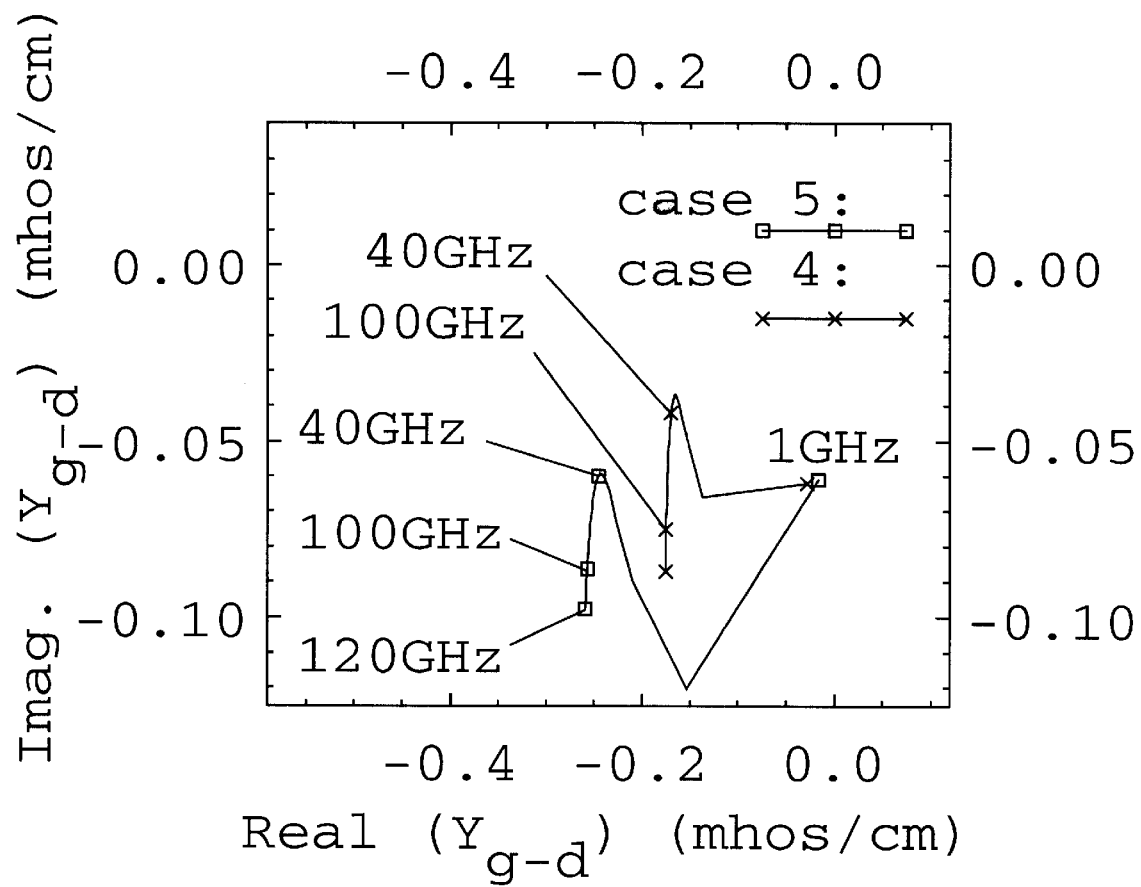
FIG. 27 is a graph that shows complex admittance matrix curves.
Figure 28:
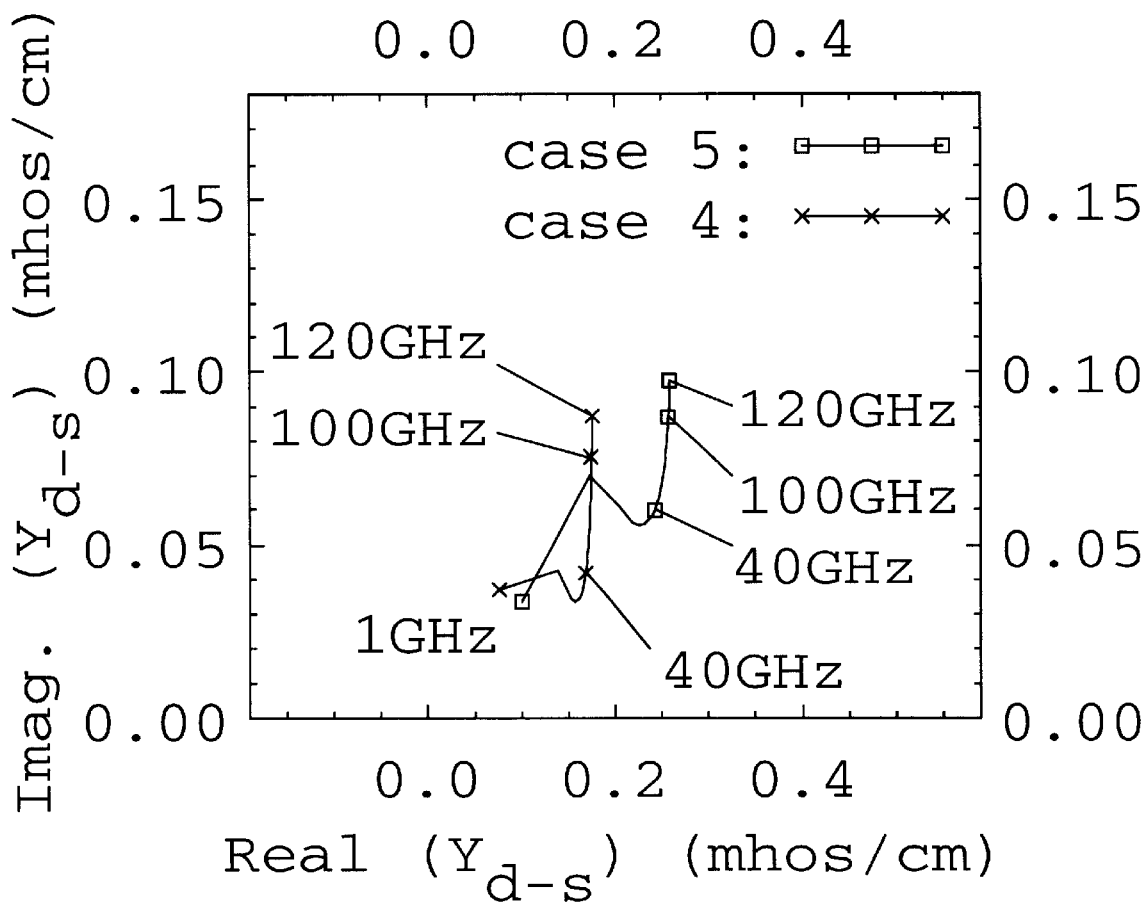
FIG. 28 is a graph that shows complex admittance matrix curves.
Figure 29:
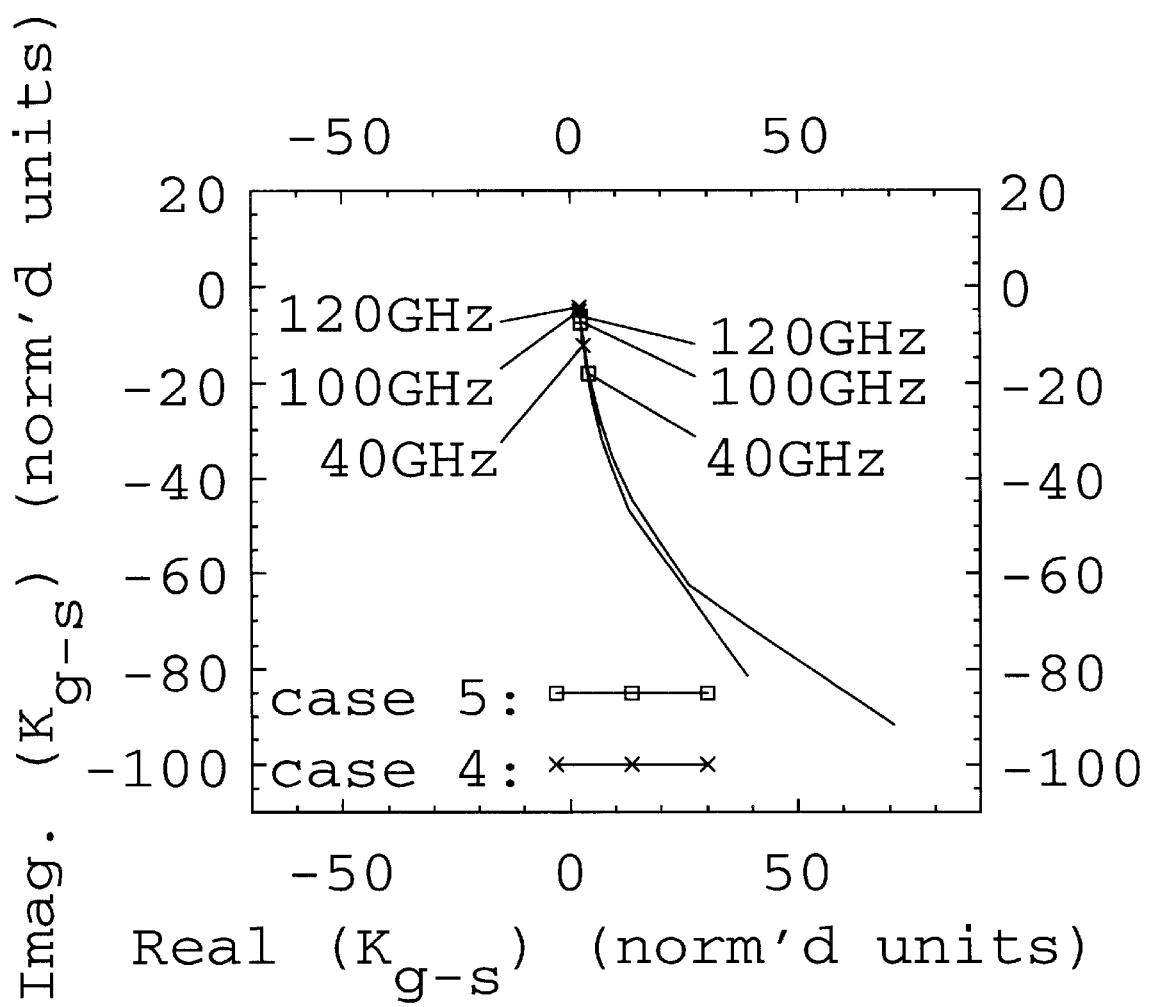
FIG. 29 is a graph that shows normalized charge matrix curves.
Figure 30:
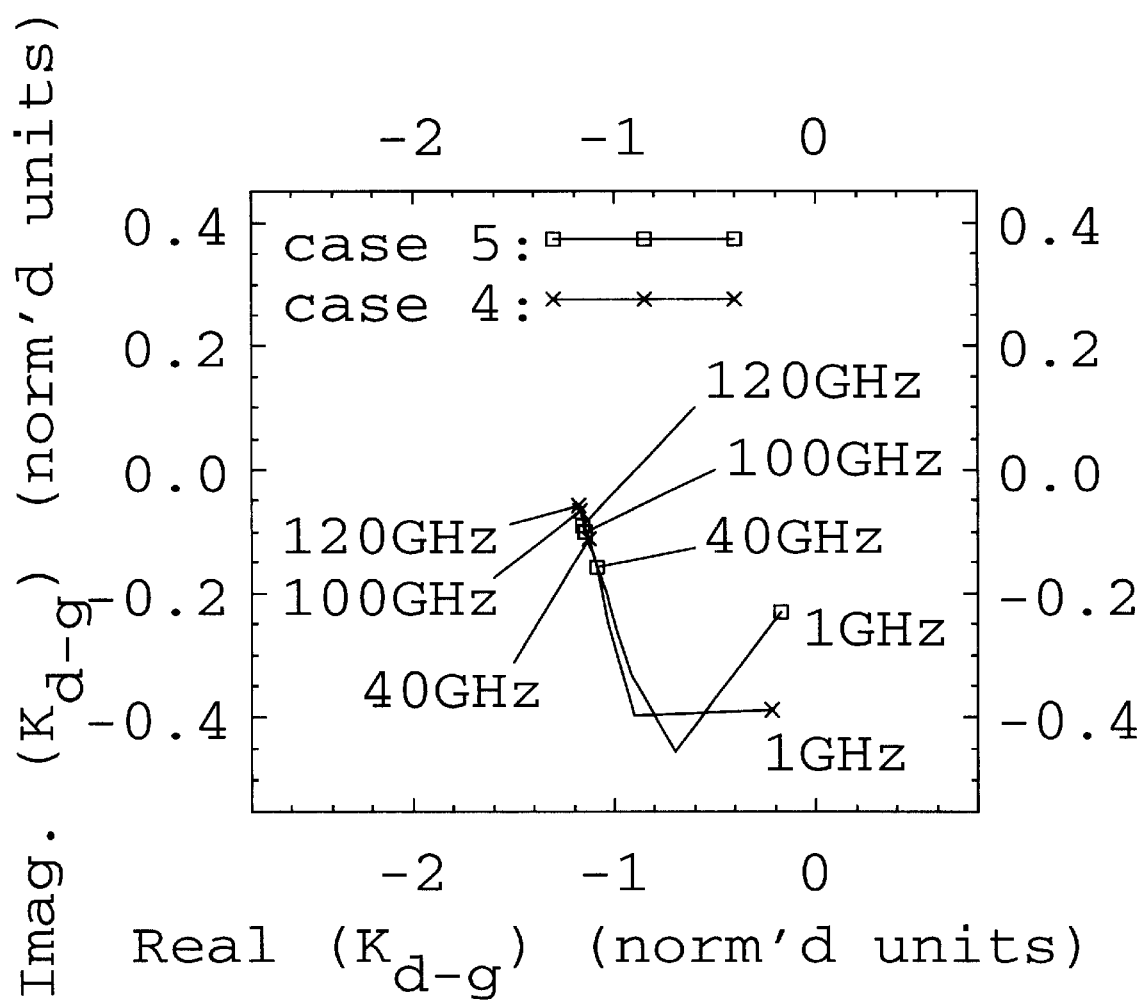
FIG. 30 is a graph that shows normalized charge matrix curves.
Figure 31:
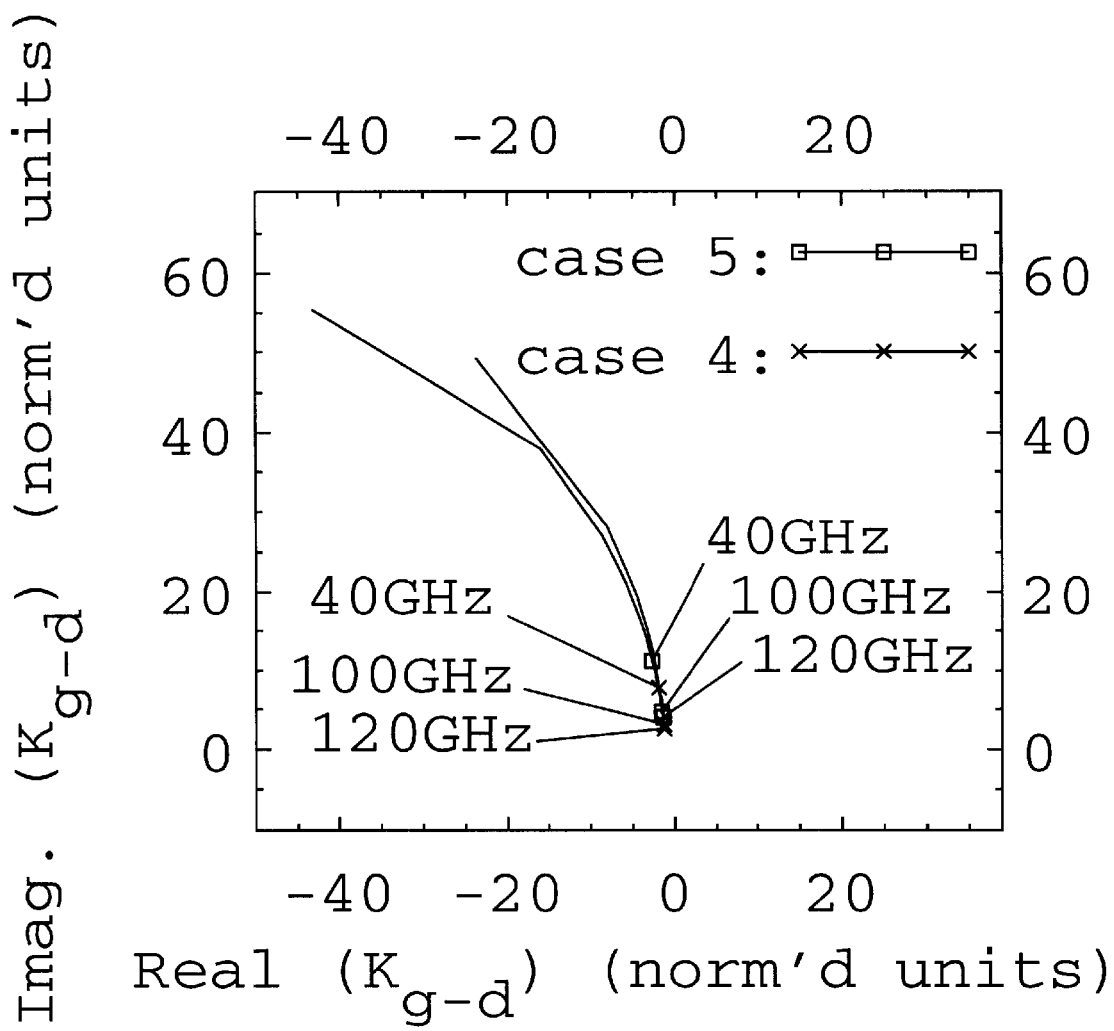
FIG. 31 is a graph that shows normalized charge matrix curves.
Figure 32:
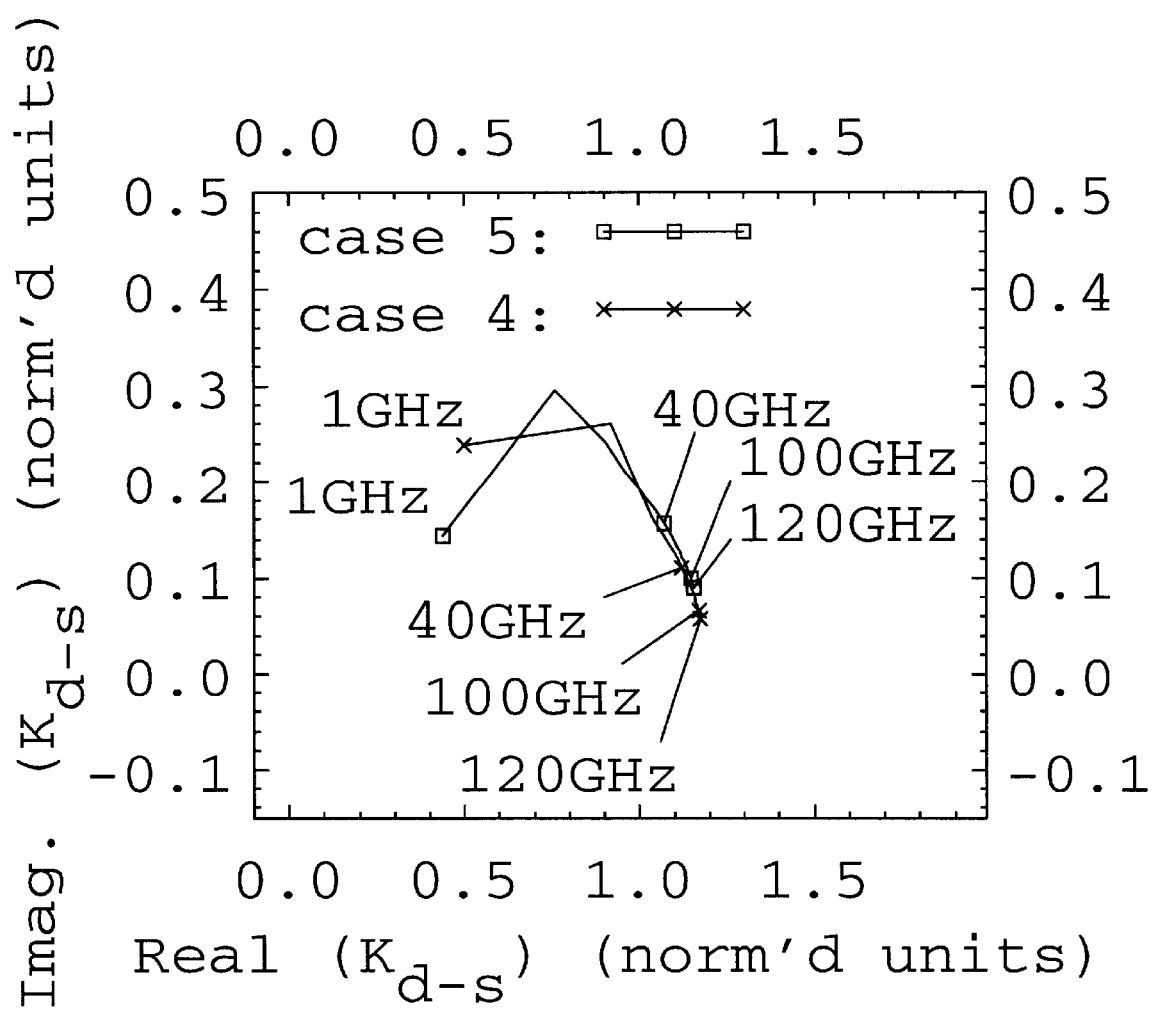
FIG. 32 is a graph that shows normalized charge matrix curves.

It is also interesting to compare TWFET amplifier design at a coupling length of $z_0$=0.034 cm. As noted previously, TWFET case 1 of FIGS. 13 and 14, provides an absolutely stable 2-port at this coupling length with a value of MAG of 1.18. TWFET case 2, as indicated by the curve of FIG. 15, has a negative real part of $Y_{11}$ at this coupling length, with a value of −5.71×10$^{-3}$ mhos, and has an MSG value of 31.36. When this 2-port is augmented by the addition of a shunt conductance of 5.75×10$^{-3}$ mhos to the input port, as described above, it creates an augmented 2-port which is absolutely stable, which has a U value of 13.8 and a MAG of 18.27.

This comparison shows that a result of the increased neutral-region-length of the lateral spacing region is that it can be used to allow higher TWFET electrode series resistance values in the TWFET amplifier design. In addition, for a given value of electrode series resistance, the increased neutral-region-length in the lateral spacing region, can be used to obtain an increased gain for a TWFET amplifier design at a particular coupling is length.

Gate Length

The preceding comparison of case 1 and case 2 of the TWFETs of Tables I and II(a, b), demonstrates that the change in lateral spacing region design caused a significant change in the TWFET current-voltage characteristics. This suggests that the lateral spacing regions and possibly the nearby the end-regions of the cross-section-FET of the TWFET are a critical element of the TWFET cross-section design.

This point can be confirmed by comparing the Y and K coupling matrix elements obtained for case 3 and case 2 of the TWFETs of Tables I and II(a, b). As indicated by the FET cross-section design values in these tables, the main difference between these two cases is the gate length. This length is 10.0 microns for case 2, and only 3.0 microns for case 3. The curves of the Y and K coupling matrix elements calculated for these two cases is shown in FIGS. 17 through 24. As these curves demonstrate, at frequencies which are well above 40 GHz, there is no significant difference between these two TWFET cases.

The reason that the high frequency values of the Y and K matrix elements are not affected by the gate length parameter alone may be understood by the noting the correspondence of the FET-cross-section to a distributed R-C circuit element. (See chapter 18 of the textbook by A. van der Ziel, *Solid State Physical Electronics,* Third Edition, Prentice-Hall Inc., Englewood Cliffs, N.J. (1976). This is also discussed in the paper by A. van der Ziel et. al., "Small-Signal, High-Frequency Theory of Field Effect Transistors," *IEEE Trans. on Electron Devices* vol. ED-11, pp. 128–135 (April, 1964).) The high frequency AC-voltage and current in this structure have a wave-like behavior, with a propagation constant along the FET channel. In a simple R-C circuit element, this propagation constant is the square-root of the product of the frequency, channel resistance-per-unit-length, and capacitance per unit length. (See chapter 14 of the textbook by S. S. Haykin, *Active Network Theory,* Addison-Wesley Publishing Co. Inc., Reading Ma., (1970).) The comparison of the two gate lengths of TWFET case 3 and TWFET case 2 indicates that at sufficiently high frequencies the propagation constant is such that the distribution of the AC potential and current is located primarily at the end-portions of the cross-section-FET channel.

The Role of Conductivity of the Lateral Spacing Region

In addition to the choice of the neutral-region-length, the design of the lateral spacing region can also include the adjustment of the conductivity of the neutral region. The effect of the variation of this parameter can be seen in a comparison of TWFET cases 3, 4, and 5 for the TWFET examples of Tables I and II(a, b). As indicated by the cross-section-FET design values of these tables, this difference in conductivity is one key difference between these three cases. However, in addition, TWFET case 5 differs significantly from TWFET cases 3 and 4 in the values of the depletion depth parameters which are larger for TWFET case 5 than the other two cases. The following comparison of these three TWFET cases will show how the neutral-region-length and conductivity interact with the value of the depletion depth to affect the TWFET 2-port current-voltage characteristics.

The first calculation result to compare are the Y and K matrix element curves for these TWFETs. The calculated curves for Y and K for TWFET cases 4 and 5 are shown in FIGS. 25 through 32. The corresponding curves for TWFET case 3 are shown as compared to TWFET case 2 in FIGS. 17 through 24. In addition to these curves, the values for the Y and K matrix elements at 100 GHz are presented as magnitude and phase data in Table V(a, b). One trend that can be seen with these curves and the data of Table V(a, b), is that the reduction in conductivity for TWFET cases 4 and 5 relative to TWFET case 3 has the effect of generally reducing the magnitude of the Y and K matrix elements at high frequencies. However, the magnitude reduction is not uniform across all matrix elements of Y and K as it was for the comparison of TWFET case 2 vs. case 1, for which the difference in structures was neutral-region-length of the lateral spacing region. In the case of TWFET case 5 relative to TWFET case 3, the magnitudes of all Y is matrix elements in addition to $K_{gs}$, $K_{gd}$ are reduced by a factor of approximately 0.76. But the matrix elements $K_{ds}$, and $K_{dg}$ are almost unchanged between these two TWFET cases. Similarly, for the case of TWFET case 4 relative to TWFET case 3, the magnitudes of all Y matrix elements in addition to $K_{gs}$, and $K_{gd}$ are reduced by a factor of approximately 0.53, with the matrix elements $K_{ds}$, and $K_{dg}$ also almost unchanged between these two TWFET cases. Because the magnitude reduction for $K_{gd}$ differs from the magnitude reduction for $K_{dg}$ in the comparisons of TWFET cases 3 vs. case 5, and of TWFET cases 3 vs. case 4, the ratio of magnitudes of $K_{gd}$ to $K_{dg}$ is also changed in these comparisons. Specifically, TWFET case 3 has a value of approximately 5.58 for this ratio, while this ratio has a value of approximately 2.92 for TWFET case 4, and a value of approximately 4.24 for TWFET case 5.

These trends can be understood by an RC series circuit analysis of the lateral spacing region. The decrease in conductivity for the change of the TWFET design of case 3 to that of case 4 or case 5, has the result of an increase in the series resistance value of this circuit element. As in the case of the increased neutral-region-length of the lateral spacing region which was discussed previously, this increased series resistance has the effect of increasing the total impedance of the lateral spacing region which decreases the magnitudes of the admittance matrix elements. In addition, it also decreases the AC voltage across the depletion region, which also decreases $K_{gs}$ and $K_{gd}$. This decrease in AC voltage across the depletion region is accompanied by an increase in AC voltage across the neutral region, as explained in the previous RC series circuit analysis of the increase in neutral-region-length of the lateral spacing region. However, in the present case, the increased value of the resistor component of the RC series circuit model for the lateral spacing region is accomplished by a decrease in conductivity, rather than an increase in neutral region length. As a result, the increased potential drop across the neutral region is not accompanied by a decrease in the AC electric field. Consequently, there is no corresponding reduction-factor for the magnitudes of $K_{dg}$ and $K_{ds}$.

The difference in the ratio of magnitudes of $K_{gd}$ to $K_{dg}$ for TWFET case 4 as compared to TWFET case 5 can also be explained by the RC series circuit analysis. In this model for the lateral spacing region, the series resistance R is the ratio of neutral region length over the product of the conductivity times the effective area of the lateral spacing region. Similarly, the series capacitance C is the product of the effective area of the lateral spacing region times the ratio of the material dielectric constant over the lateral depletion depth. A simple analysis of the RC series circuit indicates that a decrease in capacitance increases the voltage drop across the depletion depth. The increased voltage drop tends to increase the charge on the gate electrode, but is counteracted to some degree by the fact that the increase in depletion depth would decrease this charge. These two opposing tendencies are accommodated so that the larger depletion depth values in combination with the higher conductivity values for TWFET case 5 as compared to case 4, provide the higher ratio for the ratio of magnitudes of $K_{gd}$ to $K_{dg}$ for TWFET case 5 as compared to TWFET case 4 which was noted above.

The preceding comparison of Y and K matrix element values for TWFET case 4 and TWFET case 5 as compared to TWFET case 3 values shows that TWFET case 4 has a smaller magnitude than TWFET case 5 for the Y, $K_{gs}$, and $K_{gd}$ matrix elements, and that TWFET case 5 has a larger value than TWFET case 4 for the ratio of $$\frac{|K_{gd}|}{|K_{dg}|}.$$

Figure 33:
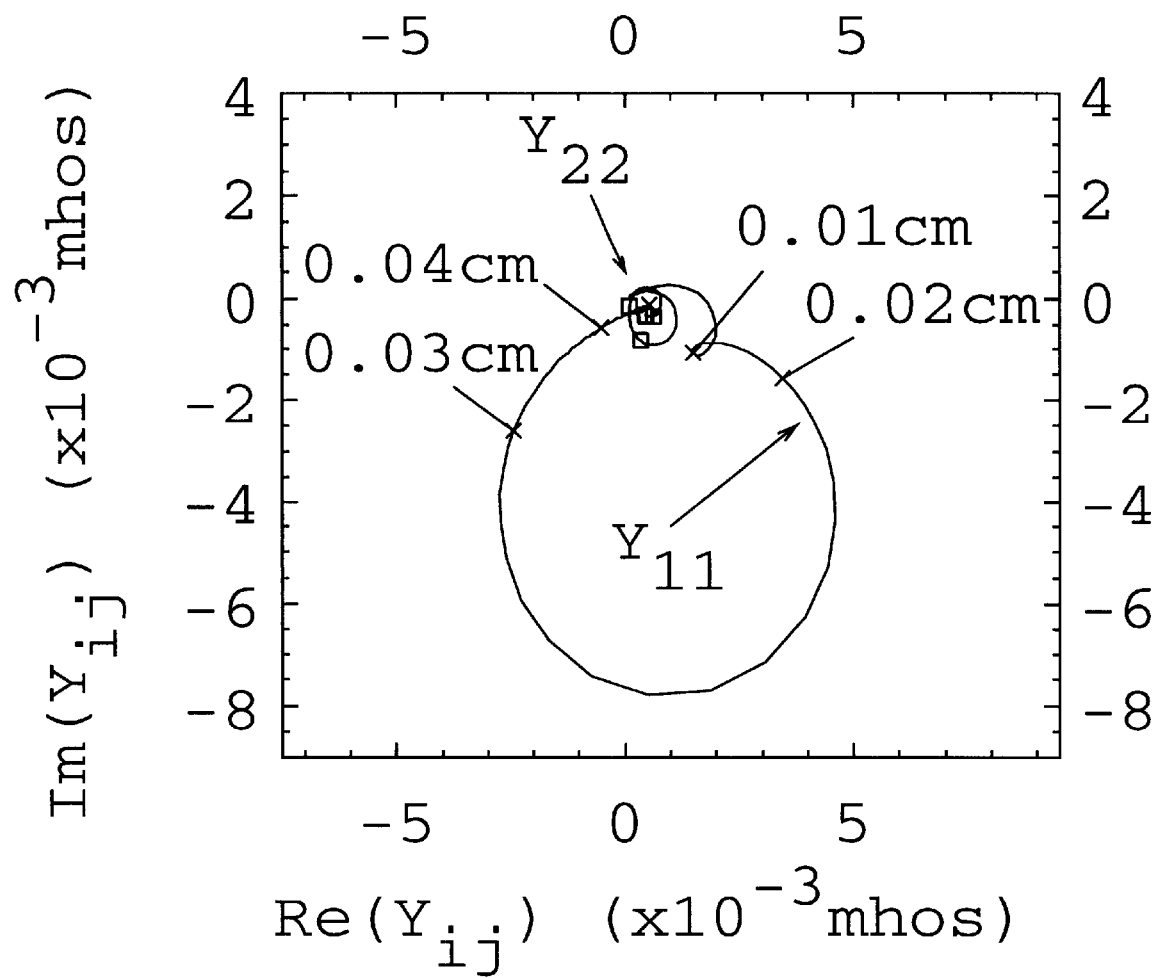
FIG. 33 is a graph that shows two complex admittance curves.
Figure 34:
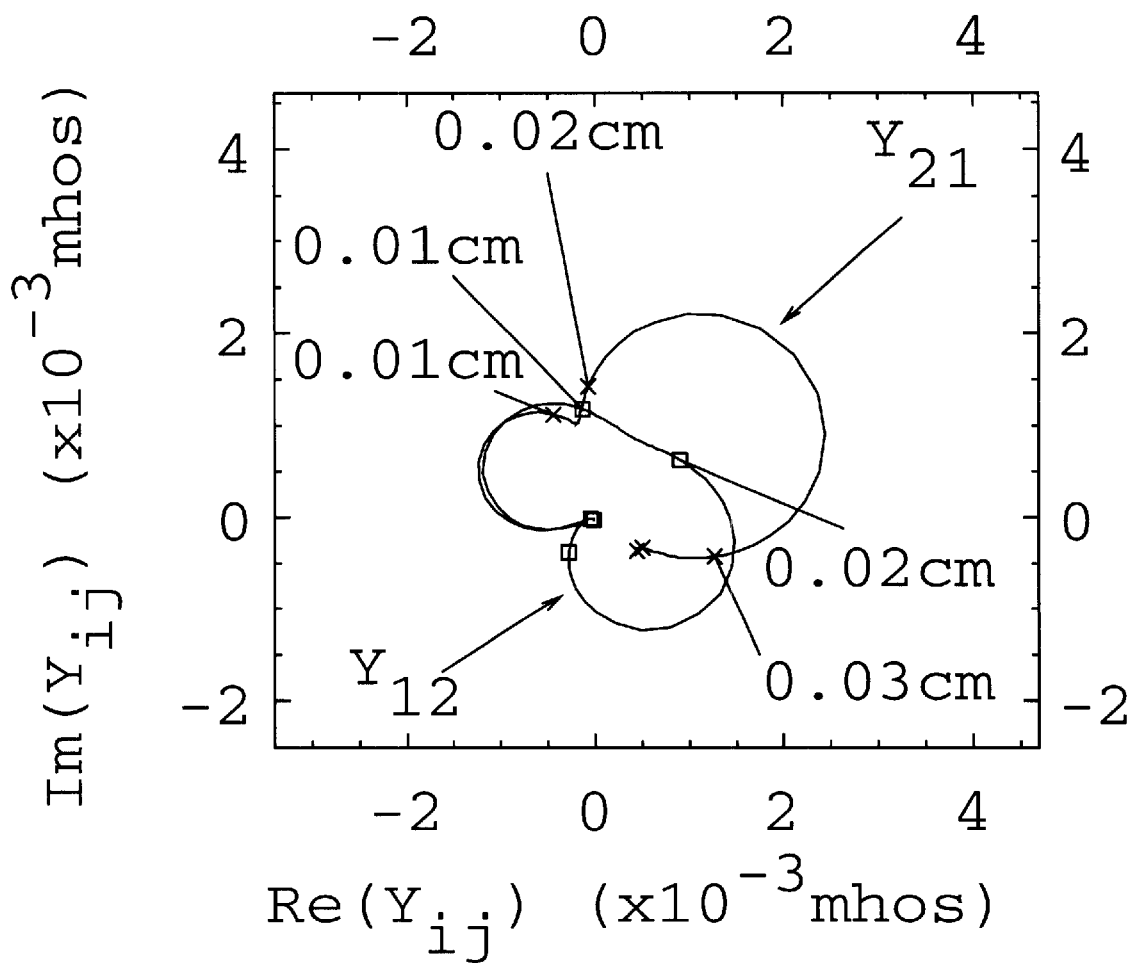
FIG. 34 is a graph that shows two complex admittance curves.
Figure 35:
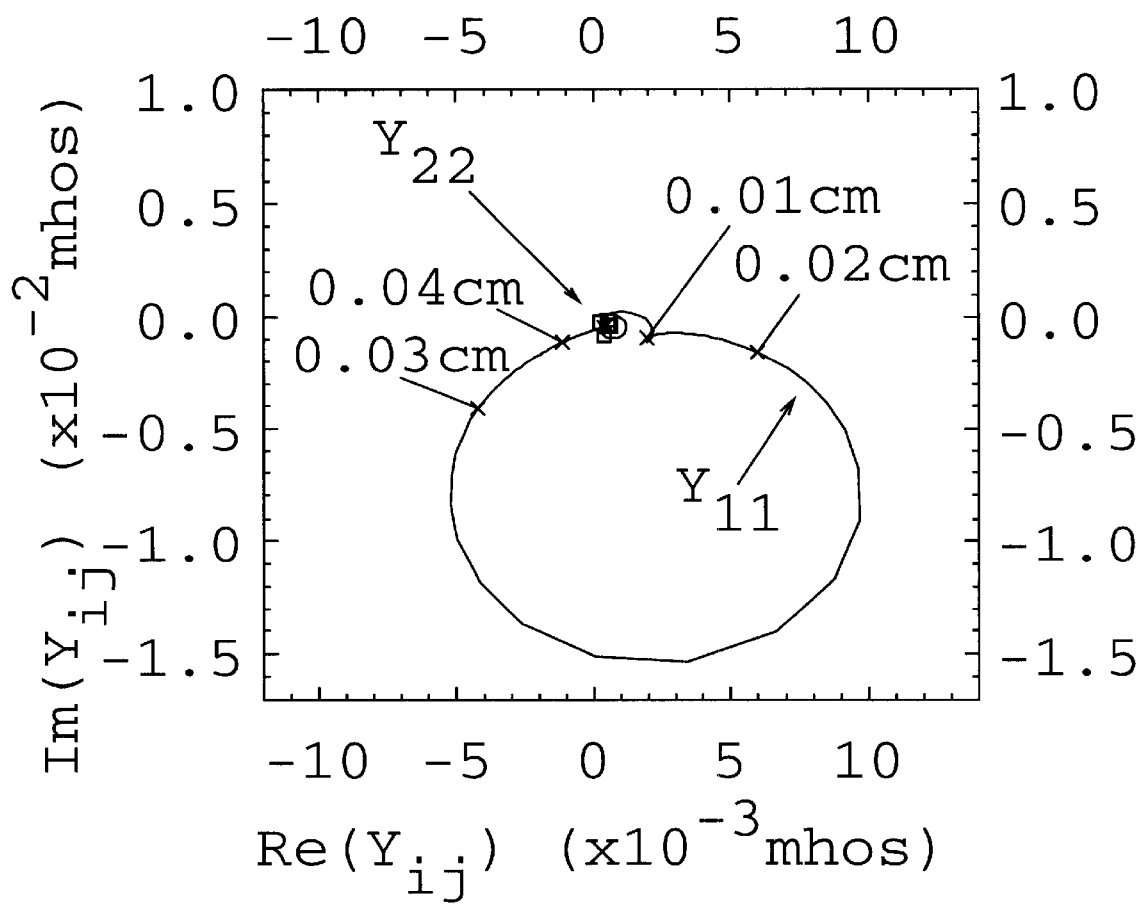
FIG. 35 is a graph that shows two complex admittance curves.
Figure 36:
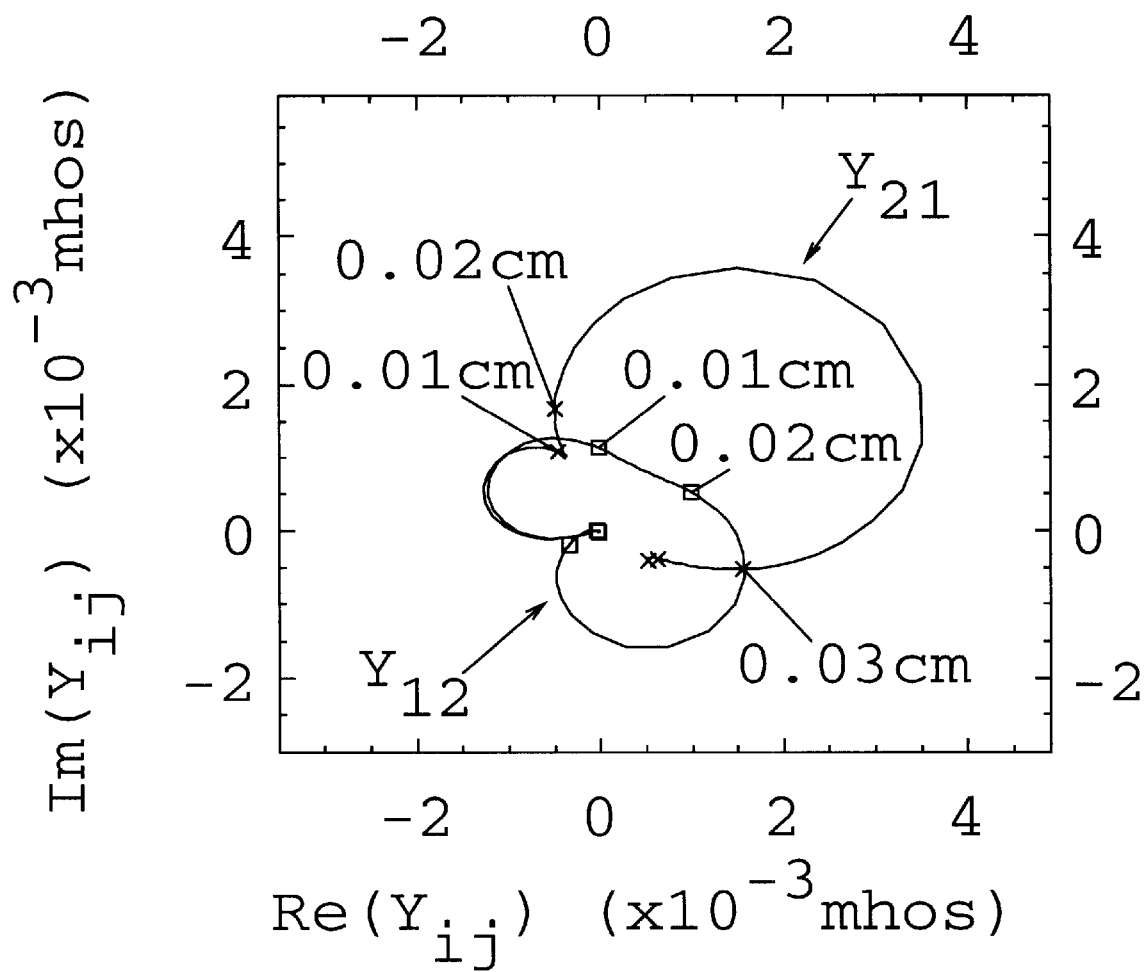
FIG. 36 is a graph that shows two complex admittance curves.

Previously, the comparison of the Y and K matrix element curves and the corresponding 2-port admittance matrix curves for TWFET cases 1 and 2 found that the reduction in magnitudes for the Y and K matrix element curves was accompanied by an increase in the size of the 2-port admittance matrix curves. Applying this trend to TWFET cases 4 and 5 would suggest that the corresponding 2-port admittance matrix curves would be larger for TWFET case 4 than for TWFET case 5. However, the comparison of the 2-port admittance matrices for the TWFETs of cases 4, and 5 will show that the ratio of magnitudes of $$\frac{|K_{gd}|}{|K_{dg}|}$$

can affect these curves, more than the reduction in magnitudes of the Y and K values. To see this point, compare FIGS. 33 and 34 which show the 2-port admittance matrix curves at 100 GHz for TWFET case 4 to FIGS. 35 and 36 which show the corresponding 2-port admittance matrix curves for TWFET case 5. TWFET case 4 has the smaller size of the $y_{11}$ and $Y_{21}$ curves. Thus, this comparison indicates that the effect of the increased ratio of $$\frac{|K_{gd}|}{|K_{dg}|},$$

for TWFET case 5 relative to TWFET case 4 dominates, and serves to increase the size of these 2-port admittance matrix curves.

The larger size of the 2-port admittance matrix curves for TWFET case 5 as compared to TWFET case 4 indicates that higher series resistance values can be used in TWFETs with cross-section FET designs with an increased ratio of $$\frac{|K_{gd}|}{|K_{dg}|}.$$

This can be seen by combining the trends of the larger size of the 2-port admittance matrix curves for TWFET case 5 as compared to TWFET case 4 with the effect of the increased series resistance on these 2-port admittance matrix curves as was noted for TWFET case 1 in FIGS. 11 through 14. When both of these trends are combined, it can be seen that the cross-section-FET design of TWFET case 5 which provide the increased ratio of $$\frac{|K_{gd}|}{|K_{dg}|}$$

allows higher series resistance values to be used for the design of TWFET amplifiers and oscillator circuit elements.

This higher ratio of $$\frac{|K_{gd}|}{|K_{dg}|},$$

for TWFET case 5 relative to TWFET case 4, is also accompanied by the result that the approximate maximum value of the 2-port MSG for the TWFET which was found in the range of coupling length values of $5 \times^{-4}$ cm to $5 \times 10^{-2}$ cm, was only 17.6 for TWFET case 4, while it was 32.3 for TWFET case 5. This is a rough indicator of the largest TWFET amplifier gain that could be obtained, and thus indicates that the higher ratio $$\frac{|K_{gd}|}{|K_{dg}|},$$

allows higher gain TWFET amplifiers to be designed.

Thus, the comparison of TWFET cases 3, 4, and 5 shows that TWFET 2-port admittance matrix curves can be improved to be used with higher TWFET electrode series resistance values and obtain relatively higher TWFET amplifier gain if the ratio of $$\frac{|K_{gd}|}{|K_{dg}|},$$

is maintained or increased. For the comparison of TWFET case 5 to TWFET case 4, this increased ratio of $$\frac{|K_{gd}|}{|K_{dg}|}$$

was achieved by the design of the lateral spacing region with an increased depletion depth in combination with the increased conductivity of the neutral region. This cross-section-FET design method could also be combined with some increase in the neutral region length to further increase the ratio of $$\frac{|K_{gd}|}{|K_{dg}|},$$

and combine its effects with the effects of the overall reduction in magnitudes of the Y and K matrix element values.

TWFET Design

The TWFET examples presented of the preceding sections of this technical disclosure have focussed on the design of the lateral spacing regions, and have demonstrated that this feature of the TWFET can significantly affect the TWFET 2-port characteristics. In addition, a comparison of two of these examples has shown that a wide variation in gate length had little effect on the values for TWFET high frequency coupling matrix elements. This result also underscores the importance of these lateral spacing regions on the TWFET current-voltage characteristics.

One implication of this significance of these lateral spacing regions in the TWFET design is that it suggests that the AC activity of the TWFET is located in the inter-electrode region that includes these lateral spacing regions. In particular, in a cross-section view of the TWFET, in plane transverse to the direction of signal propagation, the AC transmission line current is not distributed over the full gate electrode surface area, but is localized to the end portions of the gate contact which are nearest to the source or drain electrodes. This current localization has the result that the effective surface area which corresponds to the electrode series resistance is much smaller than the actual surface area of the electrode. The smaller surface area increases the value of this resistance. For example, consider a cross-section of a TWFET for which the current is confined to a region near the drain or source end of the gate of a quarter-micron, ($0.25 \times 10^{-4}$ cm) and has a skin depth of a tenth of a micron ($0.1 \times 10^{-4}$ cm), and an electrode with a metallic resistivity of $10^6$ ohm-cm. This electrode series resistance would be 4 k-ohm/cm. For a dual-gate structure, the surface-area of the current-distribution is doubled and so this value would reduce to 2 k-ohm/cm.

Figure 37:
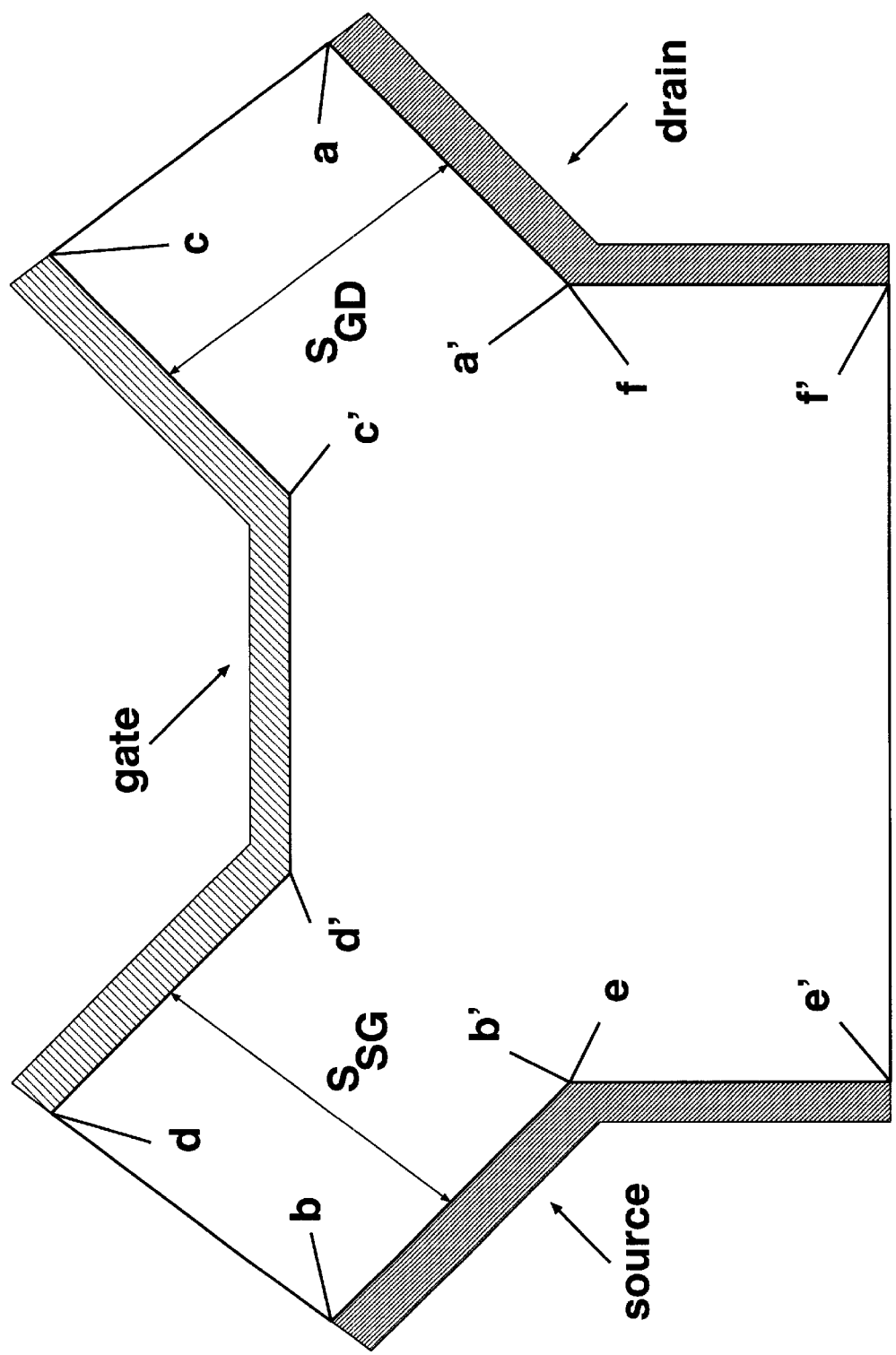
FIG. 37 is a cross-section of a TWFET.

As the preceding discussion of the TWFET cases have demonstrated, the design of the lateral spacing regions can allow higher series resistance values to be used in TWFETs. In addition, a new TWFET design presented in FIG. 37 incorporates these lateral spacing regions in a structure that also features increased inter-electrode surface areas. The TWFET structure of FIG. 37 shows a cross-section of a TWFET, in a plane transverse to the direction of TWFET signal propagation. This structure includes these increased inter-electrode surface areas as facets of opposite-pairs of electrodes which are designed to be facing the each other as much as possible. These facet pairs for the source-to-gate interelectrode surfaces are labeled b–b' on the source electrode and labeled d–d' on the gate electrode. Similarly, the facets for the drain-to-gate interelectrode surfaces are labeled a–a' on the drain electrode and labeled c–c' on the gate electrode. In addition the facets for the source-to-drain interelectrode surfaces are labeled e–e' on the source electrode and are labeled f–f' on the drain electrode. The correspondence of the gate-to-source interelectrode separation distance $S_{SG}$ and gate-to-drain interelectrode separation distance $S_{GD}$ to that of the planar TWFET of FIG. 1, is also indicated by these labels in FIG. 37.

The increased interelectrode surface areas of the TWFET design of FIG. 37 are designed so that the AC electrode transmission line current will be uniformly distributed across each of these electrode facets. As a result, these facet surfaces can decrease the electrode series resistance values in the TWFET. The TWFET structure of FIG. 37 can be fabricated with well known photolithography and other semiconductor device fabrication techniques. For example, a combination of etching techniques could be used to create a trench in a semiconductor substrate with sidewalls on which metallic layers are deposited and patterned to form the source and drain contacts. This would be followed by material deposition to create the cross-section FET channel structure shown. This layer could also be processed to provide the trench-structure to support the gate-metal with the faceted structure shown in FIG. 37. Alternatively, the structure of FIG. 37 may also fabricated in an inverted form. For this inverted structure, metal deposition may be used to create the gate electrode, followed by material deposition to form the cross-section FET channel, possibly followed by etching to create the trenches that define the interelectrode region between the gate, source, and drain electrodes. This would be followed deposition of source and drain electrodes on top of the channel material to create the structure of FIG. 37.

The increased surface area of the TWFET structure of FIG. 37 can be combined with the design of a lateral spacing region to adjust both the cross-section FET design and the effective value of the electrode series resistance. For example, if the TWFET structure of FIG. 37 is used to increase the surface area of the AC current distribution by a factor of w, this has the result that the effective electrode series resistance values are reduced by the factor w. In addition, the cross-section-FET AC matrix elements of Y and K would also be increased by w. The lateral spacing region design can be used, to decrease these matrix elements by a scaling factor (1/s) for example, by an increase in neutral region length. With both of these design-changes in effect, the resulting Y and K matrix elements would scale by a factor of (w/s). This factor could be adjusted so that the TWFET design could operate as desired with the series resistance values which have been scaled by the factor (1/w)

The TEM Mode Approximation

The design of lateral spacing regions has been discussed in terms of its effect on the values of the Y and K coupling matrix elements, and the 2-port admittance matrix elements of the TWFET. An important additional aspect of the design of these lateral spacing regions is their effect on the TEM mode approximation in the TWFET. This approximation is the basis for the use of the calculation methods for the TWFET designs presented in this technical disclosure and for those presented in U.S. Pat. No. 5,627,389 and the continuation-in-part U.S. Pat. No. 5,861,644. As explained in these earlier patents, this calculation method is based on the TEM analysis for the case of ideal coupled transmission lines, and was extended to the TWFET. The TWFET includes electrode pairs such as a Schottky contact transmission line structure which corresponds to the electrode pair of the gate electrode and the source electrode or to the electrode pair of the gate electrode and the drain electrode.

A TM analysis of Schottky contact transmission line structures has been presented elsewhere by Hasegawa and by Jager, among others. (See the paper by H. Hasegawa et. al., "Properties of Microstrip Line on Si—$SiO_2$ System," *IEEE Trans. Microwave Theory Tech.* Vol. MTT-19,(11), pp. 869–881 (November, 1971). Also, the paper by D. Jager, "Slow-Wave Propagation Along Variable Schottky-Contact Microstrip Line," *IEEE Trans. Microwave Theory Tech.* Vol. MTT-24,(9), pp. 566–573 (September, 1976).) This work has found that as the signal frequency increases above a critical frequency, called the "relaxation frequency of interfacial polarization", the propagating mode transitions into a TEM mode. This "relaxation frequency of interfacial polarization" is referred to as $f_s$ in Hasegawa's notation.

This critical frequency, $f_s$, can be related to the design of the lateral spacing region by the parameters of the neutral region length and the depletion region depth of the lateral spacing region. In Hasegawa's notation, the length of the neutral region is referred to as $b_2$, and the depletion region depth is referred to as $b_1$. These $b_1$ and $b_2$ values correspond to the lateral spacing region parameters in that the neutral region length $b_2$ is given by ($S_{SG}$-$X_{SG}$) or ($S_{GD}$-$X_{GD}$), and the depletion depth $b_1$ is given by $X_{SG}$ or $X_{GD}$. Hasegawa defines $f_s$ as:

$$f_s = \left(\frac{1}{2\pi}\right)\left(\frac{\sigma}{\varepsilon}\right)\left(\frac{b_1}{b_2}\right)$$

In this definition, δ represents the conductivity of the material in the neutral region, and ε represents the dielectric constant of the semiconductor. Thus, it is possible as use the lateral spacing region design values for the TWFETs of Tables I and II(a, b) to calculate the value of this critical frequency, $f_s$, which corresponds to a gate-drain lateral spacing region or a source-gate lateral spacing region.

These values for the critical frequency, $f_s$, have been calculated for the TWFETs of Tables I and II (a, b) and are included in Table VI, together with the ratio of a signal is frequency of 100 GHz to the value of $f_s$. From the values in this table, it can be seen that all of the TWFETs presented in this technical disclosure have been designed such that a signal frequency of 100 GHz exceeds $f_s$ for both the gate-drain lateral spacing region or the gate-source lateral spacing region. Thus, at this frequency, the TEM mode approximation should apply to the TWFET examples presented here.

In addition, if desired, higher AC signal-voltage values can be used with TWFETs presented here by adjustments that maintain the same value of the conductivity of the semiconductor material. For example, such an adjustment would increase the net-donor density while decreasing the electron mobility to maintain a constant conductivity. This adjustment could be made for all of the semiconductor material, or locally near a depletion region edge so that the increased doping density results in less movement of the depletion region edge with the higher value of AC-signal voltage. In addition, if needed, this method could be employed for a portion of the coupling length of the TWFET to accommodate a higher AC signal voltage that may be present for a section of the TWFET coupling length.

All the TWFET examples are shown operating at 100 GHz, which it should be noted, is above the fmax of the corresponding conventional cross section FET.

It should be noted that if it is necessary to adjust for the TEM approximation, or for variability in fabricating a TWFET design presented in this technical disclosure, the preceding methods of the design of the lateral spacing region or increased electrode surface areas may be employed as presented here for adjusting the K and Y matrix element values to obtain the TWFET design. In addition, the preceding descriptions of the effect of these cross-section-FET design changes on the Y and K matrix element values may be interpreted as they correspond to the TEM approximate analysis of the TWFET structure. For example, the TEM analysis relates the AC charge matrix, K, to the inductive coupling matrix, L. When using the correspondence of the TEM approximate analysis to the TWFET structure, the preceding discussions of design-change-prescriptions to obtain the desired adjustment in K AC charge matrix elements would be understood to apply to the corresponding L matrix elements. In view of this, the TEM relationships of the L matrix to the K matrix would be used determine the changes in the L matrix element values that would be obtained with a design-change-prescription for the K matrix values.

The adjustments which may be used for a TWFET design may include any or a combination of the methods of the TWFET design presented in this technical disclosure. These include the methods of adjustment of increasing the neutral region length of the lateral spacing region, the combination adjustment of increasing the depletion depth and conductivity of the neutral region of the lateral spacing region, or of increaing the effective surface area of the inter-electrode surfaces.

While this invention has been explained with reference to the structure disclosed herein, it is not confined to the details set forth and this application is intended to cover any modifications and changes as may come within the scope of the following claims:

What is claimed is:

1. A traveling wave field-effect transistor operated at frequencies in the microwave range or above the microwave range, and having traveling wave signals propagating in a direction therethrough generally from and to electrodes attached thereto, comprising:

a semiconductor structure defining a traveling wave signal propagation direction and a transverse direction configured at right angles to the traveling wave signal propagation direction, the structure in cross section taken in the transverse direction perpendicular to the traveling wave signal propagation direction, the cross section corresponding to a cross section field-effect transistor, a coupling length of the structure in the traveling wave signal propagation direction having electrodes configured for attaching transmission lines for an input signal and for an output signal, the input and output attachments at opposite ends of the coupling length, at least one gate electrode extending along the coupling length in the traveling wave signal propagation direction, at least one source electrode extending along the coupling length in the traveling wave signal propagation direction, at least one drain electrode extending along the coupling length in the traveling wave signal propagation direction, wherein a traveling wave field-effect transistor is formed, input transmission line attached to the electrodes at one end of the coupling length for an input signal, output transmission line attached to the electrodes at the opposite end of the coupling length for an output signal, a depletion region generally beneath at least one gate electrode, the depletion region, when viewed in a cross section of the semiconductor structure taken in said transverse direction, having an edge, means for positioning said edge between at least one gate electrode and at least one drain electrode region, means for separating the depletion region edge from the at least one drain electrode region, the gate source and drain source electrode pairs having an electrode series resistance, and, in a plane transverse to said direction of signal propagation, means for increasing the distance between at least one of the gate electrodes and at least one of the other electrodes selected from the group consisting of the source electrode, the drain electrode, and, both the source and drain electrodes, and, wherein said increased distance between electrodes of a gate-source electrode pair creates a gate-source lateral spacing region, and, wherein said increased distance between electrodes of a gate-drain electrode pair creates a gate-drain lateral spacing region, said lateral spacing region including a neutral region, wherein, at some frequency, at some coupling length of the traveling wave field-effect transistor, at some value of the electrode series resistance, the value of maximum stable gain is increased, by the increased distance.

2. The traveling wave field effect transistor of claim 1 further comprising means for forming a gate length of the cross-section field effect transistor that is significantly longer than 1 micron.

3. The traveling wave field effect transistor of claim 1 wherein a conductivity of the lateral spacing region is in the range of 2.0 to 4.0 Siemens/cm.

4. The traveling wave field effect transistor of claim 1 wherein a conductivity of the active fet channel region of the cross-section field effect transistor is in the range of 2.0 to 4.0 Siemens/cm.

5. The traveling wave field effect transistor of claim 1 wherein said gate-source lateral spacing region extending between the gate and source electrodes, further comprises:

an end portion of the depletion region edge which lies between the gate electrode and the source electrode and a neutral region which extends from this end portion of the depletion region edge to the source electrode;

wherein a length of said neutral region is defined as extending from the depletion region edge to the surface of the source electrode in the direction of the shortest distance between the gate electrode and the source electrode, and wherein said gate-drain lateral spacing region, extending between the gate and drain electrodes, includes an end portion of the depletion region edge which lies between the gate electrode and the drain electrode and a neutral region which extends from this end portion of the depletion region edge to the drain electrode;

wherein a length of said neutral region is defined as extending from the depletion region edge to the surface of the drain electrode in the direction of the shortest distance between the gate electrode and the drain electrode, and, further comprising means for adjusting the length of the neutral region of a lateral spacing region.

6. The traveling wave field effect transistor of claim 1 wherein, in a cross-section field effect transistor, end portions of at least one of the source electrodes and at least one other electrode selected from the group consisting of the gate, drain, and both the gate and drain electrodes, said end portions further comprising means for forming facets which are aligned with at least one facet of the opposite electrode to create at least one facet pair, said at least one facet pair selected from the pair groups consisting of the gate-source electrode pair, and the drain-source electrode pair, and both the gate-source and drain-source electrode pairs, wherein the effective series resistance of the electrodes of the TWFET is reduced.

7. A traveling wave field-effect transistor operated at frequencies in the microwave range or above the microwave range, and having traveling wave signals propagating in a direction therethrough generally from and to electrodes attached thereto, comprising:

a semiconductor structure defining a traveling wave signal propagation direction and a transverse direction configured at right angles to the traveling wave signal propagation direction, the structure in cross section taken in the transverse direction perpendicular to the traveling wave signal propagation direction, the cross section corresponding to a cross section field-effect transistor, a coupling length of the structure in the traveling wave signal propagation direction having electrodes configured for attaching transmission lines for an input signal and for an output signal, the input and output attachments at opposite ends of the coupling length, at least one gate electrode extending along the coupling length in the traveling wave signal propagation direction, at least one source electrode extending along the coupling length in the traveling wave signal propagation direction, at least one drain electrode extending along the coupling length in the traveling wave signal propagation direction, wherein a traveling wave field-effect transistor is formed, input transmission line attached to the electrodes at one end of the coupling length for an input signal, output transmission line attached to the electrodes at the opposite end of the coupling length for an output signal, a depletion region generally beneath at least one gate electrode, the depletion region, when viewed in a cross section of the semiconductor structure taken in said transverse direction, having an edge, means for positioning said edge between at least one gate electrode and at least one drain electrode region, means for separating the depletion region edge from the at least one drain electrode region, the gate source and drain source electrode pairs having an electrode series resistance, and in a plane transverse to said direction of signal propagation, there is an addition of cross section field effect transistor channel material, extending between, and increasing the distance between, at least one of the gate electrodes and at least one of the other electrodes selected from the group consisting of the source electrode, the drain electrode, and, both the source and drain electrodes, and, wherein said addition of the cross section field effect transistor channel material between electrodes of a gate-source electrode pair creates a gate-source lateral spacing region, and, wherein said addition of the cross section field effect transistor channel material between electrodes of a gate-drain electrode pair creates a gate-drain lateral spacing region, wherein, said gate-source lateral spacing region extends between the gate and source electrodes including an end portion of the depletion region edge which lies between the gate electrode and the source electrode and a neutral region which extends from this end portion of the depletion region edge to the source electrode;

wherein the length of said neutral region is defined as extending from the depletion region edge to the surface of the source electrode in the direction of the shortest distance between the gate electrode and the source electrode, and the lateral depletion region depth is defined as extending from the surface of the gate electrode to the depletion region edge in the direction of the shortest distance between the gate electrode and the source electrode, and, wherein said gate-drain lateral spacing region extends between the gate and drain electrodes including an end portion of the depletion region edge which lies between the gate electrode and the drain electrode and a neutral region which extends from this end portion of the depletion region edge to the drain electrode;

wherein the length of said neutral region is defined as extending from the depletion region edge to the surface of the drain electrode in the direction of the shortest distance between the gate electrode and the drain electrode, and the lateral depletion region depth is defined as extending from the surface of the gate electrode to the depletion region edge in the direction of the shortest distance between the gate electrode and the drain electrode, wherein, at some frequency, at some coupling length of the traveling wave field-effect transistor, there is an increase in the maximum value of the electrode series resistance wherein the traveling wave field-effect transistor, or augmented 2-port formed with the traveling wave field-effect transistor, can provide signal gain as determined by one of the values selected from the group consisting of Mason's U-function, maximum available gain, and maximum stable gain.

8. The traveling wave field effect transistor of claim 7, further comprising means for adjusting at least one of the lateral spacing region features of the conductivity of the neutral region, and the lateral depletion region depth.

9. A traveling wave field-effect transistor operated at frequencies in the microwave range or above the microwave range, and having traveling wave signals propagating in a direction therethrough generally from and to electrodes attached thereto, comprising:

a semiconductor structure defining a traveling wave signal propagation direction and a transverse direction configured at right angles to the traveling wave signal propagation direction, the structure in cross section taken in the transverse direction perpendicular to the traveling wave signal propagation direction, the cross section corresponding to a cross section field-effect transistor, a coupling length of the structure in the traveling wave signal propagation direction having electrodes configured for attaching transmission lines for an input signal and for an output signal, the input and output attachments at opposite ends of the coupling length, at least one gate electrode extending along the coupling length in the traveling wave signal propagation direction, at least one source electrode extending along the coupling length in the traveling wave signal propagation direction, at least one drain electrode extending along the coupling length in the traveling wave signal propagation direction, wherein a traveling wave field-effect transistor is formed, input transmission line attached to the electrodes at one end of the coupling length for an input signal, output transmission line attached to the electrodes at the opposite end of the coupling length for an output signal, a depletion region generally beneath at least one gate electrode, the depletion region, when viewed in a cross section of the semiconductor structure taken in said transverse direction, having an edge, means for positioning said edge between at least one gate electrode and at least one drain electrode region, means for separating the depletion region edge from the at least one drain electrode region, the gate source and drain source electrode pairs having an electrode series resistance, and in a plane transverse to said direction of signal propagation, there is an addition of cross section field effect transistor channel material, extending between, and increasing the distance between, at least one of the gate electrodes and at least one of the other electrodes selected from the group consisting of the source electrode, the drain electrode, and, both the source and drain electrodes, and, wherein said addition of the cross section field effect transistor channel material between electrodes of a gate-source electrode pair creates a gate-source lateral spacing region, and, wherein said addition of the cross section field effect transistor channel material between electrodes of a gate-drain electrode pair creates a gate-drain lateral spacing region, wherein, said gate-source lateral spacing region extends between the gate and source electrodes including an end portion of the depletion region edge which lies between the gate electrode and the source electrode and a neutral region which extends from this end portion of the depletion region edge to the source electrode;

wherein the length of said neutral region is defined as extending from the depletion region edge to the surface of the source electrode in the direction of the shortest distance between the gate electrode and the source electrode, and the lateral depletion region depth is defined as extending from the surface of the gate electrode to the depletion region edge in the direction of the shortest distance between the gate electrode and the source electrode, and, wherein said gate-drain lateral spacing region extends between the gate and drain electrodes including an end portion of the depletion region edge which lies between the gate electrode and the drain electrode and a neutral region which extends from this end portion of the depletion region edge to the drain electrode;

wherein the length of said neutral region is defined as extending from the depletion region edge to the surface of the drain electrode in the direction of the shortest distance between the gate electrode and the drain electrode, and the lateral depletion region depth is defined as extending from the surface of the gate electrode to the depletion region edge in the direction of the shortest distance between the gate electrode and the drain electrode, wherein, at some frequency, at some coupling length of the traveling wave field-effect transistor, there is an increase in the maximum value of the electrode series resistance wherein an oscillating circuit element can be obtained with an open circuit termination on the output port of the traveling wave field-effect transistor.

10. A traveling wave field-effect transistor operated at frequencies in the microwave range or above the microwave range, and having traveling wave signals propagating in a direction therethrough generally from and to electrodes attached thereto, comprising:

a semiconductor structure defining a traveling wave signal propagation direction and a transverse direction configured at right angles to the traveling wave signal propagation direction, the structure in cross section taken in the transverse direction perpendicular to the traveling wave signal propagation direction, the cross section corresponding to a cross section field-effect transistor, a coupling length of the structure in the traveling wave signal propagation direction having electrodes configured for attaching transmission lines for an input signal and for an output signal, the input and output attachments at opposite ends of the coupling length, at least one gate electrode extending along the coupling length in the traveling wave signal propagation direction, at least one source electrode extending along the coupling length in the traveling wave signal propagation direction, at least one drain electrode extending along the coupling length in the traveling wave signal propagation direction, wherein a traveling wave field-effect transistor is formed, input transmission line attached to the electrodes at one end of the coupling length for an input signal, output transmission line attached to the electrodes at the opposite end of the coupling length for an output signal, a depletion region generally beneath at least one gate electrode, the depletion region, when viewed in a cross section of the semiconductor structure taken in said transverse direction, having an edge, means for positioning said edge between at least one gate electrode and at least one drain electrode region, means for separating the depletion region edge from the at least one drain electrode region, the gate source and drain source electrode pairs having an electrode series resistance, and in a plane transverse to said direction of signal propagation, there is an addition of cross section field effect transistor channel material, extending between, and increasing the distance between, at least one of the gate electrodes and at least one of the other electrodes selected from the group consisting of the source electrode, the drain electrode, and, both the source and drain electrodes, and, wherein said addition of the cross section field effect transistor channel material between electrodes of a gate-source electrode pair creates a gate-source lateral spacing region, and, wherein said addition of the cross section field effect transistor channel material between electrodes of a gate-drain electrode pair creates a gate-drain lateral spacing region, wherein, said gate-source lateral spacing region extends between the gate and source electrodes including an end portion of the depletion region edge which lies between the gate electrode and the source electrode and a neutral region which extends from this end portion of the depletion region edge to the source electrode;

wherein the length of said neutral region is defined as extending from the depletion region edge to the surface of the source electrode in the direction of the shortest distance between the gate electrode and the source electrode, and the lateral depletion region depth is defined as extending from the surface of the gate electrode to the depletion region edge in the direction of the shortest distance between the gate electrode and the source electrode, and, wherein said gate-drain lateral spacing region extends between the gate and drain electrodes including an end portion of the depletion region edge which lies between the gate electrode and the drain electrode and a neutral region which extends from this end portion of the depletion region edge to the drain electrode;

wherein the length of said neutral region is defined as extending from the depletion region edge to the surface of the drain electrode in the direction of the shortest distance between the gate electrode and the drain electrode, and the lateral depletion region depth is defined as extending from the surface of the gate electrode to the depletion region edge in the direction of the shortest distance between the gate electrode and the drain electrode, wherein, at some frequency, at some value of the electrode series resistance, for a range of coupling length values, the maximum value of maximum stable gain is increased, by the adjustment of at least one of the lateral spacing region features of the neutral region conductivity, and the lateral depletion region depth.

11. A traveling wave field-effect transistor operated at frequencies in the microwave range or above the microwave range, and having traveling wave signals propagating in a direction therethrough generally from and to electrodes attached thereto, comprising:

a semiconductor structure defining a traveling wave signal propagation direction and a transverse direction configured at right angles to the traveling wave signal propagation direction, the structure in cross section taken in the transverse direction perpendicular to the traveling wave signal propagation direction, the cross section corresponding to a cross section field-effect transistor, a coupling length of the structure in the traveling wave signal propagation direction having electrodes configured for attaching transmission lines for an input signal and for an output signal, the input and output attachments at opposite ends of the coupling length, at least one gate electrode extending along the coupling length in the traveling is wave signal propagation direction, at least one source electrode extending along the coupling length in the traveling wave signal propagation direction, at least one drain electrode extending along the coupling length in the traveling wave signal propagation direction, wherein a traveling wave field-effect transistor is formed, input transmission line attached to the electrodes at one end of the coupling length for an input signal, output transmission line attached to the electrodes at the opposite end of the coupling length for an output signal, a depletion region generally beneath at least one gate electrode, the depletion region, when viewed in a cross section of the semiconductor structure taken in said transverse direction, having an edge, means for positioning said edge between at least one gate electrode and at least one drain electrode region, means for separating the depletion region edge from the at least one drain electrode region, the gate source and drain source electrode pairs having an electrode series resistance, and in a plane transverse to said direction of signal propagation, there is an addition of cross section field effect transistor channel material, extending between, and increasing the distance between, at least one of the gate electrodes and at least one of the other electrodes selected from the group consisting of the source electrode, the drain electrode, and, both the source and drain electrodes, and, wherein said addition of the cross section field effect transistor channel material between electrodes of a gate-source electrode pair creates a gate-source lateral spacing region, and, wherein said addition of the cross section field effect transistor channel material between electrodes of a gate-drain electrode pair creates a gate-drain lateral spacing region, wherein, said gate-source lateral spacing region extends between the gate and source electrodes including an end portion of the depletion region edge which lies between the gate electrode and the source electrode and a neutral region which extends from this end portion of the depletion region edge to the source electrode;

wherein the length of said neutral region is defined as extending from the depletion region edge to the surface of the source electrode in the direction of the shortest distance between the gate electrode and the source electrode, and the lateral depletion region depth is defined as extending from the surface of the gate electrode to the depletion region edge in the direction of the shortest distance between the gate electrode and the source electrode, and, wherein said gate-drain lateral spacing region extends between the gate and drain electrodes including an end portion of the depletion region edge which lies between the gate electrode and the drain electrode and a neutral region which extends from this end portion of the depletion region edge to the drain electrode;

wherein the length of said neutral region is defined as extending from the depletion region edge to the surface of the drain electrode in the direction of the shortest distance between the gate electrode and the drain electrode, and the lateral depletion region depth is defined as extending from the surface of the gate electrode to the depletion region edge in the direction of the shortest distance between the gate electrode and the drain electrode, wherein, at some frequency, for a range of coupling lengths of the traveling wave field-effect transistor, at some value of the electrode series resistance, the maximum value of maximum stable gain is increased, by the addition of said cross section field effect transistor channel material.

* * * * *